United States Patent
Koska et al.

(10) Patent No.: US 9,762,659 B2
(45) Date of Patent: Sep. 12, 2017

(54) REUSABLE GRAPHICAL ELEMENTS WITH QUICKLY EDITABLE FEATURES FOR USE IN USER DISPLAYS OF PLANT MONITORING SYSTEMS

(71) Applicant: FISHER-ROSEMOUNT SYSTEMS, INC., Round Rock, TX (US)

(72) Inventors: Herschel O. Koska, San Marcos, TX (US); Larry O. Jundt, Round Rock, TX (US); Stephen C. Gilbert, Austin, TX (US); Robert B. Havekost, Austin, TX (US); Paul K. Daly, Cedar Park, TX (US)

(73) Assignee: FISHER-ROSEMOUNT SYSTEMS, INC., Round Rock, TX (US)

( * ) Notice: Subject to any disclaimer, the term of this patent is extended or adjusted under 35 U.S.C. 154(b) by 447 days.

(21) Appl. No.: 14/581,601

(22) Filed: Dec. 23, 2014

(65) Prior Publication Data
US 2015/0193418 A1 Jul. 9, 2015

Related U.S. Application Data

(60) Provisional application No. 61/923,483, filed on Jan. 3, 2014.

(51) Int. Cl.
*G06F 17/30* (2006.01)
*H04L 29/08* (2006.01)
(Continued)

(52) U.S. Cl.
CPC .......... *H04L 67/10* (2013.01); *G05B 19/0423* (2013.01); *G05B 19/0426* (2013.01); *G05B 2219/32128* (2013.01); *G06F 17/50* (2013.01)

(58) Field of Classification Search
CPC ........ G06F 12/14; G06F 17/30; G06F 17/243; G06F 3/0484; H04L 67/10; G05B 11/01; G05B 15/02; G05B 19/4188
See application file for complete search history.

(56) References Cited

U.S. PATENT DOCUMENTS 5,371,847 A 12/1994 Hargrove
5,611,059 A 3/1997 Benton et al.
(Continued)

FOREIGN PATENT DOCUMENTS

CN 1981301 A 6/2007
EP 0 876 647 A1 11/1998
(Continued)

OTHER PUBLICATIONS

"Extended European Search Report," European Patent Office issued in connection with 09155953.4-2206, on Jan. 4, 2010, 7 pages.
(Continued)

*Primary Examiner* — Rashawn Tillery
(74) *Attorney, Agent, or Firm* — Marshall, Gerstein & Borun LLP

(57) ABSTRACT

A display configuration system enables a graphical designer to create reusable template graphical display elements that can be easily modified by, for example, other graphical designers with less experience in graphical design programming, such that the modified graphical display elements can reflect one of various different possible functionalities of plant equipment or plant usages to which the modified graphical display element is to be tied during operation. The display configuration system includes a graphical design application that enables the creation of generic or library graphical elements that include basic graphical functionality associated with particular types of plant equipment or associated with particular types of graphic display functionality and includes a configuration form editor that enables a user (Continued)

to create quick configuration forms that define predetermined potential modifications to be made to the template graphical element when creating a usage from the template graphical element.

56 Claims, 32 Drawing Sheets

(51) Int. Cl.
*G05B 19/042* (2006.01)
*G06F 17/50* (2006.01)

(56) References Cited

U.S. PATENT DOCUMENTS

| | | | |
|---|---|---|---|
| 5,675,756 | A | 10/1997 | Benton et al. |
| 5,706,455 | A | 1/1998 | Benton et al. |
| 5,838,563 | A | 11/1998 | Dove et al. |
| 5,929,855 | A | 7/1999 | Benton et al. |
| 6,535,883 | B1 | 3/2003 | Lee et al. |
| 6,690,981 | B1 | 2/2004 | Kawachi et al. |
| 6,854,111 | B1 | 2/2005 | Havner et al. |
| 6,971,065 | B2 | 11/2005 | Austin |
| 6,980,869 | B1 | 12/2005 | Chandhoke |
| 7,086,009 | B2 | 8/2006 | Resnick et al. |
| 7,110,835 | B2 | 9/2006 | Blevins et al. |
| 7,134,085 | B2 | 11/2006 | Austin |
| 7,134,090 | B2 | 11/2006 | Kodosky et al. |
| 7,146,231 | B2 | 12/2006 | Schleiss et al. |
| 7,152,116 | B1 | 12/2006 | Austin et al. |
| 7,287,230 | B2 | 10/2007 | Austin et al. |
| 7,478,337 | B2 | 1/2009 | Kodosky et al. |
| 7,515,977 | B2 | 4/2009 | Eryurek et al. |
| 7,533,347 | B2 | 5/2009 | Santori et al. |
| 7,624,375 | B2 | 11/2009 | Santori et al. |
| 7,680,546 | B2 | 3/2010 | Gilbert et al. |
| 7,703,032 | B2 | 4/2010 | Wells |
| 7,783,370 | B2 | 8/2010 | Nixon et al. |
| 7,971,151 | B2 | 6/2011 | Nixon et al. |
| 8,060,834 | B2 | 11/2011 | Lucas et al. |
| 8,086,955 | B2 | 12/2011 | Zhou et al. |
| 8,316,313 | B2 | 11/2012 | Campney et al. |
| 8,407,580 | B2 | 3/2013 | Gray et al. |
| 8,683,317 | B2 | 3/2014 | Caldwell et al. |
| 8,775,967 | B2 | 7/2014 | Nixon et al. |
| 9,043,716 | B2 | 5/2015 | Jundt et al. |
| 2003/0009250 | A1* | 1/2003 | Resnick ............ G06F 8/24 700/94 |
| 2003/0028269 | A1* | 2/2003 | Spriggs ............ G05B 15/02 700/83 |
| 2003/0101022 | A1 | 5/2003 | Shah et al. |
| 2003/0236576 | A1* | 12/2003 | Resnick ............ G05B 15/02 700/9 |
| 2005/0222698 | A1* | 10/2005 | Eryurek ............ G06F 9/4443 700/90 |
| 2005/0257204 | A1 | 11/2005 | Bryant et al. |
| 2007/0006149 | A1* | 1/2007 | Resnick ............ G06F 8/24 717/116 |
| 2007/0100872 | A1 | 5/2007 | Bodin et al. |
| 2007/0132779 | A1 | 6/2007 | Gilbert et al. |
| 2007/0139441 | A1* | 6/2007 | Lucas ............ G05B 19/0426 345/619 |
| 2008/0263467 | A1* | 10/2008 | Wilkins ............ G06F 9/4443 715/765 |
| 2009/0287321 | A1* | 11/2009 | Lucas ............ G05B 19/0426 700/79 |
| 2010/0211928 | A1* | 8/2010 | Resnick ............ G05B 15/02 717/108 |
| 2010/0275139 | A1* | 10/2010 | Hammack ............ G05B 19/0426 715/763 |
| 2013/0131844 | A1 | 5/2013 | Campney et al. |
| 2014/0100669 | A1* | 4/2014 | Hammack ............ G06F 3/0484 700/17 |
| 2014/0100676 | A1* | 4/2014 | Scott ............ G06F 3/0484 700/83 |
| 2014/0108985 | A1* | 4/2014 | Scott ............ G06F 3/0484 715/771 |

FOREIGN PATENT DOCUMENTS

| | | |
|---|---|---|
| JP | 08-234951 | 9/1996 |
| JP | 2007-536631 A | 12/2007 |
| JP | 2007-536648 A | 12/2007 |
| JP | 2008-503797 A | 2/2008 |
| WO | WO-97/27540 A1 | 7/1997 |
| WO | WO-2005/109128 A1 | 11/2005 |

OTHER PUBLICATIONS

"Search Report," issued by the United Kingdom Intellectual Property Office on Jun. 17, 2009, in connection with corresponding application No. GB0904425.6,3 pages.
Chinese Patent Office, "Office Action" and partial translation, issued in connection with CN patent application 200910129112.6, mailed Feb. 20, 2013 (6 pages).
European Office Action, issued by the European Patent Office in connection with European Application No. 09155953.4-2206, on Aug. 9, 2010, 4 pages.
European Office Action, issued by the European Patent Office in connection with European Application No. 09155953.4-2206, on Mar. 11, 2011, 4 pages.
European Patent Office, "Communication pursuant to Article 94(3) EPC", issued in connection with European patent application No. 09155953.4, issued on Nov. 5, 2014, 5 pages.
Examination Report for Application No. GB1017192.4, dated May 28, 2014.
Examination Report for Application No. GB1017192.4, dated Sep. 5, 2013.
First Office Action for Chinese Application No. 201010589029.X, dated Dec. 10, 2013.
Intellectual Property Office, "Examination Report", issued in connection with Application No. GB0904425.6, Jan. 23, 2012, (3 pages).
Japanese Intellectual Property Office, "Office Action", issued in connection with corresponding Japanese Patent Application No. 2009-057556 on Dec. 10, 2013 (2 pages).
Notice of Reasons for Rejection for Japanese Application No. 2010-229513, dated Jul. 29, 2014.
Search Report for Application No. GB1017192.4, dated Feb. 15, 2011.
State Intellectual Property Office of P.R. China, "The Notification of the First Office Action", issued in connection with Chinese patent application No. 200910129112.6, May 29, 2012, (10 pages).
Translation of: "Notice of Reasons for Rejection" issued by the Japanese Patent Office in connection with JP patent application No. 2009-057556, mailing date Mar. 5, 2013, (3 pages).

* cited by examiner

REUSABLE GRAPHICAL ELEMENTS WITH QUICKLY EDITABLE FEATURES FOR USE IN USER DISPLAYS OF PLANT MONITORING SYSTEMS

RELATED APPLICATIONS

This is a regular filed application that claims priority to and the benefit of the filing date of U.S. Provisional Patent Application Ser. No. 61/923,483, entitled "Reusable Graphical Elements with Quickly Editable Features for Use in User Displays of Plant Monitoring Systems" which was filed on Jan. 3, 2014, the entire disclosure of which is here by expressly incorporated by reference herein.

FIELD OF THE INVENTION

This patent relates generally to plant monitoring systems and, more particularly, to a graphical configuration system that enables the quick editing of reusable graphical elements when creating display graphics for use in user displays of plant monitoring systems.

BACKGROUND

Distributed process control systems, like those used in chemical, petroleum or other processes, typically include one or more process controllers communicatively coupled to one or more field devices via analog, digital or combined analog and digital buses. The field devices, which may be, for example, valves, valve positioners, switches and transmitters (e.g., temperature, pressure, level and flow rate sensors), are located within the process environment and perform process functions such as opening or closing valves, measuring process parameters, etc. Intelligent (or "smart") field devices, such as the field devices conforming to the well-known Fieldbus protocols, like the FOUNDATION® Fieldbus protocol, or the HART® or WirelessHART® protocols, may also perform control calculations, alarming functions, and other control functions commonly implemented within the controller. The process controllers, which are also typically located within the plant environment, receive signals indicative of process measurements made by the field devices and/or other information pertaining to the field devices and execute a controller application that runs, for example, different control modules that make process control decisions, generate control signals based on the received information and coordinate with the control modules or blocks being executed in the field devices, such as HART® and Fieldbus field devices. The control modules in the controller send the control signals over the communication lines to the field devices to thereby control the operation of the process.

Information from the field devices and the controller is usually made available over a data highway to one or more other hardware devices, such as operator workstations, personal computers, data historians, report generators, centralized databases, etc., typically placed in control rooms or other locations away from the harsher plant environment. These hardware devices execute plant monitoring applications that may, for example, enable an operator to perform functions with respect to the process, such as changing settings of the process control routine, modifying the operation of the control modules within the controller or the field devices, viewing the current state of the process, viewing alarms generated by field devices and controllers, simulating the operation of the process for the purpose of training personnel or testing the process control software, keeping and updating a configuration database, performing maintenance actions on the plant equipment, etc.

As an example, the DeltaV™ control system, sold by Emerson Process Management includes multiple applications stored within and executed by different devices located at diverse places within a process network that may be located at a single facility or networked across several facilities or process control plants. A configuration application, which resides in one or more operator workstations, enables users to create or change process control modules and download these process control modules via a data highway to dedicated distributed controllers. Typically, these control modules are made up of communicatively interconnected function blocks that are objects in an object oriented programming protocol and perform functions within the control scheme based on inputs thereto and provide outputs to other function blocks within the control scheme. The configuration application may also allow a user interface designer to create or change operator interfaces or human-machine interfaces (HMIs) which are used by any of a number of monitoring or viewing applications to display data to an operator, a maintenance person, or other user to enable, for example, an operator to change settings, such as set points, within the process control routine, a maintenance person to see alarms or maintenance data for the plant, etc. Each dedicated controller and, in some cases, one or more field devices, store and execute a controller application that runs the control modules assigned and downloaded thereto to implement actual process control functionality and/or that collects, generates and provides other information to a user. The monitoring applications, which may be executed on one or more operator workstations, receive data from the controller applications via the data highway and display this data to process control system designers, operators, or users using the user interface displays, and may provide any of a number of different views, such as an operator view, an engineering view, a technician view, a maintenance view, etc.

As the number and type of control and support applications used in a process control environment have increased, different graphical display applications have been provided to enable users to effectively configure and use these control and support applications. For example, graphical display applications have been used to enable a configuration engineer to create user interfaces for control programs to be downloaded to the control devices within a process plant. Additionally, graphical display applications have been used to build user interfaces that enable control operators to view the current process conditions of the process plant (or areas of the process plant), to supervise and manipulate process control functions, to monitor process-level alarms, etc. Moreover, graphical display applications have been used to create user interfaces or user displays that enable maintenance personnel to view the functioning state of hardware devices and various areas within the process plant, and user interfaces or user displays that permit engineers to simulate the operation of the process plant.

To create the various user interfaces or user displays used by these monitoring applications, a display configuration engineer typically first uses a graphical configuration application to create display objects that are used as elements of or building blocks for more complicated user interface displays, using the display application programming functionality. These building blocks or graphical elements are then used to create user displays that may be implemented on a system-wide basis in one or more of the workstations to thereby provide preconfigured displays to the operator and maintenance personnel regarding the operating state of the control system or the devices within the plant. In larger process plants, displays may be specific to a certain portion of the plant or a certain functional area. In general, the displays take the form of alarming displays that receive and display alarms generated by controllers or devices within the process plant, control displays indicating the operating state of the controllers and other devices within the process plant, maintenance displays indicating the functioning state of the devices within the process plant, etc. Further, these displays are typically preconfigured to display information or data received from the process control modules or the devices within the process plant. For example, a graphic on the display screen may change in real-time to illustrate that a tank is half full or that the position of a valve has changed, or a numerical indictor included in the graphic display may be updated according to the flow measured by a flow sensor or the temperature of a reactor.

Configuration engineers typically dedicate a significant amount of time and effort to developing the display screens or user displays specific to process areas and operational tasks associated with these areas, and budget considerations often do not permit re-development (or even modification) of displays to accommodate new or different sources of information. Moreover, configuration engineers often develop user displays separately from control strategies. As such, when the display or user interface configuration engineer is developing a user display for a particular control strategy, the interface configuration engineer may not yet know which devices the control strategy will use, or all of the operational details of these devices.

During configuration of a user interface or a user display, a graphics configuration engineer may use a graphical display application, that has library or generic graphical display items, such as tanks, valves, sensors, operator control buttons like slide bars, on/off switches, etc., and may place these library or generic graphical elements on a screen in any desired configuration to create an operator display, a maintenance display and the like. When placed onto the screen, individual graphic items may be interconnected on the screen in a manner that provides some information or that displays of the inner-workings of the process plant to different users. To animate the graphic display elements, the display creator manually ties each of the graphical items to data generated within the process plant, such as data measured by sensors or indicative of valve positions, etc. by specifying a communication link between the graphic item and the relevant data source within the process plant. However, the viewing properties or operational functionality of the individual library items used as part of the display may need to be altered to reflect differences in the actual plant equipment being illustrated in the display, different data sources, etc. To change these graphical features, the graphical designer must typically understand and be able to use the graphical configuration program, which typically requires a great deal of experience and skill.

Moreover, the process of creating user displays from template display items and altering each template display item within different user interfaces is manually is tedious, time consuming and may be fraught with error. Additionally, this process requires significant programming knowledge and knowledge of the plant configuration as well as of the graphical configuration program being used to alter the library display items.

Moreover, because graphics used in a user interface are typically defined separately from the control strategies, one graphics display may often be used with multiple different pieces of process equipment or types of process equipment. Because a wide variety of variations of graphics are expected in graphical displays, it is typically necessary to specify which variations are to be allowed or enabled in each of the graphics displays. These variations include, for example, specifying changes such as allowing the user to define the rotation for part of the item, select what strings and variables must be shown in the display and which ones are optional, etc. Without this up front design, the graphic displays cannot even have small changes made thereto without significant programming effort. Unfortunately, a configuration system that attempts to design or pre-specify the allowable changes in all graphics displays quickly becomes unusable, as variations on graphics items in a display is very common. As a result, maintaining graphics cost effectively is an ongoing problem within control systems, and is only exacerbated when the step of maintaining graphics must be coordinated with the changes being made to control elements used in the control configuration system.

Thus, as noted above, process graphics require lengthy and costly engineering time to configure. The displays are often designed based on the piping and instrument diagrams, ensuring that all of the measurements and controls are represented for the operator. While some displays may be programmed for known tasks such as plant startups and shutdowns, it is impractical to create one-off displays that serve all of the potential specific purposes expected to be performed by a particular user or to customize a display for particular task performed by a single user. Moreover, the creation of task specific displays requires collaboration between the engineers and operations personnel, which may not be practical during the configuration effort, which is when the displays are being defined.

As one example, a plant utilizing automated process control will typically have several if not many interactive graphical displays, that provide a mechanism for operators to control the processes that produce the plant products. Graphical displays typically contain several graphical sub-components, known as graphical element modules (GEMs), that allow monitoring of and control of the physical equipment. For example, a valve used to control the flow of material through a pipe, can have a GEM counterpart the provides useful information to a user via a user display. Typically, there is a large number of similar types of equipment, such as valves, used in a plant, so a display can contain many instances of the same GEM representing the different instances of that equipment. Typically, it is the job of a lead graphics designer to create a library of reusable graphical objects, such as GEMs, (e.g. valve GEMs) using a graphical design software application. To do so, the lead graphics designer must be very familiar with the use and operation of the graphic design software, which can be complex in nature. In any event, the created library objects can be copied or linked to many corresponding instances, called GEM usages, within any number of displays. Importantly, each GEM will operate with the same graphical functionality.

A GEM can be complicated on the inside, containing numerous other graphical objects, which makes the GEM versatile and allows it to be built up from smaller elements. For example, there are a number of things a family of control valves have in common (e.g. inlet, outlet, adjustable orifice), but there can be slight differences between the valves, like the components they use to respond to failure conditions. For example, one type of valve opens the valve orifice completely in the fail mode while another type of valve closes the orifice completely in the fail mode. Many similar types of equipment will have various options or differences that will change the manner in which this equipment operates, and thus that may need to be programmed into a valve GEM, based on the particular equipment that the valve GEM is representing. To reduce the number of valve GEMs needed to cover the various types of different functionality associated with a family of equipment, the lead graphics designer typically produces one valve GEM that can be configured to support such equipment, (e.g., valves that operate in either fail mode), instead of creating a separate valve GEM for each combination of equipment features. In particular, making a single valve GEM that represents a family of physical equipment is more efficient than producing a separate valve GEM for each of the possible combinations of features needed to cover the slight variations within the equipment family.

Another way that the lead graphics designer can leverage a GEM's reuse potential, is to use the GEM as an internal component within another related GEM. For example, a lead graphics designer may create a watervalve GEM by combining the functionality of the valve GEM with more specific functionality associated with a physical water valve, thereby reusing the functionality of the valve GEM inside of watervalve GEM, which is more efficient than building a watervalve GEM from scratch.

However, in all cases, the lead graphics designer would like to make it easy to apply and configure instances of a more generic GEM as stored within the GEM library in an effective manner. In fact, the bulk of the user graphical displays for a process plant are generally created by other graphic designers that have less expertise in building GEMs. Therefore, making it easier for other graphical designers to add and configure instances of a GEM to be used within a display translates into greater productivity. As there are typically a large number of graphics designers with a lesser level of experience employed to construct displays for a project, making these other designers more productive translates into a significant reduction in the cost of the project.

Unfortunately, currently, graphical designers with lesser experience still need to understand the specifics of the graphical configuration program in order to be able to change the GEM as stored in the graphical element library to make a GEM usage or instance that operates to reflect the actual combination of different possible features or design options of a plant object, like a valve. Thus, currently, the graphical designers with less experience still need to understand the sometimes complex programming nature of the general graphical design program to make changes to a more generic GEM to create a specific instance thereof that matches the actual plant equipment to which the GEM usage is to be attached. Currently, the lead graphics designer has no way of enabling graphic designers with less experience to easily change the GEMS stored in the library to create a usage the reflects actual plant operation.

SUMMARY

A display configuration system enables a graphical designer to create reusable template graphical display elements that can be easily modified by, for example, other graphical designers with less experience in graphical design programming, such that the modified graphical display elements can reflect one of various different possible functionalities of plant equipment or plant usages to which the modified graphical display element is to be tied during operation. In particular, the display configuration system includes a graphical design application that enables the creation of generic or library graphical elements, such as graphical element modules (GEMs) or graphical display elements called gadgets, that each include basic graphical functionality associated with particular types of plant equipment or associated with particular types of graphic display functionality. The display configuration system also includes a configuration form editor that enables a user to create quick configure forms that define predetermined potential modifications to be made to the template graphical element (e.g., a template GEM or a template gadget) when creating a GEM or gadget usage from the template GEM or gadget, for use in an actual user display. The quick configure form, which is stored as part of or as associated with the template graphical element, can be used or manipulated by a further user, such as a less experienced graphics designer, via a configuration application to make changes to a GEM or a gadget usage derived from the generic or template GEM or gadget without the user having to understand the graphical programming language or graphical programming environment that actually operates to make the changes.

More particularly, the creation and use of a quick configure form for template graphical elements makes graphics design engineers that possess a reduced level of skill and/or experience in the graphic design programming environment more productive by making the configuration of a graphical element usage (such as a GEM usage or a gadget usage), significantly easier and less error-prone. The quick configure form provides the further designer or user with an alternative editing experience when configuring a graphical element usage, which editing environment is easier to navigate and complete than making changes directly in the base graphics programming environment or application.

As an example, a lead graphics designer can create a generic or template graphical element (e.g., a GEM) and, using a form editor, can additionally create a quick configure form for use in creating instances usages from the template graphical element. With the form editor, the graphics designer only surfaces the fields of the graphical element that other less experience designers need to use to efficiently configure the graphical element usage. Moreover, instead of showing standard field names (as used or defined in the graphical programming environment or application), the quick configure form may include a custom label or description for each of a set of actionable items associated with the quick configure form, which label is meaningful to further designer, for example, in the process control environment, as opposed to being meaningful in the graphics programming environment. The quick configure form can also include an alternative mechanism for interacting with one or more fields of the form by constraining each field interaction to one of a set of valid choices, which valid choices may be established by the template graphical element creator. For example, the template graphical element creator can provide a list of choices for one or more fields in the quick configure form, instead of having a blank that is to be filled in for each such field. The quick configure form is saved by the form editor and is later used to create a graphical element usage by enabling a secondary or further graphics designer to interface with the graphical programming software via the quick configure form, instead of via standard tools (such as drop down menus, commands, etc.) provided within the graphical programming software.

Accordingly, the display and configuration system described herein allows graphic elements and/or displays to be more easily generated and to provide more customized and detailed information. Moreover, as will be understood, the graphical configuration system described herein retains the benefits of class-based or standardized template behavior with respect to creating elements of a user interface that communicates with and controls a process within a process plant, while, at the same time, this system provides a mechanism that enables graphical designers to change or reconfigure the presentation of information associated with a library or generic graphical element to reflect the actual operation of plant equipment without the designer needing to understand the complex graphical design program to make such changes. Instead, the graphics designer can make changes to a graphic element module using a form that is provided to the designer that includes the various options from which the designer can modify a graphical element, such as a GEM or a gadget.

In one embodiment, a user display configuration system includes a graphical element configuration application, stored on a tangible computer readable medium, that executes using one or more computer processors to enable a user to create one or more template graphical elements. Each template graphical element includes displayable indicia and configurable links to process control system data to be displayed on a display device using the displayable indicia. Moreover, the user display configuration system includes a configuration form editor, stored on a tangible computer-readable medium that executes using one or more computer processors to enable a user to create a configuration form associated with one of the template graphical elements, the configuration form being used to configure the operation of one or more graphical element usages from the one of the template graphical elements. The configuration form editor may present a user display interface to enable a user to specify one or more actionable items for the configuration form, wherein the one or more actionable items are each adapted to be used to configure the one or more graphical element usages created from the one of the template graphical elements. Each actionable item may include an indication of a graphical element parameter of the template graphical element, a property of the graphical element parameter of the template graphical element to be configured, and one or more editable configuration cells for specifying configuration information for the property of the graphical element parameter. Still further, a configuration form application, stored on a tangible computer-readable medium that executes using one or more computer processors uses the configuration form for the one of the template graphical elements to present visual information to a second user via a user display device. The configuration form application operates to enable the second user to specify the configuration information for one of the one or more editable configuration cells of the one or more actionable items and uses the specified configuration information to create a graphical element usage from the one of the template graphical elements for execution as part of a user display.

In some cases, the configuration form editor enables the user to create an actionable item including an indication of a data entry type to be used for collecting configuration information for the actionable item, and/or enables the user to specify one or more rules to be associated with the actionable item. Here, the one or more rules associated with the actionable item may be configured to be implemented by a processor upon use of the configuration form by the configuration form application in creating a graphical element usage, or may be implemented by a processor upon execution of the graphical element usage created by the configuration form application. Still further, the configuration form editor may enable the user to specify one or more rules to be associated with the actionable item by changing rule information associated with a template rule set and, if desired, the configuration form editor may store a different template rule set for each of a plurality of different data entry types.

Still further, the configuration form editor may operate to enable the user to specify, in one of the one or more configuration fields of an actionable item, an indication of a label to be provided to the second user when the second user is providing the configuration information via the actionable item, may enable a user to specify, in one of the one or more configuration fields of an actionable item, an indication of a message to be provided to the second user when the second user is providing configuration information via the actionable item and/or may enable the user to create an actionable item including a default value for the property of the graphic element parameter to used by the second user when the second user is providing the configuration information for the actionable item.

Still further, the configuration form editor may enable the user to create an actionable item related to buttons to be displayed to a user when the graphical element usage created from the template graphical element is used in a user display. In this case, the configuration form editor may enable the user to create an actionable item including rules to be implemented in response to a button of the graphical element usage being manipulated in a user display.

To enable the user to create an actionable item for the configuration form, the configuration form editor may present, on a user interface device, a first field including an indication of graphical element parameters for which an actionable item can be created, a second field including an indication of one or more properties of a selected graphical element parameter in the first field for which an actionable item can be created, and a third field including an indication of actionable items within the configuration form. The configuration form editor may then execute to enable a user to select a graphical element parameter indicated in the first field and to select a property of the selected graphical element parameter indicated in the second field to produce an actionable item associated with the selected property of the selected graphical element parameter and may display the actionable item including configurable cells thereof in the third field.

If desired, the indication of the graphical element parameter for one of the actionable items may relate to a graphical depiction to be presented on a user display screen and the property of the graphical element parameter may relate to the visual property of the graphical depiction. In another case, the graphical element parameter for the one of the actionable items may be an alias for a graphical element as defined in the namespace used by the graphical element configuration application. In still a further case, the indication of the graphical element parameter for one of the actionable items may relate to a graphical container (e.g., a table or chart or other data container) to be presented on a user display screen and the property of the graphical element parameter may relates to a data path for data to displayed using the graphical container. Likewise, the one of the one or more editable configuration cells for specifying configuration information for the property of the graphical element parameter may be adapted to store a reference to a configuration cell in an actionable item of a second configuration form to enable a configuration form of one graphical element to refer to data within or provided via a configuration form of a different graphical element.

In as further embodiment, a display element configuration system includes a graphical element configuration application, stored on a tangible computer readable medium, that executes using one or more computer processors to create one or more template graphical elements, each template graphical element including displayable indicia and one or more configurable links to process control system data to be displayed on a display device using the displayable indicia. The display element configuration system may also include a configuration form editor, stored on a tangible computer-readable medium that executes using one or more computer processors, to enable a user to create a configuration form associated with one of the template graphical elements, the configuration form adapted to be used to configure the operation of one or more graphical element usages from the one of the template graphical elements. The configuration form editor may present a user display interface to enable a user to specify one or more actionable items for the configuration form, each actionable item including an indication of a graphical element parameter of the template graphical element, a property of the graphical element parameter of the template graphical element to be configured, and one or more editable configuration cells for specifying configuration information for the property of the graphical element parameter. The display element configuration system may also include a configuration form storage routine, stored on a tangible computer-readable medium that executes using one or more computer processors, to store the configuration form in a computer memory as being associated with a particular template graphical element for later use in configuring a graphical element usage from the particular template graphical element.

In a still further embodiment, a user display configuration system includes a template graphical element library embodied in a tangible computer readable medium that stores one or more template graphical elements for use in creating graphical element usages for execution as part of a user display and a graphical element configuration form library embodied in a tangible computer readable medium that stores one or more configuration forms for at least one of the one or more template graphical elements stored in the template graphical element library. Here, each template graphical element includes displayable indicia and specifications of process control system data to be displayed on a display device using the displayable indicia, and each configuration form includes one or more actionable items. Each of the one or more actionable items is adapted to be used to configure a graphical element usage created from the one of the one or more template graphical elements and includes an indication of a graphical element parameter and a property of the graphical element parameter of the template graphical element to be configured. Each actionable item also includes one or more configuration cells that store information related to specifying configuration information for the property of the graphical element parameter to be used to configure the graphical element usage. The user display configuration system also includes a configuration form application, stored on a tangible computer-readable medium that executes using one or more computer processors, to use the configuration form for the one of the one or more template graphical elements to present visual information to a user via a user display device, wherein the configuration form application operates to enable the user to specify the configuration information using the one or more configuration cells of the one or more actionable items of the configuration form and uses the specified configuration information to create a graphical element usage from the template graphical element for execution as part of a user display.

According to another embodiment, a method of configuring a user display element for use in presenting information to a user via a user interface includes enabling a user, via a computer processor, to create one or more template graphical elements, each template graphical element including displayable indicia and configurable links to process control system data to be displayed on a display device using the displayable indicia and enabling a user, via a computer processor, to create a configuration form associated with one of the template graphical elements. Enabling the user to create a configuration form may include presenting on a user display device, a user display interface that enables a user to specify one or more actionable items for the configuration form, wherein the one or more actionable items are adapted to be used to configure the one or more graphical element usages created from the one of the template graphical elements, and further including, for each actionable item, enabling the user to provide an indication of a graphical element parameter and a property of the graphical element parameter of the template graphical element to be configured using the configuration form, and enabling the user to use one or more editable configuration cells to specify configuration information for the property of the graphical element parameter to be specified using the configuration form. Still further, the method includes enabling the user, via a computer processor, to store the configuration form as associated with the one of the graphical template elements and enabling a user, via a computer processor device, to create one or more graphical element usages from the template graphical element using the stored configuration form for the one of the template graphical elements to thereby create a user display element.

DETAILED DESCRIPTION

Figure 1:
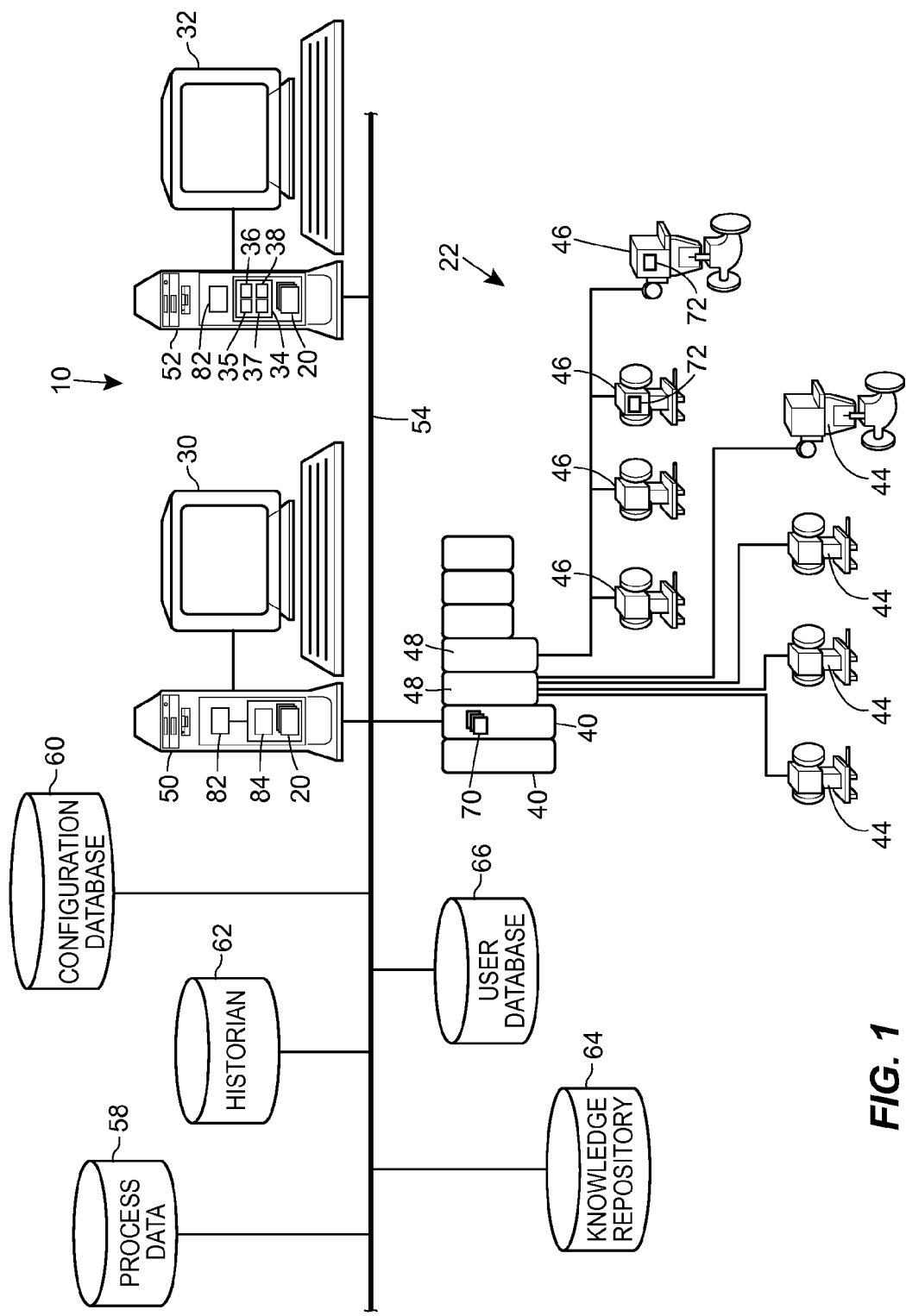
FIG. 1 is a schematic representation of process plant that includes a distributed process control network and several operator workstations that implement a graphical configuration system having configurable user displays with graphical elements that use a quick edit feature.

FIG. 1 illustrates an example process plant network 10 in which a graphical configuration application can be used to create graphical elements for user displays that can be used in one or more viewing or monitoring applications 20 to supervise or control the operation of the process plant 10 and, in this particular case, a distributed control system 22 implemented within the process plant 10. The viewing or monitoring applications 20 generally include a user interface application that uses various different displays to graphically depict process graphics to each of the operator and the maintenance technician and/or other users at workstations, such as workstations 30 and 32. However, in this case, the display applications 20 provide graphical depictions to the user using display objects or graphical display elements so that, for example, each of the operator and the maintenance technician have a display made from similar graphical display elements and can view certain process information that is more relevant to their job or process information needed for the tasks that they are currently performing. For example, the display generated for the operator may include information related to one or several process control functions, such as the operation of control loops within the process control system 22, whereas a display generated for the maintenance technician may include information related to one or several devices operating in the process plant 10, such as device trend data, current operational status data, etc. The displays generated for the operator and the maintenance technician are typically easily adjustable or configurable by the operator or the maintenance technician during operation of the plant 10 to provide these users with the information they need. An example of such a system is described in detail in U.S. patent application Ser. No. 14/048,844, entitled "Configurable User Displays in a Process Control System," filed Oct. 8, 2013, the disclosure of which is hereby expressly incorporated by reference herein.

The graphical configuration environment of FIG. 1 also includes a graphical configuration system 34 having a graphics configuration application or graphics engine 35 that can be used to create template or generic graphical elements, referred to herein by example only as graphical element modules (GEMs) and gadgets, that are stored in a library, and that can be subsequently used create graphical element instances or usages that are actually executed in user displays presented to, for example, the operator and maintenance person, during operation of the plant 10. The graphical configuration system 34 also includes a configuration form editor 36 that creates configuration forms, referred to herein quick configure forms or quick configuration forms, that may be associated with the template graphical elements and that may used by a configuration form application 37 to enable configuration engineers or other design personnel to quickly edit or modify the template graphical elements as stored in the library to create graphical element usages or instances thereof that are customized for use in actual user displays. The graphical configuration system 34 may also include a storage routine 38 that stores the template graphical elements and the associated quick configuration forms in the library as being associated with one another. Of course, each of the graphics configuration application 35, the configuration form editor 36, the configuration form application 37 and the storage routine 38 may be stored in a tangible computer readable memory or medium and execute on one or more processors to perform the functions described herein.

As is typical, the distributed process control system 22 illustrated in FIG. 1 has one or more controllers 40, each of which is connected to one or more field devices 44 and 46 (which may be smart devices) via input/output (I/O) devices or cards 48 which may be, for example, Fieldbus interfaces, Profibus interfaces, HART interfaces, standard 4-20 ma interfaces, etc. The controllers 40 are also coupled to one or more host or operator workstations 50-52 via a data highway 54 which may be, for example, an Ethernet link. A process data database 58 may be connected to the data highway 54 and operates to collect and store process variable, process parameter, status and other data associated with the controllers, field devices and any other devices within the plant 10. During operation of the process plant 10, the process data database 58 may receive process data from the controllers 40 and, indirectly, the field devices 44-46 via the data highway 54.

A configuration database 60 stores the current configuration of the process control system 22 within the plant 10 as downloaded to and stored within the controllers 40 and field devices 44 and 46. The configuration database 60 stores process control functions defining the one or several control strategies of the process control system 22, configuration parameters of the devices 44 and 46, the assignment of the devices 44 and 46 to the process control functions, and other configuration data related to the process plant 10. The configuration database 60 may additionally store graphical objects or user displays as well as configuration data associated with these objects or displays as described in more detail herein to provide various graphical representations of elements within the process plant 10. Some of the stored graphical objects may correspond to process control functions (e.g., a process graphic developed for a certain PID loop), and other graphical objects may be device-specific (e.g., a graphic corresponding to a pressure sensor).

Another data historian 62 stores events, alarms, comments and courses of action taken by operators. The events, alarms, and comments may pertain to individual devices (e.g., valves, transmitters), communication links (e.g., wired Fieldbus segments, WirelessHART communication links), or process control functions (e.g., a PI control loop for maintaining a desired temperature set point). Further, a knowledge repository 64 stores references, operator logbook entries, help topics, or links to these and other documentation that operators and maintenance technicians may find useful when supervising the process plant 10. Still further, a user database 66 stores information about users such as the operator and the maintenance technician. For each user, the user database 66 may store, for example, his or her organizational role, an area within the process plant 10 with which the user is associated, work team association, security information, system privileges, etc.

Each of the databases 58-66 may be any desired type of data storage or collection unit having any desired type of memory and any desired or known software, hardware or firmware for storing data. Of course, the databases 58-66 need not reside in separate physical devices. Thus, in some embodiments, some of the databases 58-66 may be implemented on a shared data processor and memory. In general, it is also possible to utilize more or fewer databases to store the data collectively stored and managed by the databases 58-66 in the example system of FIG. 1.

While the controllers 40, I/O cards 48 and field devices 44 and 46 are typically located down within and distributed throughout the sometimes harsh plant environment, the operator workstations 50 and 52 and the databases 58-64 are usually located in control rooms or other less harsh environments easily assessable by controller, maintenance, and various other plant personnel. However, in some cases, handheld devices may be used to implement these functions and these handheld devices are typically carried to various places in the plant. Such handheld devices, and in some cases, operator workstations and other display devices may be connected to the plant network 22 via wireless communication connections.

As is known, each of the controllers 40, which may be, by way of example, the DeltaV™ controller sold by Emerson Process Management, stores and executes a controller application that implements a control strategy using any number of different, independently executed, control modules or blocks 70. Each of the control modules 70 can be made up of what are commonly referred to as function blocks wherein each function block is a part or a subroutine of an overall control routine and operates in conjunction with other function blocks (via communications called links) to implement process control loops within the process plant 10. As is well known, function blocks, which may be objects in an object oriented programming protocol, typically perform one of an input function, such as that associated with a transmitter, a sensor or other process parameter measurement device, a control function, such as that associated with a control routine that performs PID, fuzzy logic, etc., control, or an output function that controls the operation of some device, such as a valve, to perform some physical function within the process plant 10. Of course hybrid and other types of complex function blocks exist, such as model predictive controllers (MPCs), optimizers, etc. While the Fieldbus protocol and the DeltaV system protocol use control modules and function blocks designed and implemented in an object oriented programming protocol, the control modules could be designed using any desired control programming scheme including, for example, sequential function block, ladder logic, etc., and are not limited to being designed and implemented using the function block or any other particular programming technique. Each of the controllers 40 may also support the AMS® suite of applications sold by Emerson Process Management and may use predictive intelligence to improve availability and performance of production assets including mechanical equipment, electrical systems, process equipment, instruments, non-smart and smart field devices 44, 46, etc.

In the plant network 10 illustrated in FIG. 1, the field devices 44 and 46 connected to the controllers 40 may be standard 4-20 ma devices, may be smart field devices, such as HART®, Profibus, or FOUNDATION® Fieldbus field devices, which include a processor and a memory, or may be any other desired type of devices. Some of these devices, such as Fieldbus field devices (labeled with reference number 46 in FIG. 1), may store and execute modules, or sub-modules, such as function blocks, associated with the control strategy implemented in the controllers 40 or which perform other actions within the process plant, such as data collection, trending, alarming, calibration, etc. Function blocks 72, which are illustrated in FIG. 1 as being disposed in two different ones of the Fieldbus field devices 46, may be executed in conjunction with the execution of the control modules 70 within the controllers 40 to implement process control, as is well known. Of course, the field devices 44 and 46 may be any types of devices, such as sensors, valves, transmitters, positioners, etc., and the I/O devices 48 may be any types of I/O devices conforming to any desired communication or controller protocol such as HART, Fieldbus, Profibus, etc.

With continued reference to FIG. 1, the workstations 50 and 52 may include various applications that are used for various different functions performed by the personnel within the plant 10. Each of the workstations 50 and 52 includes a memory 80 that stores various applications, programs, data structures, etc., and a processor 82 which may be used to execute any of the applications stored in the memory 80. In the example illustrated in FIG. 1, the workstation 50 also includes, in addition to the display and viewing application 20, one or more process controller configuration applications 84 which may include, for example, control module creation applications, operator interface applications and other data structures which can be accessed by any authorized configuration engineer to create and download control routines or modules, such as the control modules 70 and 72, to the various controllers 40 and devices 46 of the plant 10. The configuration applications also include the display or graphical configuration system 34 having the graphics configuration application or engine 35, the configuration form editor 36, the configuration form application 37 and the storage application 38, which may be used to create various user displays and display elements (such as template GEMs and gadgets) and configuration forms therefor, as described in more detail herein.

Once created, the display and viewing application 20 provides operators, maintenance technicians, and other users with access to various types of information needed by these users to perform their various jobs or tasks during run-time of the process control network 22. Such information may include typical plant process and instrumentation displays which may illustrate various sections of the plant and the equipment and instrumentation within the plant to provide the user with a view as to the current state or status of various equipment and process variables within the plant 10. Still further, the display and viewing applications 20 may provide control routine information, such as control loop diagrams, setpoint settings, etc., maintenance information, such as information about the health or current operational status of various equipment in the plant, operational information such as throughput and output information, etc.

More particularly, the display and viewing applications 20 provide various displays during operation of the process plant 10 to enable an operator to view and control various operations within the process plant 10 or, as is common in larger plants, within a section of the process plant 10 to which the operator is assigned. The display and viewing application 20 may include, or cooperate with, support applications such as control diagnostic applications, tuning applications, report generation applications or any other control support applications that may be used to assist the operator in performing control functions. Such support applications may be executed within the same or different computers as the display and viewing application 20. Further, the viewing applications 20 may permit a maintenance technician to supervise the maintenance needs of the plant 10, e.g., to view the operating or working conditions of various devices 40, 44, 46 and 48. The display and viewing applications 20 may also be connected to support applications such as maintenance diagnostic applications, calibration applications, vibration analysis applications, report generation applications or any other maintenance support applications that may be used to assist the maintenance technician 14 in performing maintenance functions within the plant 10.

Of course, one of the workstations 50 and 52 could be a simulation workstation that includes a number of simulation applications that may be used to simulate operation of the plant 10 or various sections of the plant 10 for any number of purposes, including for training purposes, for plant modeling purposes to assist in plant maintenance and control, etc. In this case, one or more of the display and viewing applications 20 may be used to provide a simulation operator with an interface into the simulated plant.

As noted above, display and viewing applications are typically implemented on a system wide basis in one or more of the workstations and provide preconfigured displays to the operator or maintenance persons regarding the operating state of the control system or the devices within a plant. These displays are generally preconfigured to display, in known manners, information or data received from the process control modules or the devices within the process plant. In some known systems, displays are created through the use of objects that have a graphic associated with a physical or logical element and that is communicatively tied to the physical or logical element to receive data about the physical or logical element. The object may change the graphic on the display screen based on the received data to illustrate, for example, that a tank is half full, to illustrate the flow measured by a flow sensor, etc. Due to the typical size and nature of plants, numerous interconnected displays are typically created for use by the various operators and maintenance technicians to view the operation of the plant.

The operator or other user displays are typically defined in a programming environment, and once complete, are deployed for use by operators and other users. However, there is a significant amount of programming activity that must go into creating the display graphics used in the operator, maintenance and other displays. To streamline these efforts, a lead graphical designer typically uses a standard graphics configuration programming application 35, such as the WebStudio application provided as part of the DeltaV software system, to design and create various template graphical elements for use in creating user displays. The lead graphical designer stores these graphical elements, such as GEMs or gadgets, in a library as template graphical elements, e.g., template GEMs or gadgets. The lead graphical designer may, for example, create different template GEMs for different types of process plant equipment (e.g., valves, sensors, heaters, diffusers, heat exchangers, etc.) and may create different gadgets to provide and/or display information to a user in a particular format or with particular user interaction tools. As part of this process, the lead graphical designer may also use the configuration form editor 36 to create or modify one or more quick configuration forms for each of the template graphical elements (such as the template GEMs and template gadgets). These quick configuration forms are constructed to enable other graphical designers to more easily use the generic or template graphical elements to create actual graphical element instances or usages (e.g., GEM usages or gadget usages) which are placed into and executed as part of user interfaces for the various monitoring or viewing applications described above. Each such GEM or gadget instance or usage may be configured slightly differently (i.e., have different graphical functionality) or may be tied to different data sources to reflect different operation or functionality of the actual equipment within the plant to which the graphical element usage is connected. Thus, a lead designer may create a GEM for a valve (called a valve GEM) and a quick configuration form for that valve GEM that enables the usage of the GEM, when created, to have various definable functionality that reflects a specific type of operation of the actual valve to which the usage is to be tied in the process plant. Thereafter, when creating specific displays, other designers can copy the generic or template GEMs and gadgets and modify these copies using the quick configuration forms previously created for the template GEMs or gadgets, to easily and quickly create a GEM or gadget usage that accurately reflects (in a graphical manner) the operation of the plant element or plant equipment to which the GEM or gadget usage is to be attached or associated. Because proper design of displays is critical to the safe operation of a process plant, this quick editing feature also helps to assure that the ultimate user displays are correct.

Figure 2A:
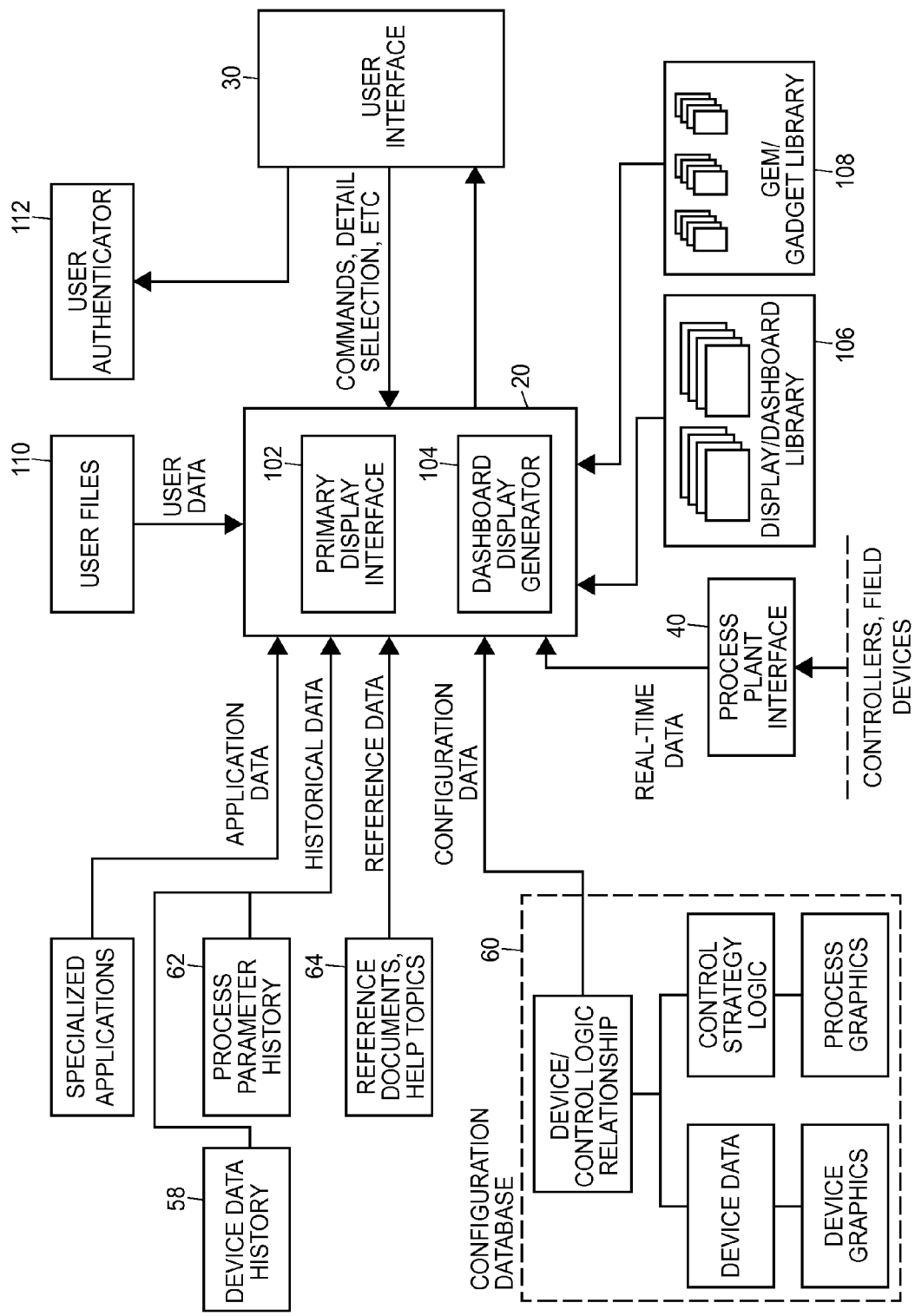
FIG. 2A is block diagram that illustrates a data flow diagram associated with the operation of a display configuration system having a graphical element creation and generation application that enables users to create and configure graphical elements within displays for use in a process plant environment using quick configure forms.

FIG. 2A illustrates an example data flow diagram used by or associated with the display or monitoring applications 20 as well as details of a manner in which the various display or monitoring applications 20 and the graphical elements thereof may be created. More particularly, the display application 20 is illustrated in FIG. 2 as including a primary display interface element or logic 102 and dashboard (display) generator element or logic 104. As will be understood, the primary display interface logic 102 includes the logic or programming for generating displays on a user interface, such as one of the user interfaces 30 or 32 of workstations 50 and 52 of FIG. 1, and may use any user interface displays stored in a library of displays 106 created for this specific purpose or view.

As illustrated in FIG. 2, the primary display interface logic 102 interacts with a user interface device (illustrated in FIG. 2 only as the device 30) to receive user commands, to provide and illustrate information to the user using one or more display objects (called displays) currently being viewed by or used by the user to view or interact with the plant 10. Of course, the logic 102 receives commands, selections, data, etc., from the user via the user interface 30 to manipulate the display and to interact with the display.

The display interface logic 102 uses one (or more) of a set of preconfigured display displays which may be implemented as a set of display objects in an object-oriented programming environment, to define the information and display characteristics that are provided to the user via the user interface 30. These preconfigured displays are illustrated or are provided as preconfigured displays or dashboards stored in a display/dashboard library 106 and may include graphical element usages therein, such as GEM usages and/or gadget usages. As noted above, the displays within the library 106 may be various engineer created system displays, which can be fixed and non-changeable displays created by a configuration engineer, or the displays in the library 106 may be dashboard displays that have been promoted up to the system level as system dashboards by one or more users, or the displays in the library 106 may be personal dashboards (dashboard displays) associated with one or more users.

Of course, when using a particular display or dashboard as stored in or obtained from the display/dashboard library 106, the primary display interface logic 102 may receive or obtain many different kinds of process and plant information from various different sources within the process plant 10 or control system 22 to which the application 20 is connected, in order to fill out or generate the display on the user screen or interface 30. In particular, as illustrated in FIG. 2, the primary display interface logic 102 may receive or obtain information from the configuration database 60 of FIG. 1 which is illustrated in FIG. 2 as including numerous sources or kinds of data including device data and device graphics, control strategy logic and process graphics. The configuration database 60 also includes device/control logic relationship information all of which, as well as any other configuration data stored in the database 60, may be provided as configuration data to the primary display interface logic 102. Of course, the logic 102 may obtain this data or parts of this data based on the display (or dashboard) being implemented or executed by the logic 102 at any particular time.

Still further, as illustrated in FIG. 2, the primary display interface logic 102 may receive reference data such as reference documents, help topics, etc., from, for example, the knowledge repository database 64 of FIG. 1 or from any other source. Additionally, the primary display interface logic 102 may receive historical data such as device history data from the process data database 58 of FIG. 1, and process parameter history from the historian 62 of FIG. 1. Also, the primary display interface logic 102 may receive application data from specialized applications, such as control applications, maintenance applications, data analysis applications, tuning applications, etc., which may be run in or on workstations, controllers, field devices or other processing devices of the plant 10. Likewise, as illustrated in FIG. 2, the primary display interface logic 102 may receive real-time data from a process plant interface which may be, for example, an interface in a controller 40 of FIG. 1 or any other the control system interface such as a gateway, etc. In any event, the real-time data may include real-time controller data, field device data, alarms and alert data, trend data collected by field devices or controllers or any other real-time data from the process plant 10 or the control system 22 within the plant 10. Any or all of this data, as well as other types of data, may be obtained by and received by the primary display interface logic 102 and provided to a user in a manner or format called for by the display or dashboard currently being implemented by the primary display interface logic 102 to generate a user display for the user.

As will be described in more detail below, a user, such as a configuration engineer, may be able to create various different types of template graphical elements and use these template graphical elements to create graphical element usages to be executed in one or more user displays used during run-time of the process plant 10. For example, a configuration engineer may create one or more template graphical element modules (GEMs) or template gadgets which generally include displayable indicia (for display on a user interface device to depict a graphical representation of a plant asset or a data container, such as a table, chart, graph, etc., that displays data from the plant about, for example, one or more plant assets) and configurable links to process control system data to be displayed or to be used to generate data to be displayed using the displayable indicia. In many cases, GEMs are used to provide a visual depiction of and information about one or more physical devices within a process plant, such as operational data, measurement data, alarm and alert data, etc. Gadgets, on the other hand, are generally created to provide plant information in other forms, such as in lists, tables, charts, graphs, etc. and may process plant data in some manner prior to displaying such data, such as filtering, averaging, etc. the data to create data to be displayed via the gadget. Both GEMs and gadgets may, in some cases, use other GEMs as sub-elements thereof.

Moreover, as described in more detail in U.S. patent application Ser. No. 14/048,844, the dashboard display generator logic 104 of the monitoring applications 20 may enable a user who is logged onto or who is interfacing with the application 20 to generate or create new dashboards (which are types of displays) to be used by the primary display interface logic 102 for displaying information to the user. In particular, the dashboard display generator logic 104 includes logic or programming executed on a processor (not illustrated in FIG. 2) that allows a user of the dashboard to select a dashboard for creation and to fill out that dashboard in a manner that creates a complete dashboard display that operates to provide particular process control or plant information in a particular format to the user in the manner that the user views as being most desirable.

As part of a dashboard creation process, a user may use one or more template GEMs or gadgets, as stored in a library 108 for example, to specify the particular display format or informational characteristics of the various regions or elements of the dashboard being created. In particular, the user may select or specify one or more of the template gadgets or template GEMs stored in the library 108 and may drag and drop those gadgets and GEMs into the various different regions or spaces of the dashboard to associate the gadget functionality with those particular locations or regions of the dashboard. If desired, the gadgets or GEMs in the library 108 may be preconfigured gadgets or GEMs tied to specific equipment, logic or data within the plant 10, in which case the gadgets or GEMs, as stored in the library 108 have various aliases, names, tags or connections (communication links) filled out to cause the gadget or GEM to provide display functionality with respect to or using particular plant data of a particular type received from a particular location within the plant, such as data from a particular field device or a particular controller within the plant, particular data from the data historian 62 or another database in the plant 10, etc. In some cases, a gadget may include one or more GEMs that are configured as part of the gadget template. In this case, the user does not need to configure the gadget (or GEM) in any great detail, as the gadget, as stored in the library 108 may already generally be preconfigured and thus may be tied to a particular plant asset. However, in some cases, as discussed below, the gadgets and GEMs may be quickly configured using a quick configuration form associated with the gadget or GEM, as described herein. In the configuration process, configuration logic within the dashboard display generator logic 104 will enable a user to specify the plant asset or plant assets of the plant 10 to which the gadget is to be connected during the time that the gadget is used as part of a dashboard. As part of this configuration effort, the user may be allowed to search for and select various plant assets to which the gadget or GEM is to be tied by, for example, tag name, aliases, communication links, etc. In many cases, a particular gadget or GEM may need to include numerous links to various data within the plant, as the gadget or GEM may need to receive two, three or more types of data to perform a display function associated with the gadget or GEM. In this case, the user may be enabled to specify each of the links to the plant assets or data sources to be used by the gadget or GEM individually and may do so via a quick configuration form. However, if desired, to assist the user in this task, the library 108 may also store one or more quick configuration forms that that relate to, or that specify the various data sources or links associated with various assets in the plant and which enable a user to specify each of the data sources for a particular plant asset to be used by a gadget or GEM by specifying which form to use. As an example, quick configuration forms may be created and stored in the library 108 (for example), which list or store, in an organized manner, the various data source links to each of the types of data associated by or provided by a particular plant asset, such as a unit, a piece of equipment, a controller, a control loop, etc. Thereafter, when a template gadget or GEM is selected, the template gadget or GEM may, itself, only store links to the various fields of a generic form that is applicable for the particular type of gadget or GEM to the specific operation that the gadget or GEM may perform. Thereafter, the user may need only fill out the quick configuration form to specify the name of or the link to the general asset, such as a particular unit (a set of equipment) in the plant or a piece of equipment in the plant or a controller in the plant or a control loop in the plant, for example, and the configuration form application will then use the quick configuration form to fill out the specific links in the gadget or GEM for that plant asset or links to data, thereby enabling a user to configure a gadget or GEM more easily.

Moreover, no matter how the data links are configured in a gadget or a GEM, the user may need also need to configure a selected gadget or GEM by specifying or selecting various display or behavior options associated with the gadget or GEM, such as the type of and animation behavior of the display elements associated with the gadget or GEM. For example, the configuration logic may enable a user to indicate whether the gadget or GEM is to display data as raw data values, as a graph or a bar chart, using a trend graph or slider, etc. The configuration logic may also enable a user to specify colors, fonts, and other formatting features of the display element created by the gadget or GEM, and to specify particular manners in which the user may interact with the gadget or GEM, such as using input fields, slider bars, etc., and the configuration logic may enable the user to specify or select any other configuration features. Here again, a quick configuration form may be used to enable a user to specify these behaviors.

Once the user has created a new dashboard by configuring each of the desired gadgets and/or GEMs and placing these gadgets and/or GEMs into the desired locations, spaces or regions of the new dashboard using the dashboard display generator logic 104, the user may store the newly created dashboard in the library 106 as a personal dashboard (available for that user) or as a system dashboard (available to all or at least some other users). Additionally, if desired, the user may promote the dashboard into a system display by converting the dashboard into a display, meaning that the dashboard can no longer be changed. In any event, the user may, at some point later in time, select the dashboard to be the display to be used by the primary display interface logic 102 to interface with the user to view run-time operation of the plant 10.

Additionally, the primary display interface logic 102 may be programmed to provide the list of dashboards and displays that are most relevant to, or that are favorites of a particular user, to the user for easy navigation by the user. In particular, each user may have a set of personal dashboards and favorite dashboards and displays stored within a set of user files 110. Upon logon to the application 20 or the system in which the application 20 is used, as determined by a user authentication system 112, the user may be provided with a list of "favorite" displays and dashboards and "personal" dashboards, and may be able to select one or more such dashboards or displays from these lists to select a dashboard or display to use in viewing the operation of the plant 10 at any particular time. The user lists of dashboards can be provided as lists of favorite displays and/or dashboards, personal displays and/or dashboards, or as displays or dashboards (e.g., personal and system displays and dashboards) organized by user role or activity, organized by plant area, organized by equipment type, organized by task, etc. Thus, the lists of displays and dashboards (which lists point to displays and dashboards stored in the library 106) may be organized to group displays and dashboards relevant to a particular user, a particular group of users, roles performed by users (e.g., operator roles, maintenance roles, configuration engineer roles, business manager or plant manager roles, etc.), tasks, etc.

Figure 2B:
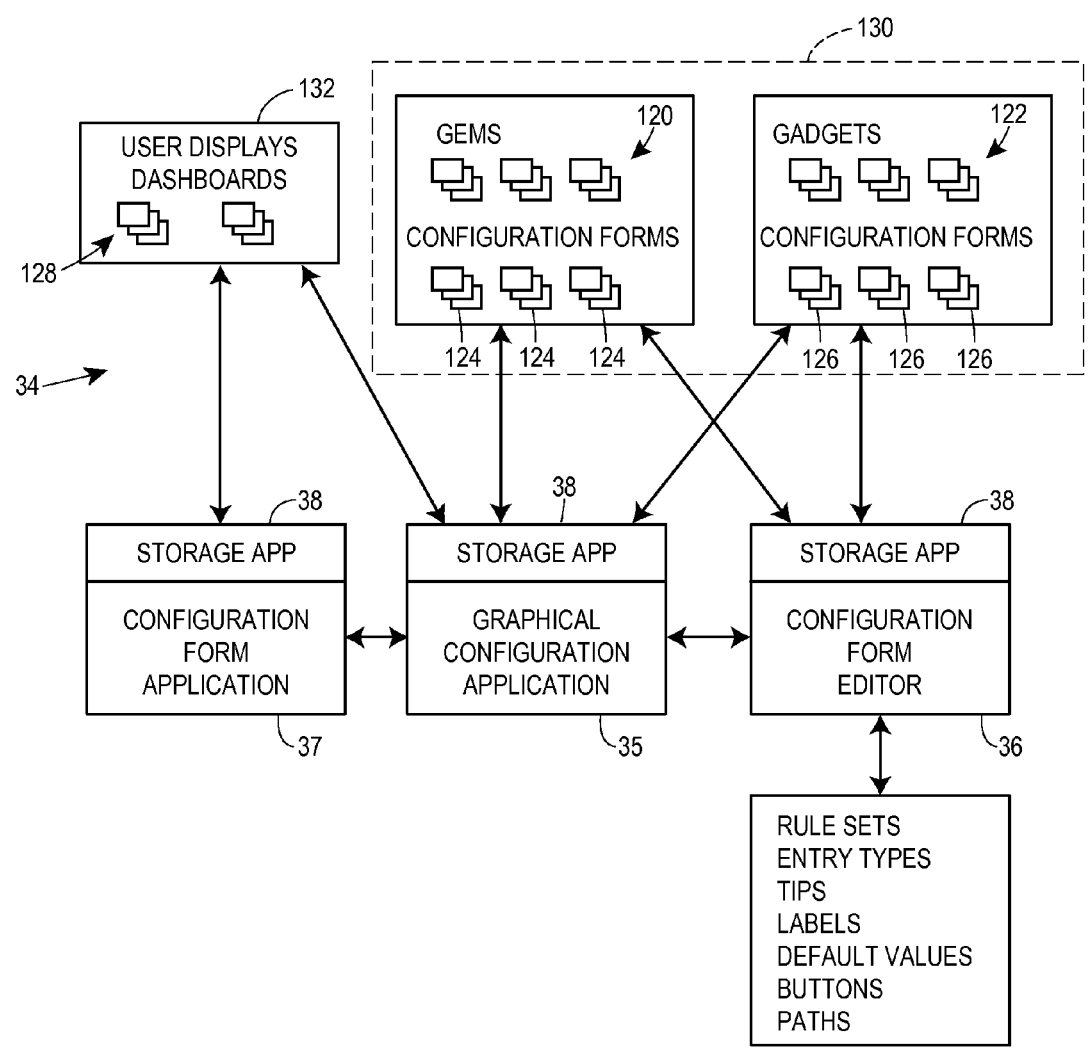
FIG. 2B is a block diagram of a user display configuration system that enables a user to create template graphical elements and configuration forms associated with the template graphical elements for use in configuring graphical element usages from the template graphical elements.

FIG. 2B illustrates a graphics configuration and development system 34 that may be used to create and configure template graphical elements (such as template GEMs 120 and template gadgets 122 as illustrated in FIG. 2B) and that may be used to create quick configuration forms for one or more of these template graphical elements (illustrated as forms 124 and 126 in FIG. 2B). The graphics configuration and development system 34 may also be used to thereafter enable a user to create GEM and gadget usages from these template GEMs and template gadgets using the quick configuration forms 124, 126 in the process of creating one or more user displays 128, such as dashboard displays. As illustrated more specifically in FIG. 2B, the graphics configuration and development system 34 includes a general graphics configuration program or application 35, such as a WebStudio graphics program or other graphical configuration program, which may be executed on a processor to create the template graphical elements 120 and 122 as well as user displays 128 made up of graphic element usages created from template graphical elements 120 and 122. The graphics configuration and development system 34 also includes a configuration form editor 36 that may be executed on a processor (not shown in FIG. 2B) to create the one or more quick configuration forms 124 and 126 for the template graphical elements 120 and 122. The graphics configuration and development system 34 also includes a configuration form application 37 that may be executed to enable a user to configure a graphic element usage from one of the template graphical elements 120, 122 by entering configuration data via one or more of the configuration forms 124, 126 for the template graphical element. That is, the configuration form application 37 enables the user to enter specified types of configuration information into a user interface device via the appropriate configuration form to specify configuration information used to configure the specific operation of the graphical element usage being created from the template graphical element. Additionally, the graphics configuration and development system 34 includes one or more storage applications 38 (which may be part of or separate from the application 35, the editor 36 and the application 37) that may be used to store the template graphical elements 120, 122 and the configuration forms 124, 126 in a library 130 so that the appropriate forms 124, 126 are associated with the corresponding template graphical elements 120, 122. Additionally, the storage applications 38 may enable a user to store user displays such as dashboard displays and other types of user displays in a library 132 for use during runtime of the plant to provide graphics to various different users.

Generally speaking, the graphics configuration system 34 can be used by one or more graphics designers, such as a lead graphics designer and a secondary graphics designer to develop and easily configure graphical elements for use in the user displays (including user dashboards) as described above. More particularly, during the graphical development process, a lead graphics designer may use a computer or other workstation to design and develop one or more template graphical elements, such as template GEMs 120 or the template gadgets 122, which may be stored in the library 130, which may be the library 108 of FIG. 2A. These libraries are typically formed in or implemented in tangible computer readable mediums of any known type. In particular, the designer may use the graphics configuration program 35 in any standard manner to create template graphical elements that have display or graphics features, such as visual elements including shapes, colors, animations, etc. and properties, as well as configurable links to process data, to represent a process element, such as process equipment, control elements like control loops, alarms, etc., or to provide some graphical information to a user, such as a view of process data, etc. Of course, doing so, the lead graphics designer must understand how to use the graphics configuration program 35 to produce these features, by setting graphics fields, graphics parameters, etc. of the graphical elements in the proper manner. However, as part of this process, the lead graphics designer may also use the configuration form editor 36 to create one or more quick configuration forms (e.g., the forms 124, 126 of FIG. 2B) for one or more of the template graphical elements 120, 122, wherein the quick configuration forms define particular configuration modifications that can be made to the template graphical element (e.g., a template GEM 120 or a template gadget 122) when the template graphical element is used to create a graphical element usage (such as a GEM usage or a gadget usage) for use in a user display 128, such as in one of the gadgets, dashboards or displays stored in the libraries 106 or 108 of FIG. 2A. The quick configuration form may specify, for example, graphical behavior for the graphical element usage that indicates the existence or non-existence of specific functional features that may or may not exist in particular process equipment or logic associated with the graphical element usage, data links to be used to obtain data for the display or use by the graphical element, etc. Such functionality may include, for example, hardware, software or operational features of the process element, manners of interfacing with or using the process element that are supported, manners of acquiring and sources of data, manners of displaying or filtering data, etc. Moreover, the quick configuration forms 124, 126 may enable a user to specify one or more different manners of depicting certain features (e.g., by enabling the choice of color or animation to graphically indicate the existence or non-existence of a feature). Still further, the quick configuration forms 124, 126 may provide labels for the features of the graphical element to be changed that reflect process control hardware, software, data or functionality, instead of the names of graphical parameters as used in the graphics configuration program 35, to enable a secondary designer to understand the nature of the graphical element or the feature being configured, as it pertains to process control functionality within the plant 10. These quick configuration forms may be stored in the database along with the template graphical elements. In creating the quick configuration forms, the configuration form editor 37 may store, obtain and use various template data sets to be used to create quick configuration forms. For example, the configuration form editor 37 may access, from a library 39, various stored or template rule sets, data entry types, tips, labels, default values, button operations, communication path links, etc. that may be used to fill out or populate pop-up windows and configuration cells of quick configuration forms when creating quick configuration forms. The library 39 may also store interrelationships between these data types, such that a particular rule set, default valve, tool tip, etc., may be stored to be used with a particular entry data type, or a particular label, etc., when generating a quick configuration form. Moreover, the library 39 may store relationships between particular types of graphical element parameters or properties thereof and rules sets, data entry types, default values, tool tips, etc., to use in the configuration of each such parameter or property via a quick configuration form.

Thereafter, a secondary designer can use the configuration form application 37 to access and configure template graphical elements via the associated quick configuration forms to quickly create different graphical element usages from the same template graphical element, which usages reflect (are tied to) actual process plant equipment, data, resources, or other plant elements. In particular, when designing a user display or a gadget, the secondary designer may select an appropriate template GEM or template gadget for use in a display to reflect the operation of a particular piece of plant equipment or to provide certain viewing functionality to a user (such as a view of particular types of data). As part of the configuration process, the secondary designer may access the quick configuration form for that template GEM or template gadget and manipulate or use (enter data via) the quick configuration form to specify different operational functionality of the graphical element usage that accurately reflects the specifics of the piece of plant equipment being illustrated at this point in the user display or to enable the user to modify the graphical functionality of the graphical element usage in some manner. The quick configuration forms, once filled out, are used by the graphics configuration application 35 to create a graphical element usage with the specifics specified within or via the quick configuration form for the template graphical element from which the usage is being created. In this manner, the secondary graphics designer does not need to know the specific instructions needed by the application 35 to make these changes, and thus can work more efficiently to create user interfaces from the template graphical elements.

FIGS. 3-32 present various examples of the manner in which a template graphical element such as a template GEM or a template gadget can be provided with a quick configure form and then used to produce a graphical element usage for use in a process plant user display. In particular, at a first step, a first graphics designer, such as a lead graphics designer, uses the graphics creation program, such as Web-Studio, to create a template graphical element. In this example, the first graphics designer, referred to generally herein as a lead graphics designer, will create a template graphical element in the form of a template valve GEM 25 which can be used to provide graphical information pertaining to a valve in a process plant. As part of this process, the lead graphics designer first assembles basic shapes into the likeness of a physical valve.

Figure 3:
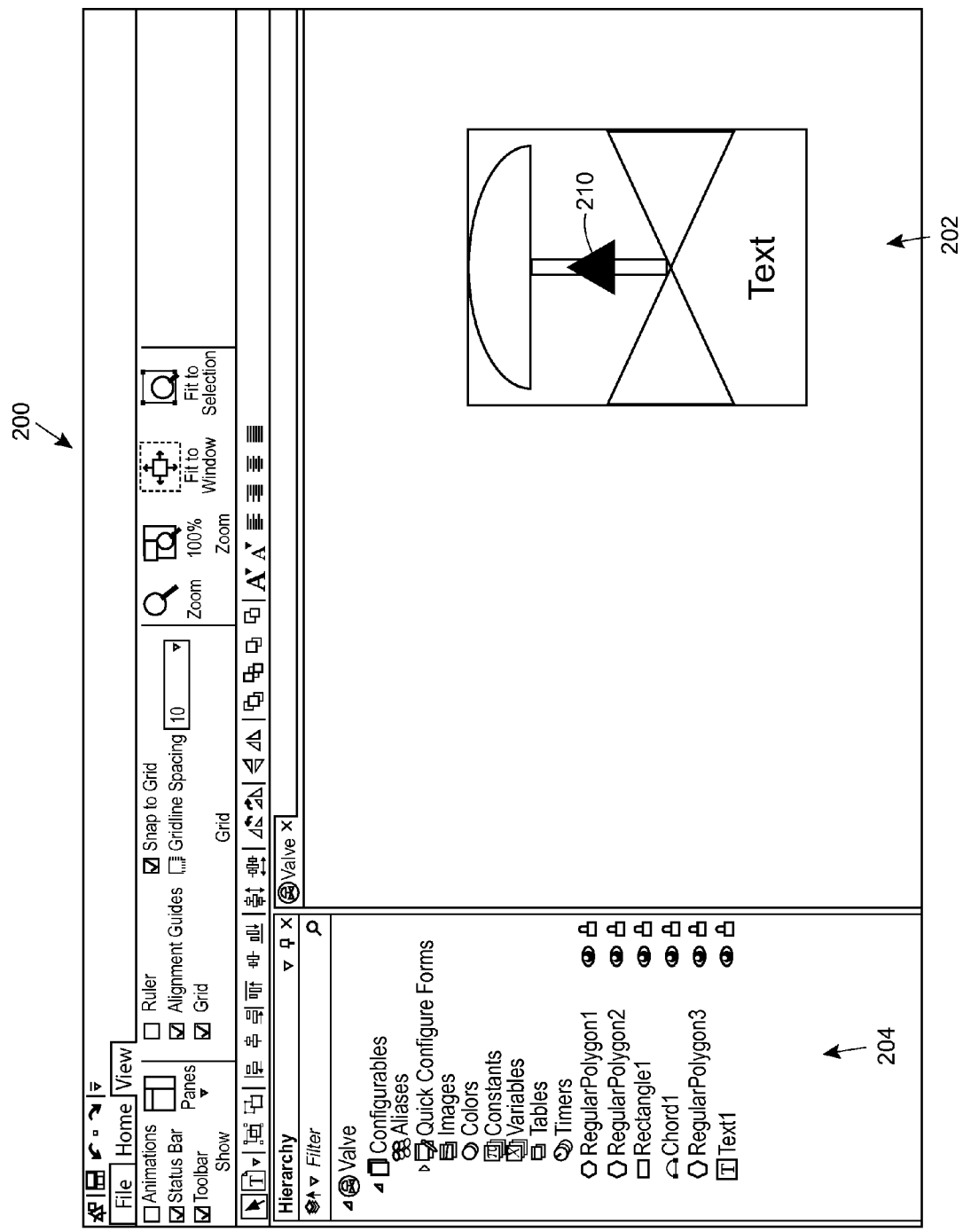
FIG. 3 illustrates a display screen depicting a user interface that may be provided by a graphical programming application in the process of creating a first template graphical element for use in one or more user displays.
Figure 4:
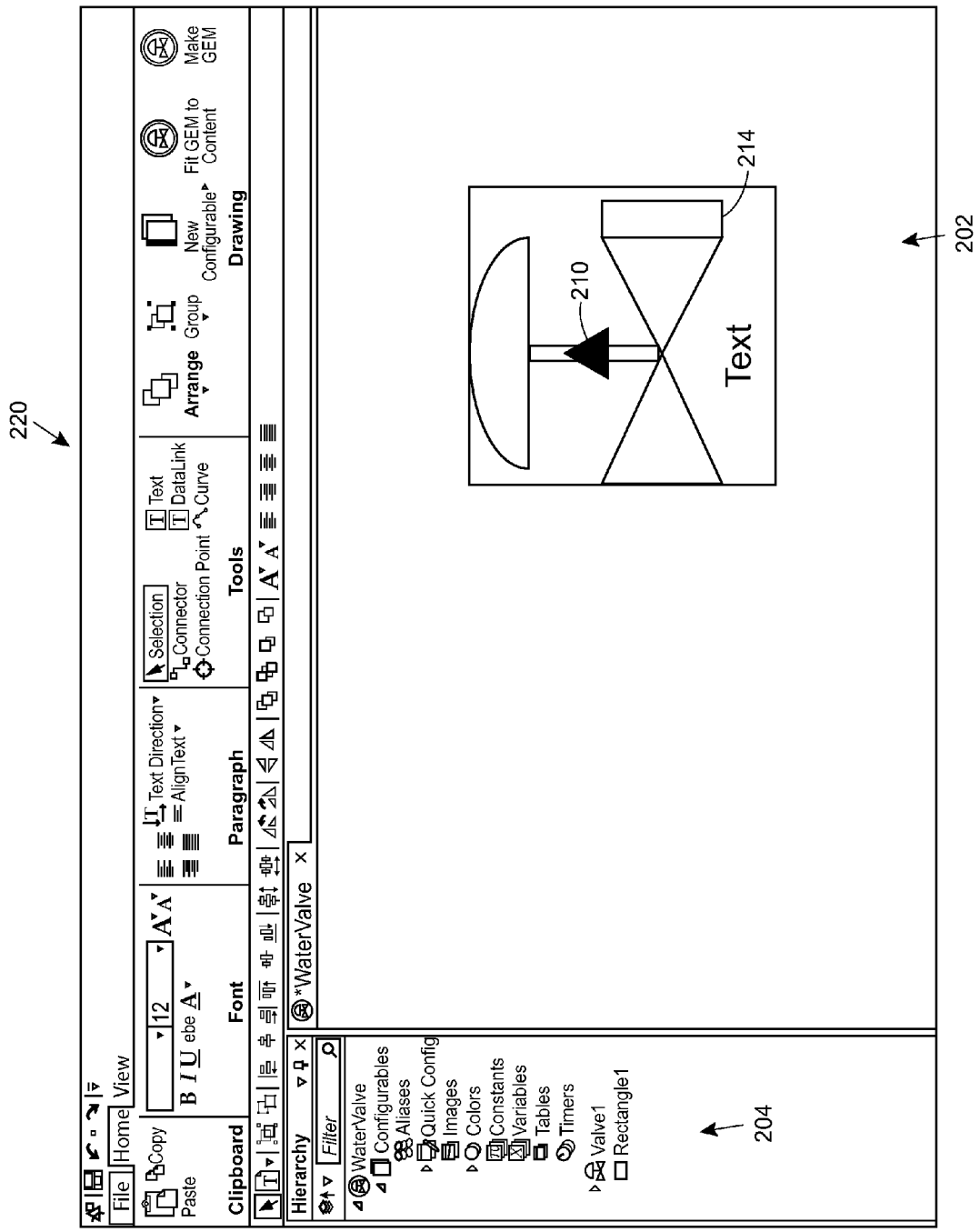
FIG. 4 illustrates a display screen depicting a user interface that may be provided by a graphical programming application in the process of creating a second template graphical element from the first template graphical element for use in one or more user displays.

For example, as illustrated in FIG. 3, which provides a configuration screen 200 that may be produced by the graphical configuration application 35, the lead designer uses the general graphics configuration program 35 to drag and drop basic shapes such as triangles, ovals, circles, etc., onto a canvas area 202 shown on the right side of the screen 200 of FIG. 3.

These various shapes will be named, as illustrated in the hierarchy 204 on the left side of the screen 200 (e.g., RegularPolygon1, Rectangle1, etc.) Additionally, the hierarchy 204 displays other configurable features for the Valve graphical element being created in the canvas area 202. Using the standard features of the application 35, the lead designer may attach shapes to one another in a desired pattern on the canvas area 202, and may add colors, text and animations as desired to create a template valve GEM called Valve. Each of the basic shapes has a given name in the programming environment, such as Rectangle1, etc. and these basic shapes become sub-elements of the template valve GEM, as illustrated in the hierarchy 204 on the left side of the user interface, defining the template valve GEM being created. Thus, the screen 200 created by the general graphics program 35 shows both the visualization of the template valve GEM and the hierarchical representation of the basic shapes that belong to a valve.

In this example, the black triangle 210 in the center of the valve GEM of FIG. 3 has special significance as this triangle 210 represents the fail state of the valve. In particular, physical valves that will be used in the plant for which the template valve GEM is being created can either open all the way when they are in the fail state, or they can close all the way when they are in the fail state, and the template valve GEM illustrated in FIG. 3 is being created so as to be able to depict either state. To do so, the lead designer chooses the ISA standard depiction of these two states in which the fail open state is depicted by the triangle 210, (called Regular-Polygon1 in the hierarchy 204), pointing up as shown in FIG. 3, and in which the fail closed state is depicted with the same triangle 210 pointing down. After creating this depiction, the lead designer may store the template valve GEM as a template valve GEM in a library, such as the library 108 of FIG. 2A or the library 130 of FIG. 2B.

Next, the lead designer may create a further type of template GEM using the template valve GEM as stored. In this case the lead designer may want to create a template GEM for a specific type of valve called a water valve, which is a particular type of valve used for controlling the flow of water. Here, the lead designer can leverage the work previously performed on the template valve GEM, but needs to add an additional feature for a project that utilizes water valves. In this example, the physical water valves for which the water valve GEM is to be created come in two types including those that incorporate backflow protection and conventional valves that do not incorporate backflow protection. The lead designer needs to accommodate the additional behavior so he or she creates a new template GEM called WaterValve and embeds the template valve GEM within this new template water valve GEM. Next, as illustrated in a screen 220 of FIG. 4, the lead designer adds an orange rectangle 221, named Rectangle1 in the hierarchy 204 to the WaterValve GEM being created, so that this rectangle 221 is located on the output of the graphical indicia of the valve GEM. This rectangle 221 is used to optionally depict a backflow preventer on the structure provided by the template valve GEM. Now a specialized template water-valve GEM has been created that still incorporates the basic functionality of the valve GEM.

In a typical case, a secondary designer may now use the template valve GEM and the template watervalve GEM to create one or more user displays. However, when doing so, the secondary designer must typically configure the template GEMs, using the general graphics configuration application, to cause the GEM usages created from the template GEMs to be used within the user display to reflect the actual operation of valves within the plant 10. This configuration activity can be time consuming and tedious, and requires the secondary designer to understand how to use the general graphics configuration application 35 to change graphical features of the template GEMs.

Figure 5:
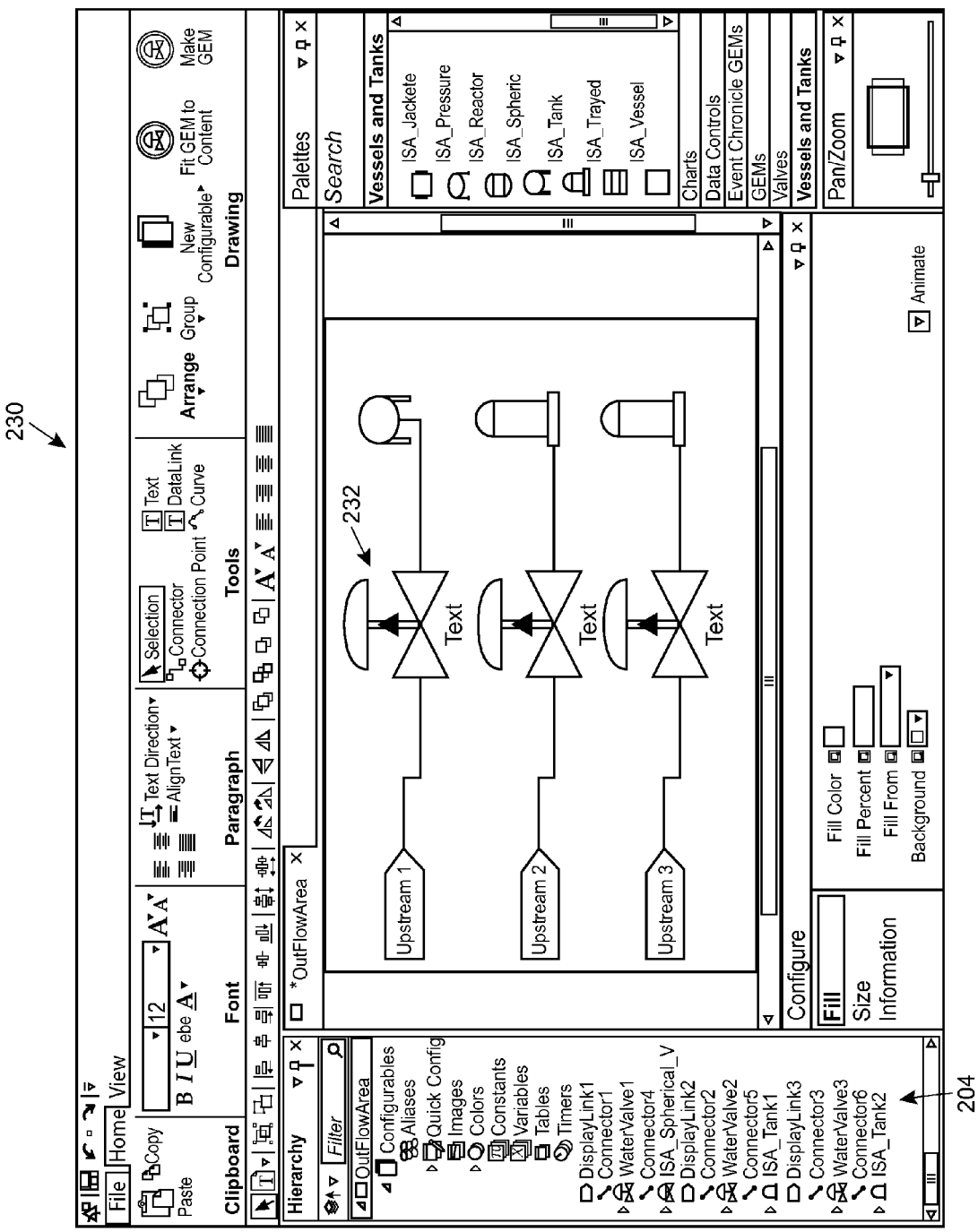
FIG. 5 illustrates a display screen depicting a user interface that may be provided by a graphical programming application in the process of creating a user interface display from one or more of the first and second template graphical elements depicted in FIGS. 3 and 4.

As an example of such a typical process, the secondary designer may add and configure a number of instances of the template WaterValve GEM within a user display that he or she needs to create. FIGS. 5-9 illustrate a manner in which the secondary designer would do so without the use of a quick configuration forms described in more detail below. In particular, as an example, the secondary designer is ready to build a display that represents part of the plant and wants to use the template WaterValve GEM in the display to depict a physical water valve that fails open and incorporates backflow prevention. First, as illustrated in FIG. 5, this secondary designer creates a display named OutFlowArea in the canvas area 202 on the screen 230 of FIG. 5 and then drags three template WaterValve GEMs from the palette of the display to the canvas or configuration section 202 of the display, as well as dragging and dropping the other graphical objects (such as connectors, tanks, etc. shown in the hierarchy 204) that complete the depiction of the OutFlowArea as depicted in FIG. 5.

Figure 6:
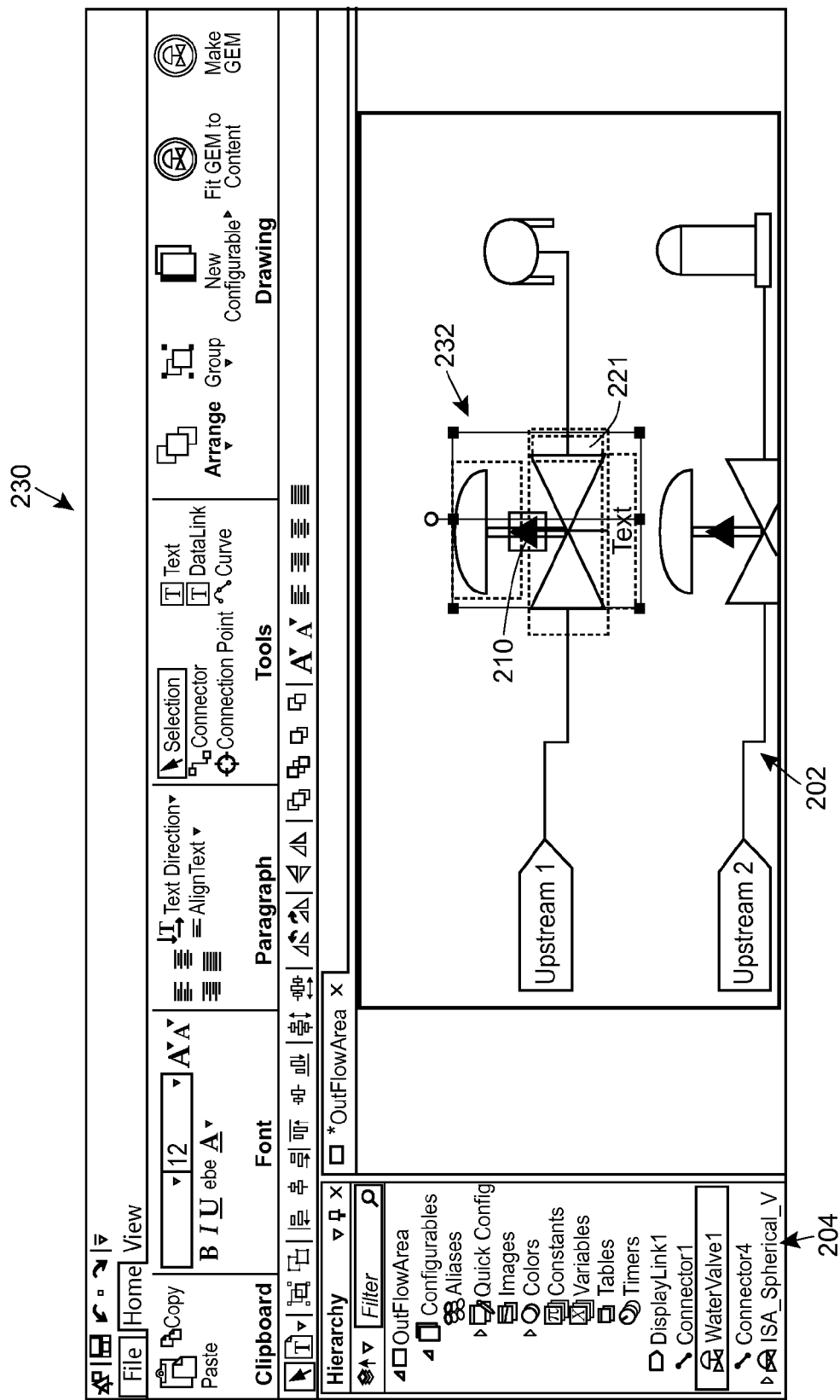
FIGS. 6-9 illustrate various display screens depicting a user interface that may be provided by a graphical programming application to illustrate the manner in which a user must manipulate the first and second template graphical elements in the user display of FIG. 5 to customize these template graphical elements to create one or more graphical element usages for the user display.
Figure 7:
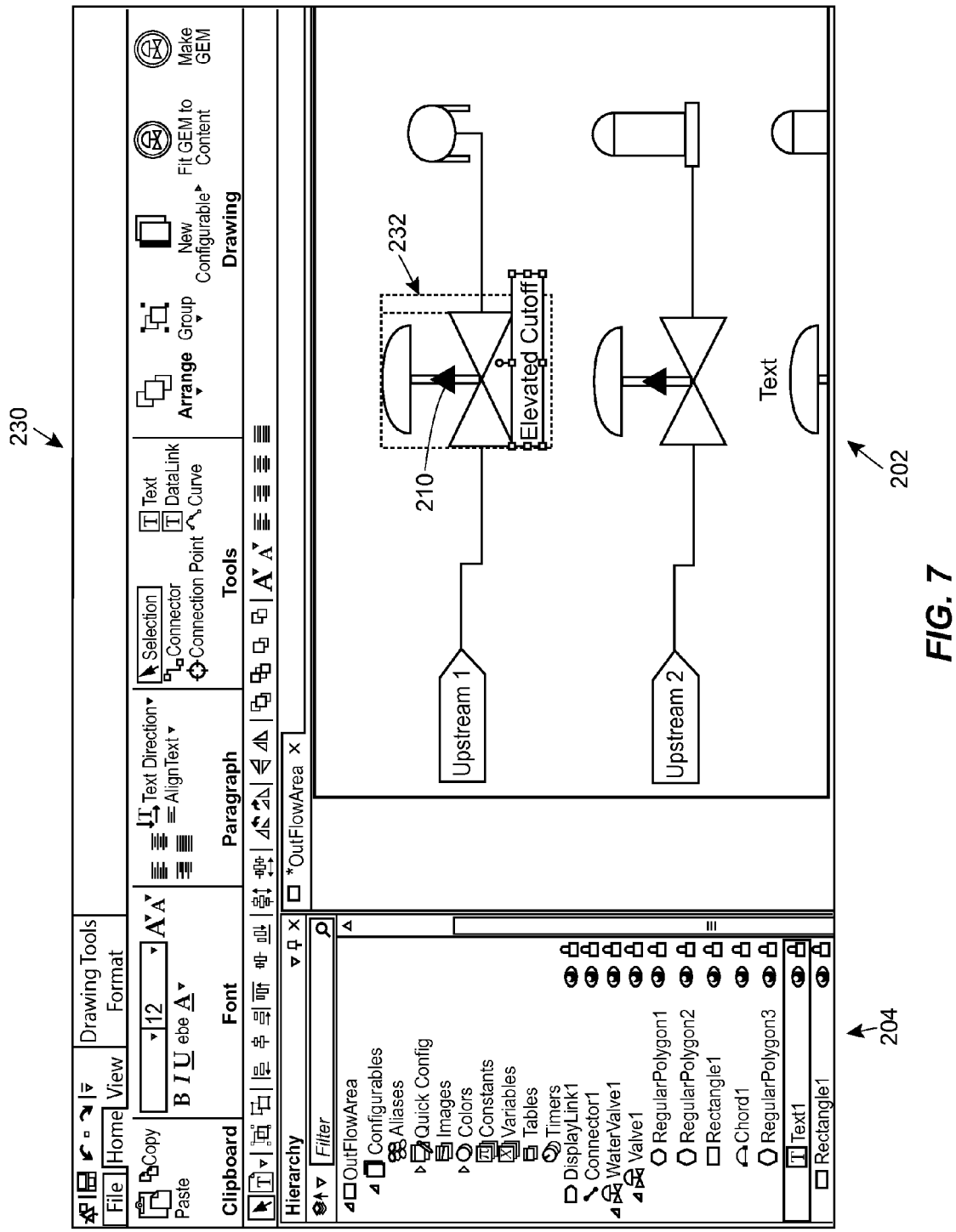

However, at this point, the secondary designer needs to customize each instance of template WaterValve GEM, which involves providing a unique name, setting the fail mode and setting the type (as including or not including a backflow preventer). To do that, for the top watervalve 232 in FIG. 5, called WaterValve1, the secondary designer will need to set the name by (1) selecting the WaterValve1 232 in the canvas area 202 of FIG. 5, as illustrated in FIG. 6, (2) selecting the text portion of the selected WaterValve1, which actually then selects the underlying Valve1 instance of the template valve GEM embedded into the watervalve GEM, (3) selecting the text portion again to select the underlying text box of the template valve GEM, (4) selecting the text portion again to select all the text inside the text box and then (5) entering or typing the desired name (e.g. Elevated Cutoff) as illustrated in FIG. 7.

Figure 8:
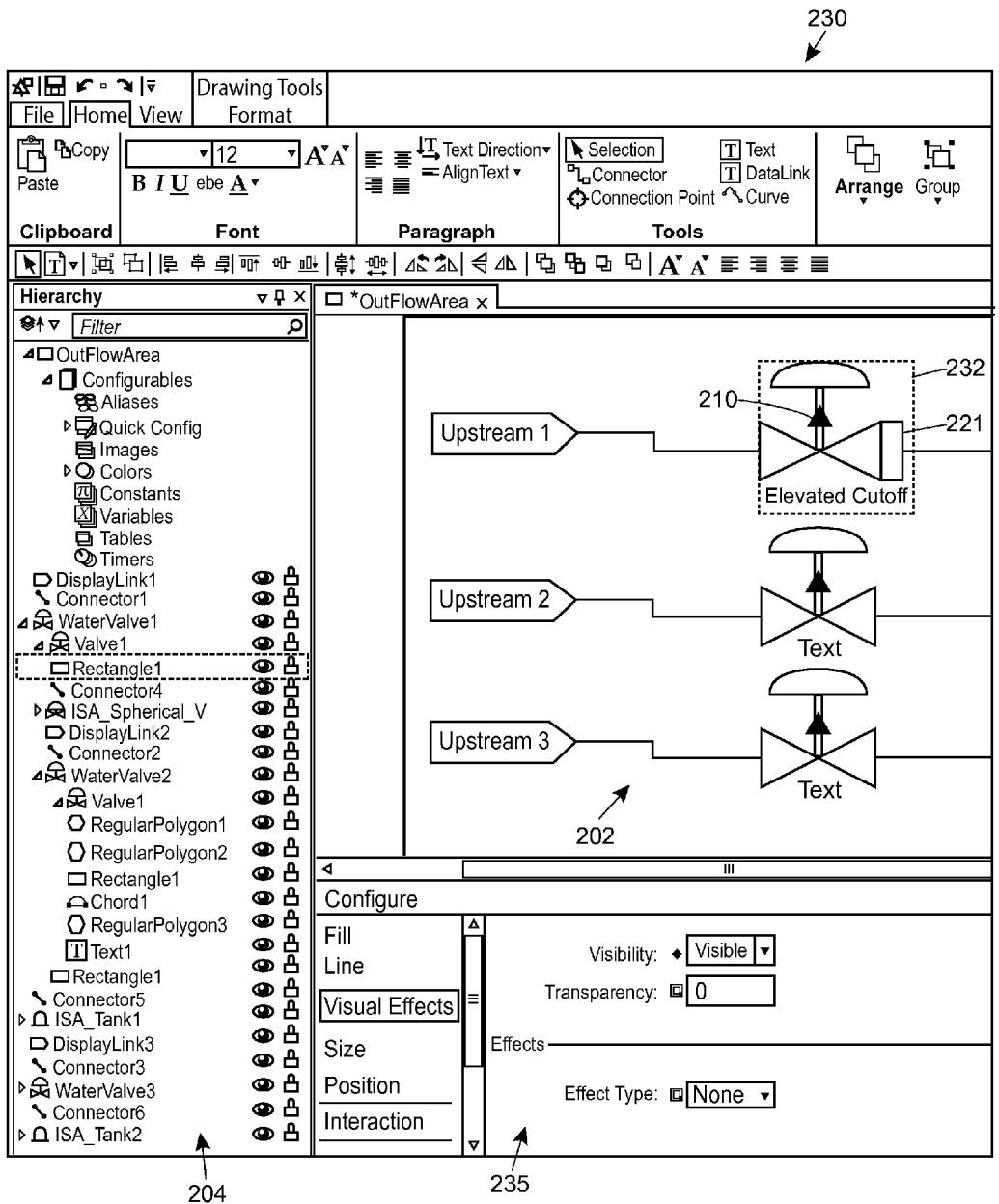

Now, as illustrated in FIG. 8, to change the type of valve, the secondary designer will need to (1) select the WaterValve1 GEM, (2) expand WaterValve1 GEM, (3) select the Rectangle1 subelement of the WaterValve1 GEM, (4) select the Visual Effects tab in the configure view 235 at the bottom of the screen 230, (5) click the dropdown list associated with visibility and (6) select "Visible" from the list. Here, it is important to note that the secondary designer needs to know that the name Rectangle1 is the correct visual element that needs to be made visible to indicate that the watervalve 232 is one that has a backflow cutoff element. Moreover, the secondary designer needs to be familiar with the manner of selecting and setting the properties of the various graphic subelements that are part of the GEM within the general graphics configuration program 35 using the configuration area 235, and the hierarchy 202.

Figure 9:
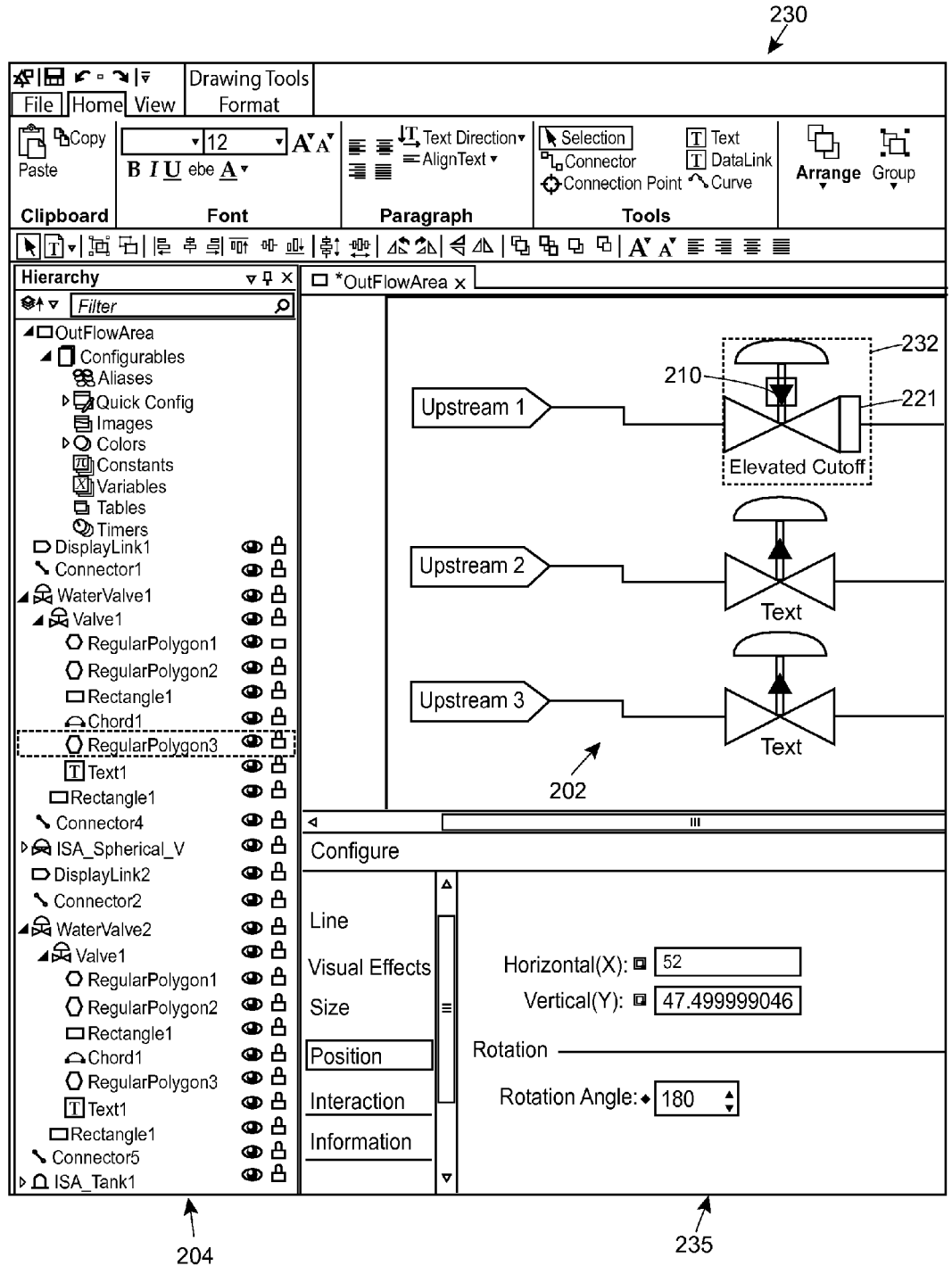

Still further, with reference to FIG. 9, to change the failsafe mode for the WaterValve1 GEM, the secondary designer must (1) expand the WaterValve1 GEM, (2) select the Valve1 GEM that is part of the WaterValve1 GEM, (3) expand the Valve1 GEM, (4) select the RegularPolygon3 subelement of the WaterValve1 GEM, (5) select the position tab in the configure view 235 at the bottom of the user interface screen 230, (6) select the Rotation Angle Spinner/Text Box, and (7) spin the rotation value from zero up to 180 degrees to cause the arrow 221 (as defined by the RegularPolygon3 subelement) to face downward. Here, it is important to note that the secondary designer needs to know that the WaterValve1 includes a sub component of Valve1, that the RegularPolygon3 element is the element of the Valve1 element that defines the arrow 210 in the center (which indicates the fail safe mode), needs to know that the arrow 210 is to be used to indicate the fail safe mode of the water valve, needs to know what positions of the arrow represent what type of fail safe mode, and needs to be familiar with the manner of selecting and setting properties of the various graphic subelements that are part of the GEM within the general graphics configuration application.

Instead of manually performing all of this activity (which must be repeated for each watervalve being depicted in FIGS. 5-9), the configuration form editor 36 of FIGS. 1 and 2B may be used by, for example, the primary or lead graphics designer to create a quick configuration form that can be used by the secondary designer to easily change visual effects and parameters of the various graphical subelements of the template GEMs used by the secondary graphics designer in creating the user display 230. In particular, the quick configuration form may be used to eliminate or at least to substantially reduce the number of steps needed for the secondary designer to change each instance of WaterValve GEM in FIGS. 5-9 to make these instances or usages be unique within the system and to reflect the operation of actual equipment within the plant 10. Moreover, the quick configuration form can be used to provide names for objects and their fields that have intuitive meanings within the process control system for the secondary designer, to make it easier for the secondary designer to understand what he or she is changing in the context of the process control system name space, instead on in the context of the graphical program name space.

Still further, the quick configuration form makes it easier to navigate through the hierarchy of the underlying graphical sub-objects of a display element and thus reduces the time it takes for the secondary graphics designer to locate the right sub-element to modify, and reduces the need for the secondary graphics designer to navigate through the panes of the configure view 235 of the general graphical configuration application 35 to find a specified field. Additionally, the quick configuration form can be used to reduce or eliminate the ability of the secondary designer to enter incorrect values into the fields of this program and thereby configure the graphical element incorrectly.

Generally speaking, as described above, the general graphical configuration application 35 can be modified to include or to use the quick configuration editor 36 and the configuration form application to, on the one hand, enable a user, such as the lead designer, to create a quick configuration form for a particular template graphical element and to, on the other hand, use the quick configuration form to enable another user, such as a secondary designer, to easily and quickly configure a template graphical element to create a graphical element usage.

In particular, the lead graphics designer, after or while defining the visible objects or parameters of a template graphical element (including defining displayable indicia such as boxes, arrows, lines etc., and configurable links to process control system data to be displayed on a display device using the displayable indicia) can create a quick configuration form for the template graphical element. As an example, the lead graphics designer may create a quick configuration form for a template graphical element, such as a template GEM like the WaterValve GEM described above, by accessing the configuration form editor 36 to define a set of actionable elements for use as part of the quick configuration form, which actionable items will define or be used to allow other users to specify specific configuration information while configuring a graphical element usage from the template graphical element. As part of this process, the lead designer may define or specify the behavior of these actionable elements by specifying the operation or information to be placed into or accepted by various configuration cells associated with the actionable item. The operation of the actionable items as part of the configuration form makes it easier for a secondary user to use these actionable elements intuitively to configure a graphical element usage. For example, the lead designer can add actionable elements as part of a quick configuration form related to various parameters of the template graphical element that the lead designer knows or believes will or would likely be changed for different usages developed from that template graphical element. In particular, for each actionable element, the lead designer can establish or specify the operation of various configuration fields that will be used to enable a further user to easily configure a graphical element usage.

As an example, various actionable elements for the water valve template GEM described above may include a name actionable item (which enables a secondary user to easily provide a name for a graphical element), a failure mode actionable item (which enables a secondary user to define the operation of a failure mode indication for a graphical element depending on the failure mode operation of the device being represented by the graphical element usage), and a type actionable item (which enables a secondary user to define whether the water valve GEM usage includes a backflow cutoff). In this example, the created quick configuration form will later be used by the configuration form application 37 to generate a quick configuration view for each template watervalve GEM which can be used to easily provide configuration information needed to configure the watervalve GEM usages when creating particular user displays.

Figure 10:
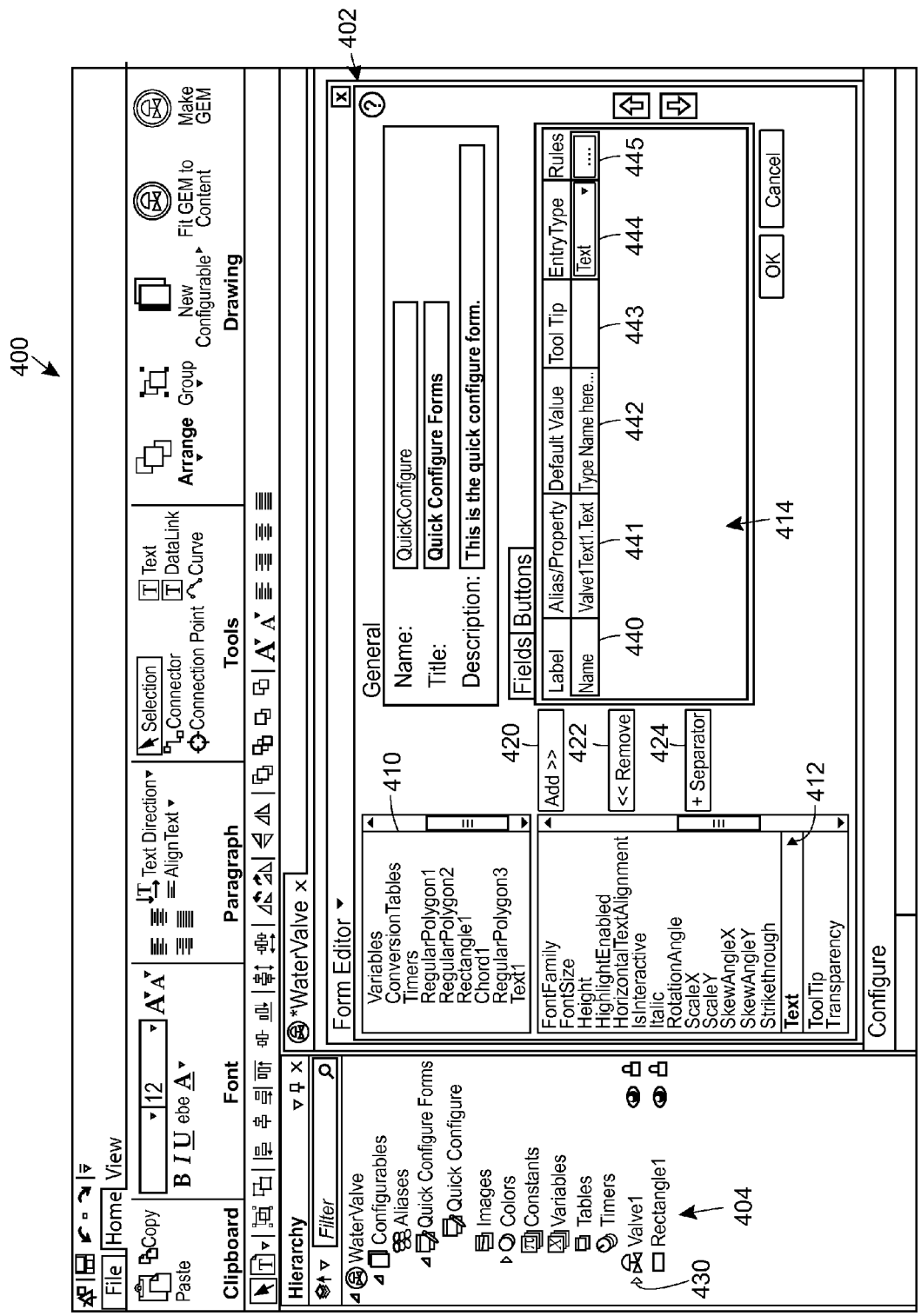
FIG. 10 illustrates a display screen depicting a graphical element configuration application that includes a quick configuration form editor to enable a designer to create one or more template graphical elements with quick configuration forms to enable other users to quickly customize the template graphical elements to create graphical element usages.
Figure 11:
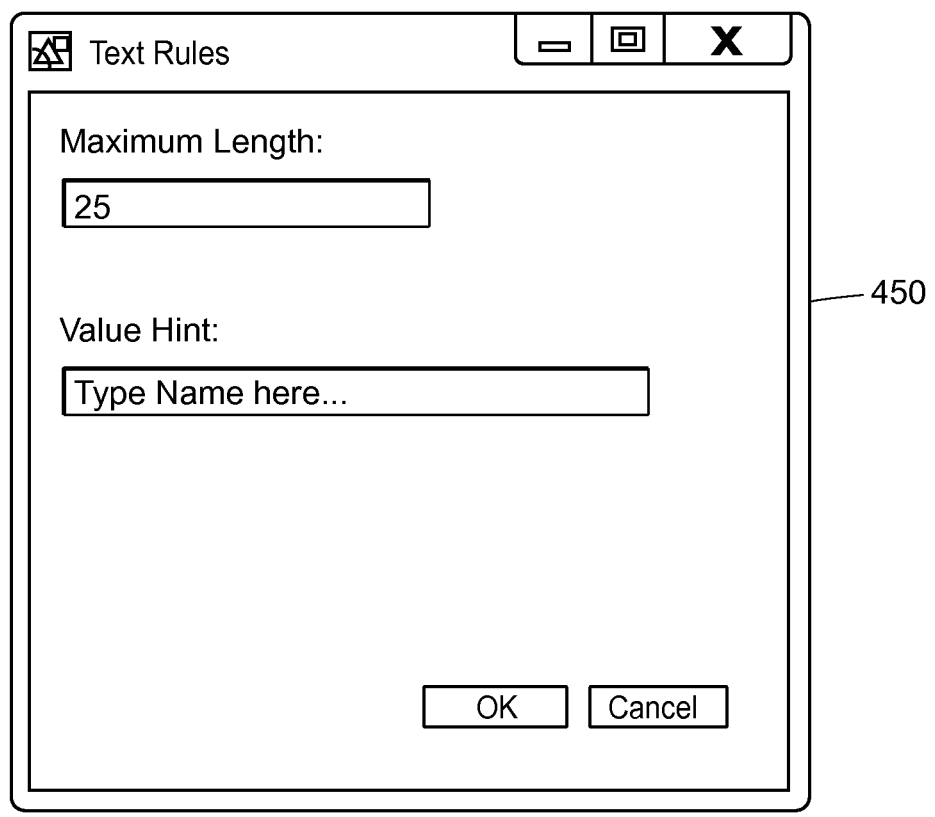
FIGS. 11-15 illustrate various display screens and pop-up windows that may be provided by a configuration form editor to enable a designer to create and save a quick configuration form for a template graphical element.

FIGS. 10-15 will be used to depict a manner in which a lead designer may use the configuration form editor 36 to create a quick configuration form for the template watervalve GEM while FIGS. 16-19 will be used to depict a manner in which the configuration form application operates to accept configuration information via the use of a quick configuration form in creating a graphical element usage from the template watervalve GEM. In this example, lead designer may want to create a quick configuration form that enables other users or designers to fill in a name for the watervalve usage, to select a type of valve being used as the water valve (e.g., a convention valve or a valve with backflow prevention) and to select and illustrate the failure mode of the valve being used as the water valve. As illustrated in FIG. 10, the configuration form editor 36 may be evoked in the hierarchy 404 illustrated in the screen 400 by selecting the Quick Configuration Form element under the Configurables element of the WaterValve element. In response, a configuration form editor screen 402 appears on the right side of the screen 400, and in this example, the configuration form editor screen 402 includes an alias or parameter field 410, a property field 412 and an action item field 414. Here, alias or parameter field 410 provides a list of aliases and or parameters of the template watervalve GEM (for which this form is being created), the property field 412 provides a list of properties that can be modified or configured, and the actionable item field 414 defines the actionable items associated with the configuration form, wherein each actionable item relates to one of the properties of one of the parameters or aliases, or may relate to other graphical actions or operations to be performed by a graphical element usage created from the template graphical element.

Generally speaking, the user may add actionable elements (generally one actionable item is provided per row in the field 414) to the configuration form by selecting the add button 420. For each such actionable element or row in the actionable item field 414, the user may be able to enter a number of different pieces of configuration information in various configuration cells of the actionable item, and this configuration information will define the operation of the actionable item when the actionable item is used by the configuration form application 37 to configure a graphical element usage. As an example, each actionable item may include a label cell (which provides a label name for the actionable time), an alias/parameter cell (which defines the alias and/or parameter of the template graphical element associated with the actionable item and for which configuration information will be accepted from a subsequent user via the configuration form), a default value cell (which may specify a default value for the property of the graphics parameter or alias associated with the actionable item), a tool tip cell (which defines tips or instructions to be presented to the user of the configuration form during the configuration of a graphical element usage), an entry type cell (which may define the type of data entry, such as text, an integer, a real number, a choice from an enumerated list, etc., to be excepted for the value of the property of the graphical element parameter or alias being configured) and a rules cell (which defines one or more rules to be applied when using the other cells of the actionable element to perform configuration of a usage or when running or executing a graphical element usage created from the template graphical element). For example, the lead designer or other configuration form creator may use the rules cell to specify the manner in which the values in the other cells will effect or change the value of the property. In another case, the rules cell may enable a subsequent user to define rules to be applied when creating a graphical element usage using the actionable element.

Thus, in this case, the lead designer may create a quick configuration form for WaterValve by selecting the Quick Configure Forms element from the hierarchy 404 on the left-hand side of the screen 400, and double-click on this icon to bring up the configuration form editor screen 402 on the right side of the screen 400. As illustrated in FIG. 10, the configuration form editor screen 402 may include or present a number of areas or fields within the form editor screen that enable the designer to create a quick configuration form for the graphical element in the hierarchy 404 on the left hand side of the screen 400 under which the form is being added, in this case, the WaterValve GEM graphical element. While, as noted above, the form editor screen may including the alias/parameter field 410, the property field 412 and the actionable item field 414, other configuration fields could be added or used in the form editor screen 402 to enable other quick configuration form actions. Moreover, the form editor screen 402 may include a number of buttons including the add button 420, a delete or remove button 422 and a separator button 424 which may be used to add, delete or separate actionable items in the field 414.

Once the form editor screen 402 appears, as illustrated in FIG. 10, the lead designer may use the hierarchy 404 on the left hand side of the screen to select the Valve1 element 430 to be able to create form elements for that sub-element of the WaterValve GEM. When the Valve1 element 430 is selected, the designer may then use the alias/parameter field 410 to select the appropriate graphical parameter (e.g., in this case, Text1) from the list of parameters listed in the alias/parameter field as being associated with the Valve1 element 430. As will be understood, the alias/parameter field 410 may display a list of all such aliases and parameters associated with the graphical element (in this case the Valve1 element) selected in the hierarchy 404. Next, the lead designer may select the property of the selected parameter (e.g., Text) within the property field 412, which field will display the configurable properties of the parameter that has been selected in the alias/parameter field of the graphical object selected in the hierarchy 404. In this case, the configuration form editor may obtain the parameters and aliases and properties thereof for a selected element in the hierarchy 404 from the memory illustrated in FIG. 2B. The lead designer then clicks the Add button 420 to add an actionable element for the selected property of the selected parameter of the selected graphical element in the actionable item field 414. In response to this interaction, the quick configuration form editor creates a new actionable element entry which is added to the quick configuration form for this graphical element as illustrated in the field 414 of FIG. 10.

As described above, the created actionable item includes a number of configurable cells which, in the case illustrated in FIG. 10, includes a Label cell 440, an Alias/Property cell 441, a Default Value cell 442, a Tool Tip cell 443, an Entry Type cell 444 and a Rules cell 445. In this case the configuration form editor places an indication of the selected Alias and Property in the Alias/Property cell 441 to indicate that this actionable item is associated with the selected property of the selected Alias (or parameter). However, the quick configuration form editor then enables the designer to fill out or specify the further configuration details for the actionable item, such to specify a label for the actionable item (in the Label cell 440), a default value for the property (in the Default Valve cell 442), a message to the further user of the actionable item, such as a tool tip or hint or instructions for the actionable item which will be displayed to the further user when creating a graphical element usage using the configuration form (in the Tool Tip cell 443), a data entry type which specifies the type of data to enter for the property of the alias associated with this actionable item (in the Entry Type cell 444), and one or more rules to be used in allowing a further user to enter data for the property of the actionable item or to use when executing a graphical element usage created using the actionable item (in the Rules cell 445).

For example, the lead designer may select the Label cell 440 within the data grid for the actionable item entry just created and change the label field to provide a moniker that is meaningful to the user of the quick configuration form, i.e., one that is meaningful for the target consumers. In this case, as the text box selected for the actionable item (in the alias field 410) is intended to provide a unique name for the GEM usage, the lead designer may enter "Name" into the Label cell 440. The lead designer may like to give a hint as to what to type within the "Name" text box during configuration of a GEM usage and may want to constrain the number of characters entered. To do so, the lead designer may click on the Rules cell 445 (or an icon associated with that cell or heading) and receive a pop-up window 450 from the configuration form editor, such as that illustrated in FIG. 11. The pop-up window 450 enables the designer to change the rules for the entry accordingly by specifying a maximum length of the text to be entered into the text box and providing a hint as to the value to be entered. Generally speaking, the quick configuration form editor 36 will include a different set of configurable rules for each different type of data entry and/or property and/or alias or parameter and such rules can be stored in the memory or library 39 of FIG. 2B. For example, text entries will have one set of rules such as those illustrated in FIG. 11, while other data entry types, property types, and/or parameter types will have other form or template rule sets associated therewith that can be used to define the operation of the actionable item. Thus, the configuration form editor 36 may store and use a different set of template or standard rules, and may enable a user to specify one or more rules to be associated with the actionable item by changing rule information associated with a template rule set. However, in some cases, the user may specify a new rule not associated with a template rule set. Moreover, the one or more rules associated with the actionable item may be implemented by a processor upon use of the configuration form in creating a graphical element usage from the template graphical element or may be implemented by a processor upon execution of the graphical element usage created by the configuration form application.

Figure 12:
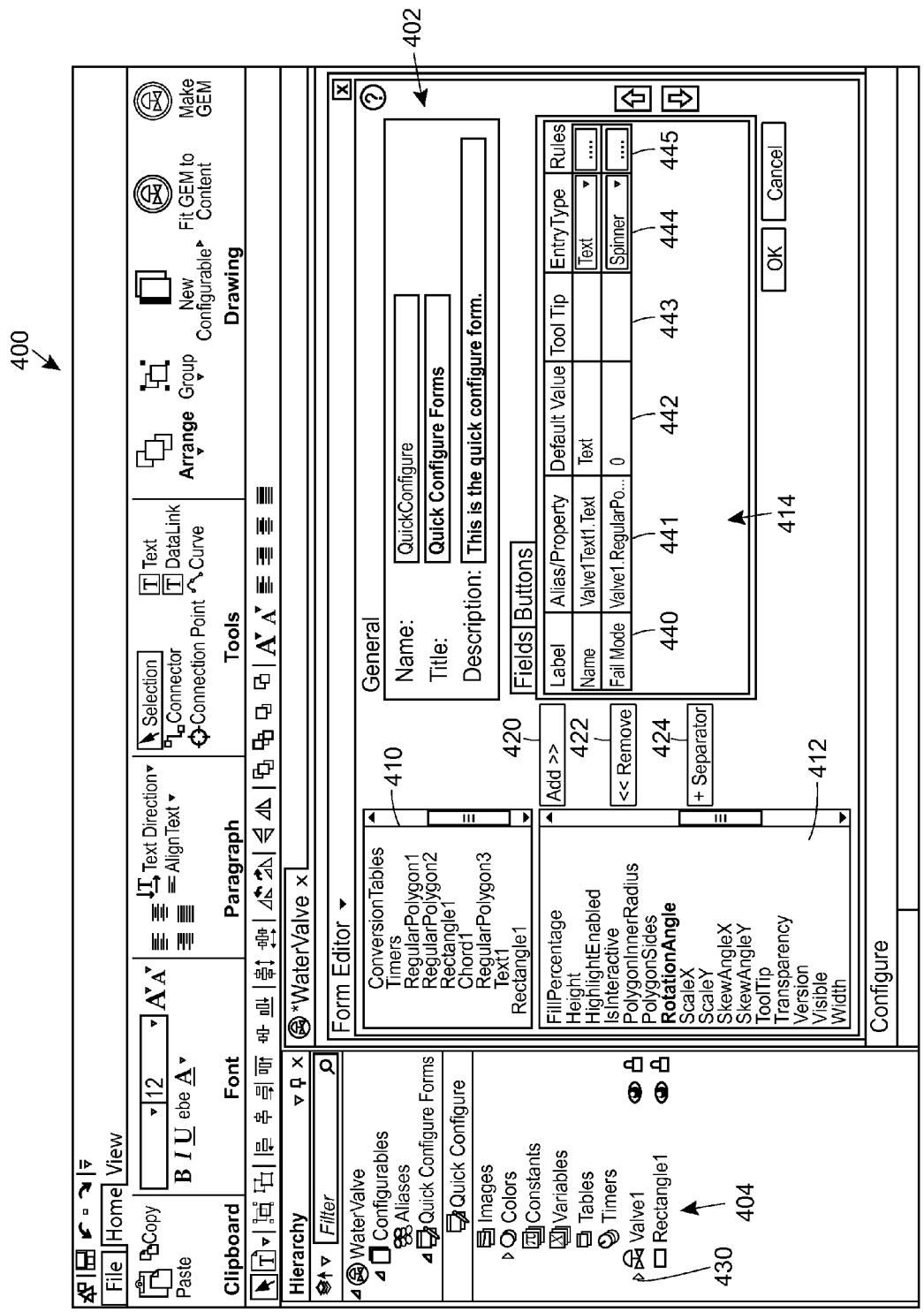
Figure 13:
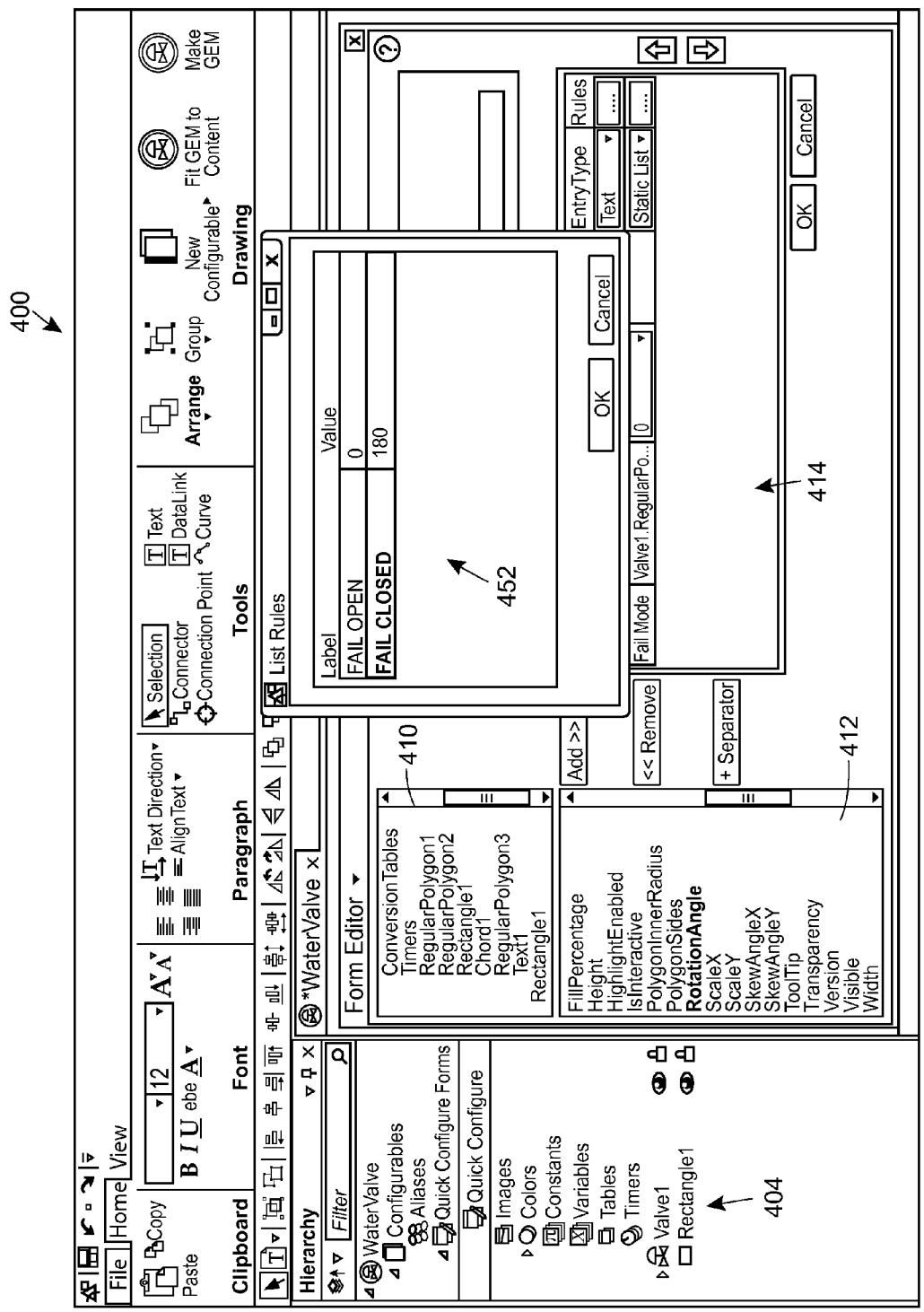

Now, the lead designer may want to add other actionable items to the quick configuration form being created in FIG. 10. For example, to facilitate easier and less error-prone configuration of the failure mode of the WaterValve GEM, the lead designer may add another actionable item in the quick configure form of FIG. 10. To do so, the lead designer may select the Rotation Angle property (in the property field 412) for the RegularPolygon3 (in the alias field 410) then click the Add button, as illustrated in FIG. 12. This action adds a second actionable item in the actionable item field 414 for configuring the rotation angle property of the RegularPolygon 3 parameter of the Valve1 GEM (which is a sub-element of the WaterValve GEM). In this example, the rotation angle property will have a default data entry type of a spinner angle in which the user may be able to select any angle (e.g., 0-360 degrees). Again, the configuration form editor 36 store and user default data entry types for different types of properties as is appropriate and may use these default data entry types to initially fill out the configuration cells of an actionable item. Here, however, the lead designer may change the entry type in the Entry Type cell 444 to a "Static List" entry type so that the actionable item offers a list of choices to the subsequent user instead of having the subsequent user type in a number that is not as meaningful. For example, the lead designer may use the static list entry type to constrain the values entered to either 0 or 180 so that the arrow (defined by RegularPolygon3) points up or down, but no other direction. The lead designer may fill out rules for the Static List entry type using a pop-up window 452 such as that shown in FIG. 13, which may be provided by the configuration form editor 36 when the Rules cell 445 is selected. In this case, the configuration form editor 36 may a pop-up window that enables the user to provide a label or indication to a subsequent user that indicates the types of failure modes which are enabled or supported in the static list and the associated value for the property for each such failure mode. The pop-up window 452 illustrated in FIG. 13 illustrates a set of rules in which the user has defined two supported static list values of 0 and 180 being associated with the Fail Open mode and the Fail Closed mode, respectively.

Figure 14:
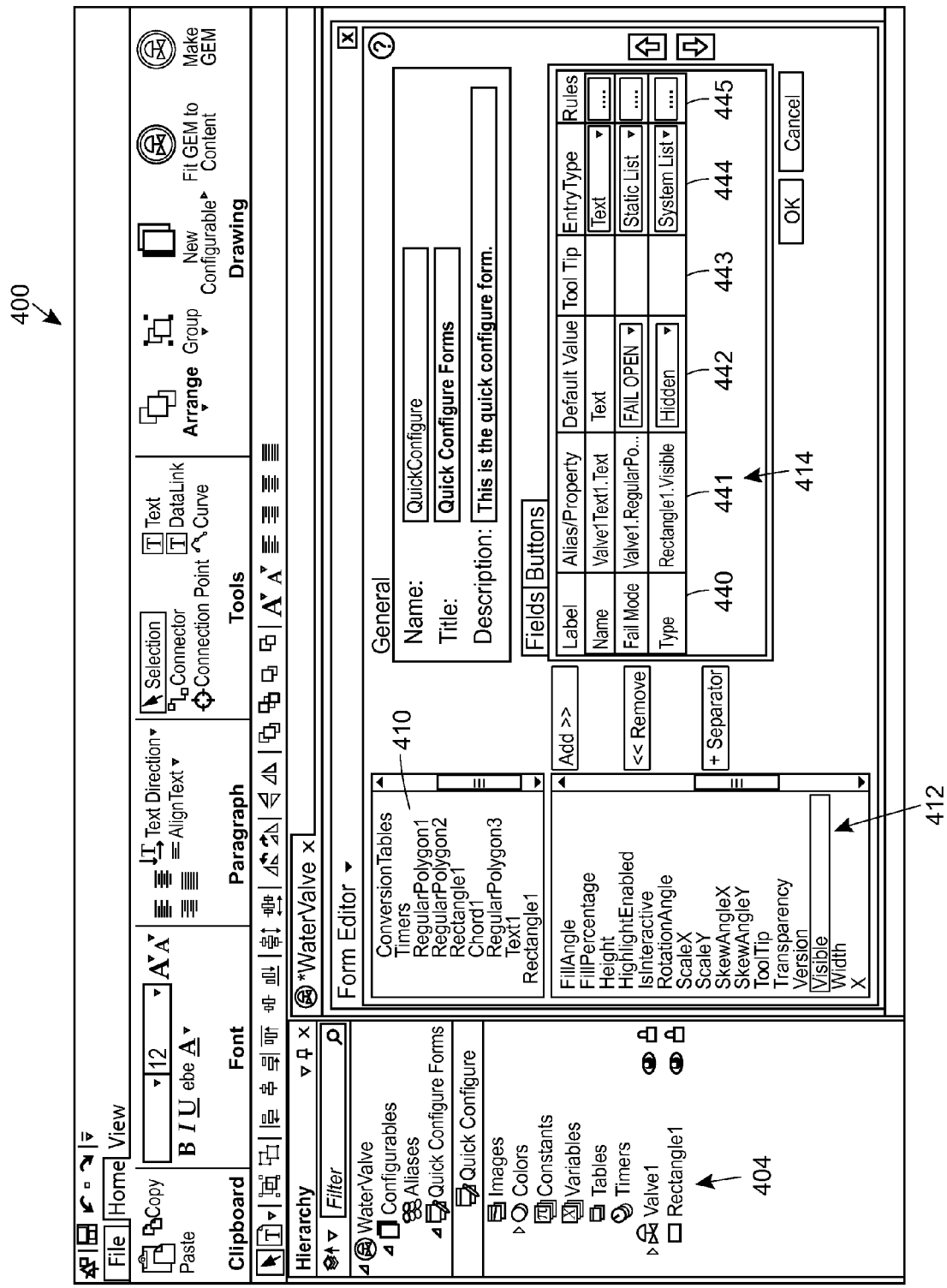
Figure 15:
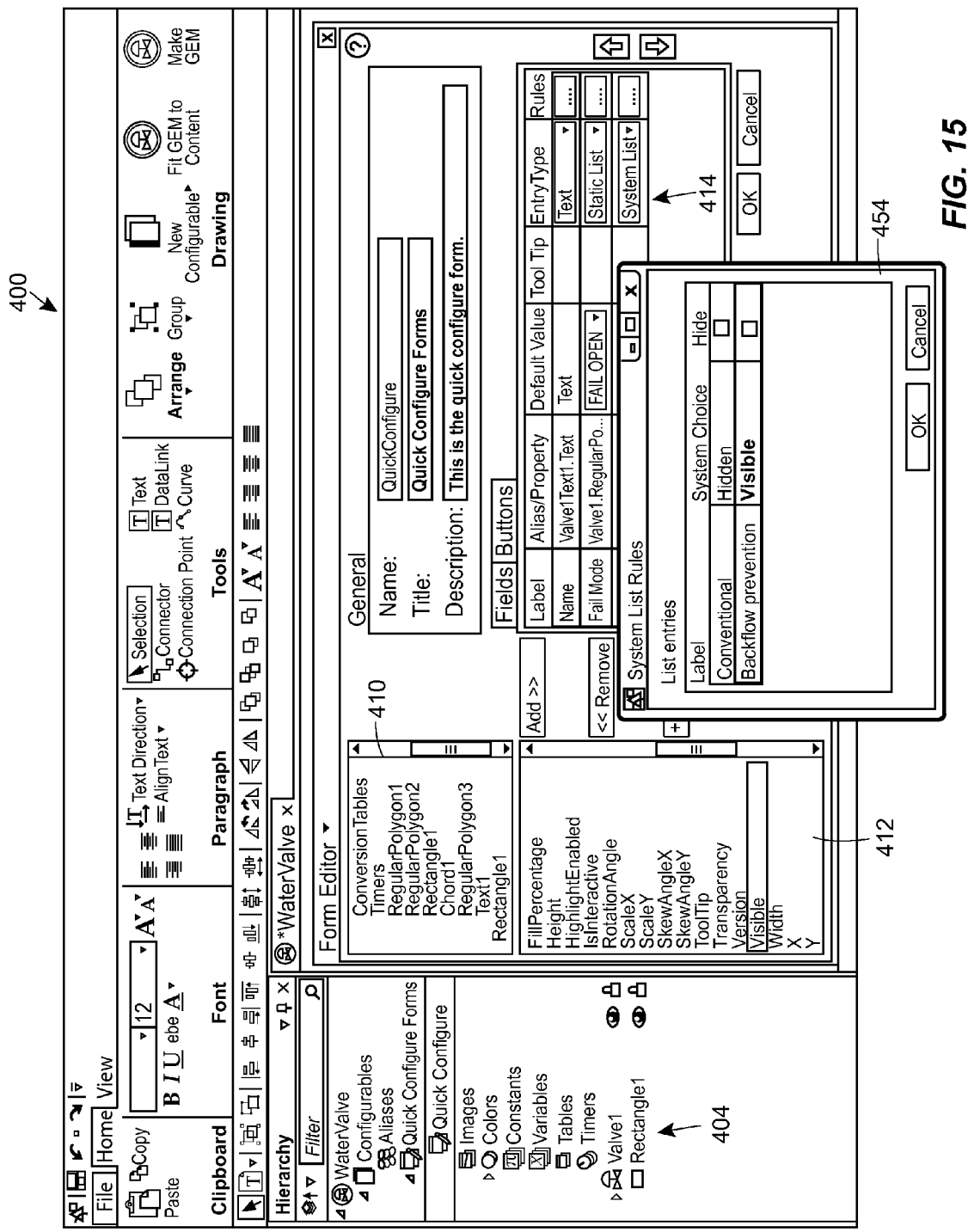

The lead designer may want to provide a still further actionable element in the quick configuration form for the WaterValve GEM to enable the subsequent user to easily change the depiction of the type of WaterValve by showing or hiding an orange rectangle to indicate if the actual water valve associated with the WaterValve usage being created has backflow prevention. To do so, the lead designer may add an actionable item called "Type" to the quick configuration form to thereby enable easy configuration of this operation. Here, as illustrated in FIG. 14, the lead designer selects the Rectangle1 object from the list of subordinate graphical objects or elements in the alias/property field 410, and then selects the Visible property for this parameter in the property field 412. Afterwards, the designer clicks the Add button 420 to add the Type actionable item. Here, the lead designer wants to provide the subsequent user with a list of choices that either show or hide the orange rectangle based on whether backflow prevention is supported or not. The lead designer can specify an entry type of Static List in the Entry Type cell 444 and change the presentation of the choices associated with the Type actionable item in the Static List by selecting the Rules cell or button 445. In response, the configuration form editor 36 displays a rules dialog pop-up window based on the template rule set for the System List entry data type in a pop-up window 454, as illustrated in FIG. 15. Here, the lead designer changes the names for the choices under the label field of this rules dialog to be more meaningful to a subsequent user, and can hide choices (using the Hide selection boxes) that are not appropriate, as illustrated in FIG. 15. Of course, if desired, the user may change the default value to, for example, not-hidden using the Default Valve cell 442 of this actionable item and may provide a message or tool tip using the Tool Tip cell 443.

Figure 16:
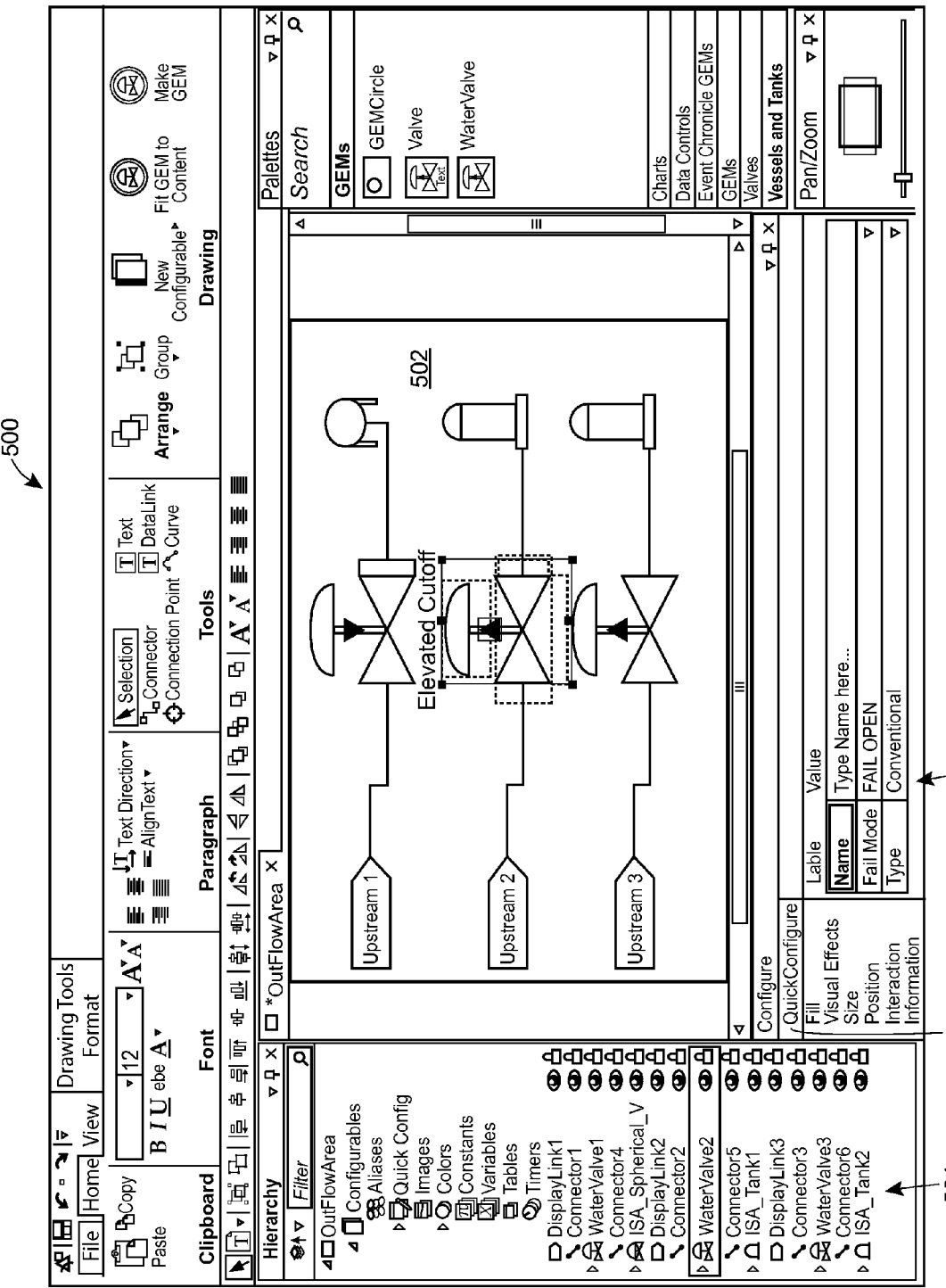
FIGS. 16-18 illustrate various display screens that may be provided by a graphical configuration system with quick configuration forms to enable a user to quickly alter or modify the template graphical elements of the user display of FIG. 5 to create customized graphical elements usages within the user display via the quick configuration forms.

After taking these steps, the lead designer may be finished creating the quick configuration form for the template watervalve GEM and may store this quick configure form as part of or associated with the template watervalve GEM for later use by other designers in configuring a GEM usage from the template watervalve GEM. In this case, the configuration form for the template watervalve GEM includes three actionable items that can be used by a subsequent user to configure the operation of a watervalve GEM usage from the template watervalve GEM. In particular, these actionable items enable a subsequent user to easily specify a unique name, set the failure mode and specify if backflow prevention exists in the watervalve GEM usage. As a result, sometime later, when preparing a GEM usage from the watervalve GEM, a secondary designer may utilize the quick configuration form associated with the watervalve GEM, as illustrated in the screen of FIG. 16 to easily perform these configuration tasks. In particular, FIG. 16 illustrates a configuration screen 500 produced by the graphics design application while producing a user display such as that of FIG. 10. However, here, the graphics design application 35 uses the configuration form application 37 to enable or to perform certain configuration actions which the configuration form is set up to do. As illustrated in FIG. 16, the screen may include a hierarchy 504 on the left hand side displaying all of the elements of the user interface shown in a layout view section 502 of the screen 500. The screen 500 also includes a configuration field 506 that provides access to the use of a quick configuration form (i.e., access to quick configuration functionality provide by the quick configuration forms stored for the various graphical elements or sub-element referenced in the layout view section 502 or the hierarchy 504). In particular, the secondary designer may manipulate a quick configure tab 508 of the configuration field 506 to cause the graphics design application 35 to access or use the quick configuration application 37 to enable a user to set or specify operations or graphical parameters of a graphical element via the structure provided by one or more quick configuration forms created for that graphical element.

Figure 17:
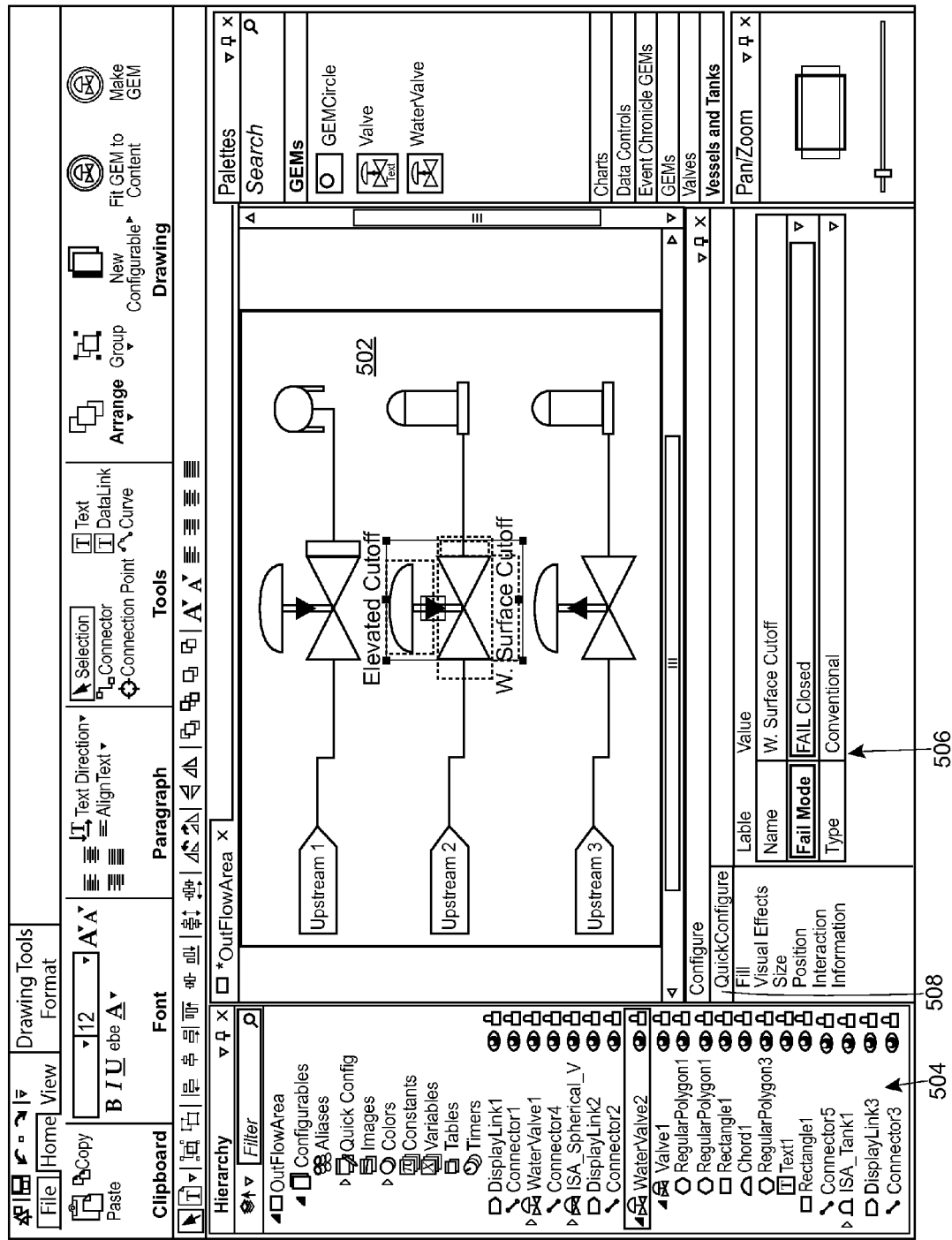
Figure 18:
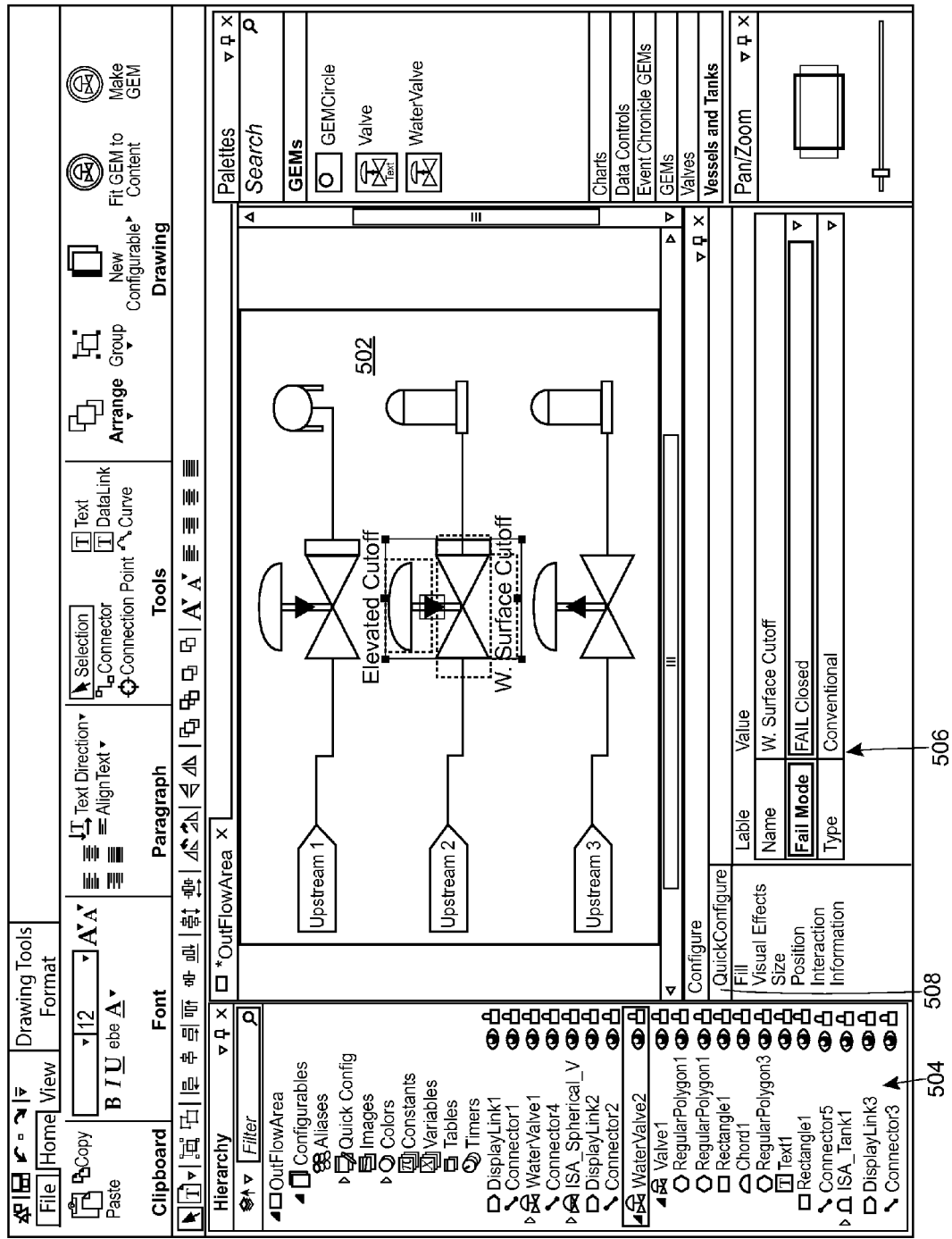
Figure 19A:
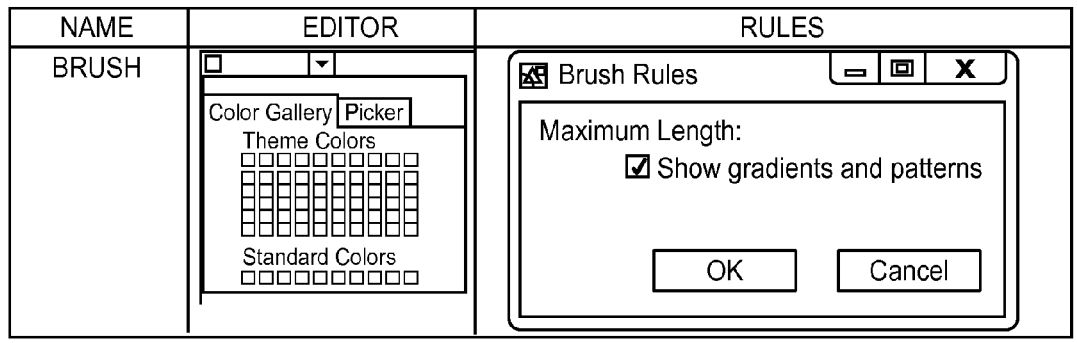
FIGS. 19A-19H illustrate various different entries for use in configuration cells of a quick configuration form to provide configuration information for graphical parameters of graphical elements and potential rules that can be established for such graphical parameters.
Figure 19B:
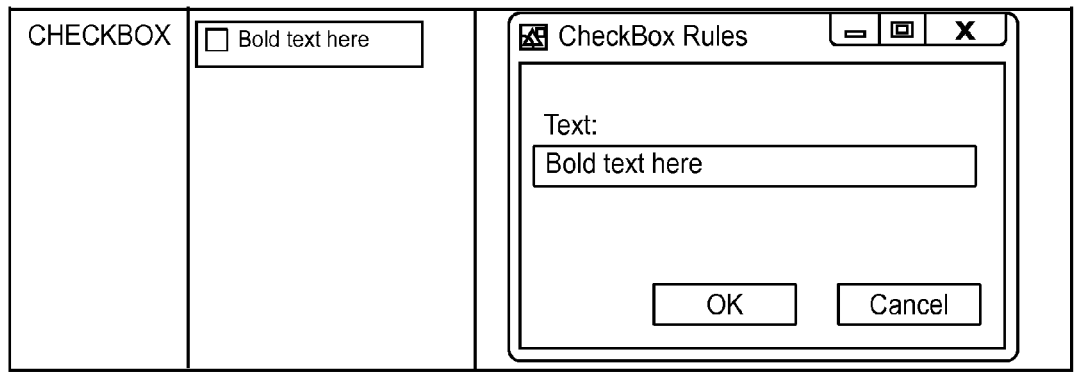
Figure 19C:
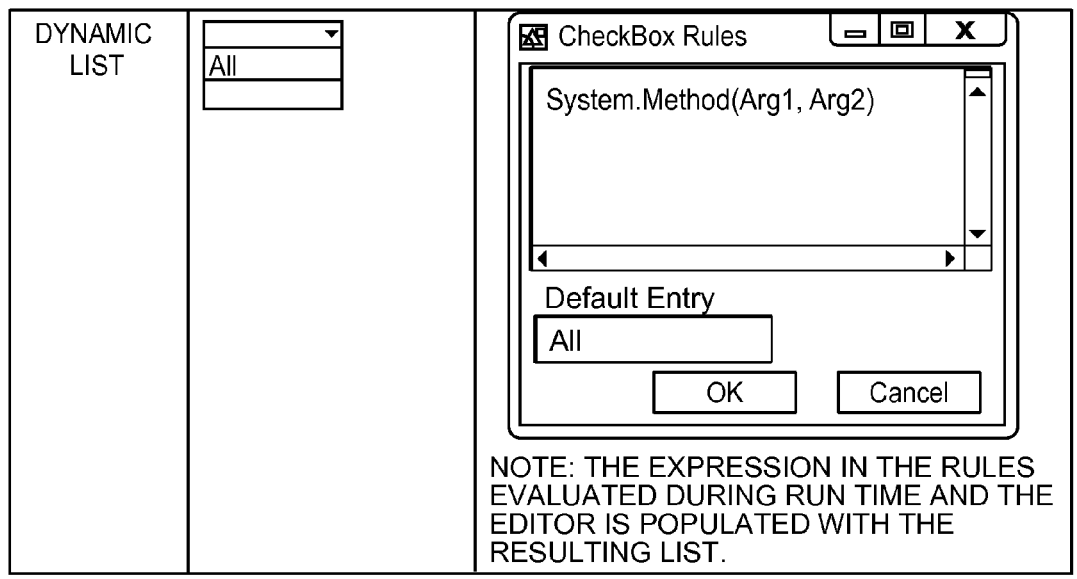
Figure 19D:
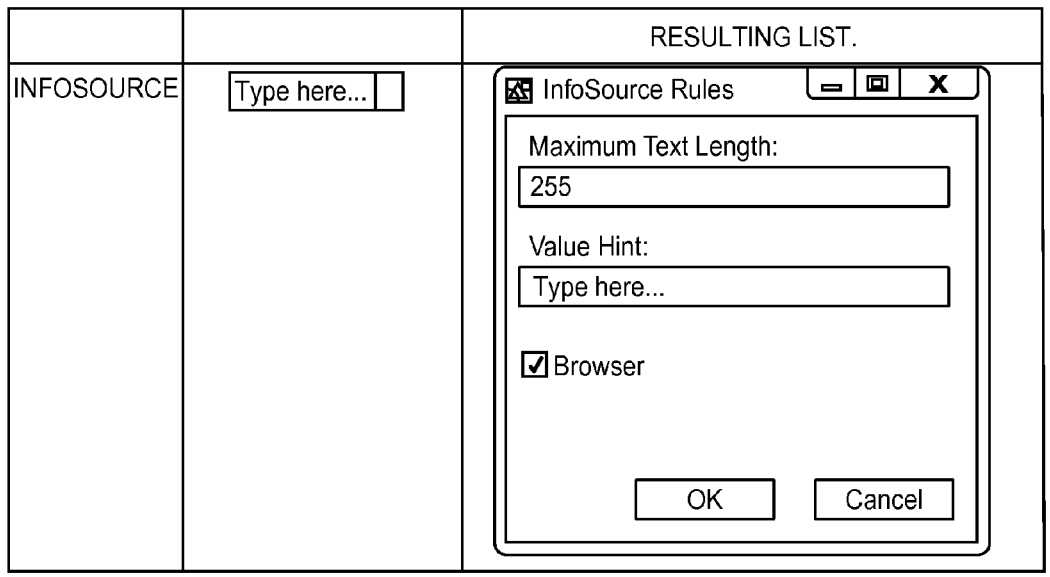
Figure 19E:
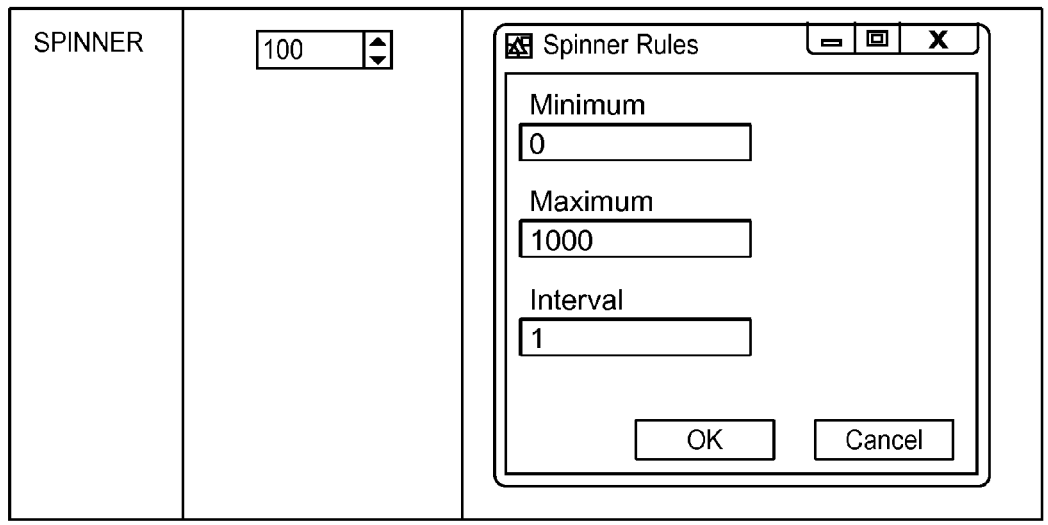
Figure 19F:
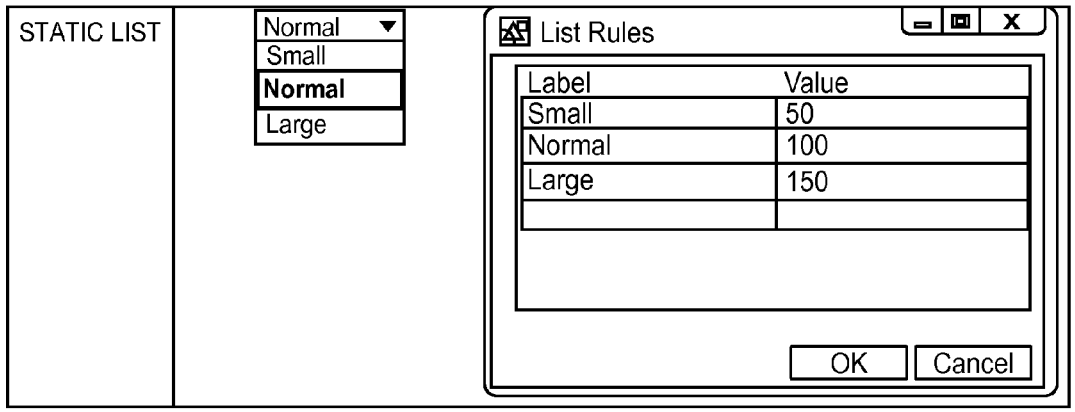
Figure 19G:
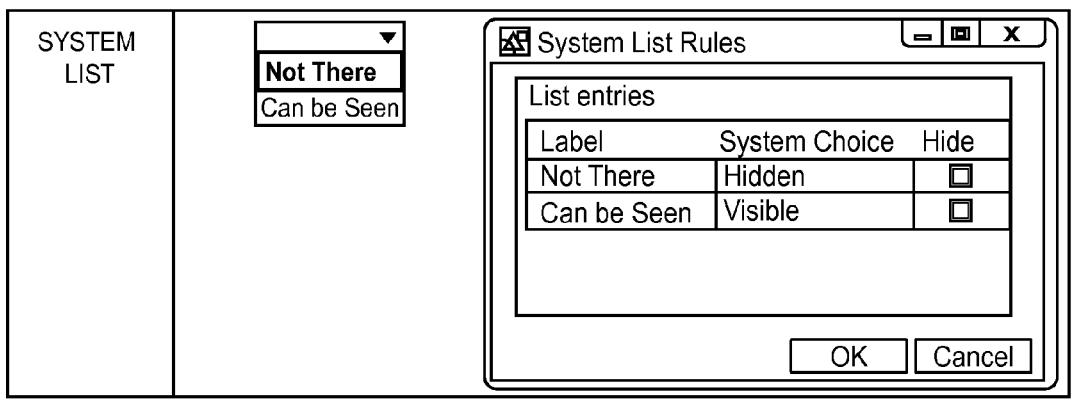
Figure 19H:
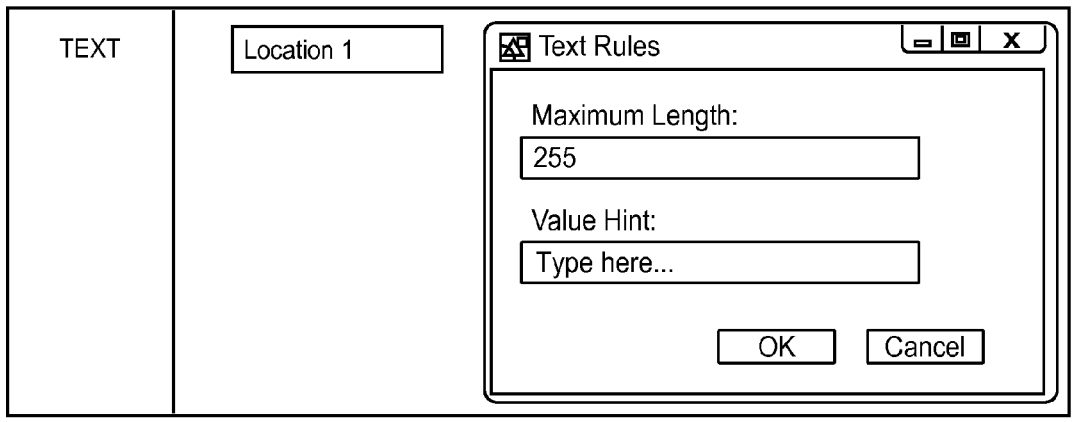

In the example of FIG. 16, the secondary designer may select the second watervalve element (which is marked as element 510 in the layout view section 502 and is called the WaterValve2 in the hierarchy 504) and may select the tab 508 in the configuration view 506 to obtain an indication of the quick configuration form for the WaterValve2 GEM associated with the selected item. As illustrated in FIG. 16, the configuration form application 37 may then provide an indication of each of the actionable items associated with the quick configuration form for the template watervalve GEM from which the WaterValve2 GEM 510 was created. The user can then select each of the actionable items of the displayed form to easily set the Name, Fail Mode and Type of the graphical element usage created from a template watervalve (created in the manner described above). Thus, as illustrated in FIG. 16, the user may select the name value cell of the displayed form and type "W. Surface Cutoff" in this cell to provide a name for the selected graphical element to be placed in the appropriate text box for this element. As illustrated in FIG. 17, the user may also select the Fail Mode cell and choose FAIL CLOSED from a presented list (which may be provided in a pop-up window not shown) which list was developed as part of the quick configuration form by the lead designer as illustrated in FIG. 13. The secondary user or designer may also select the Type cell (as illustrated in FIG. 18) and choose Backflow prevention from list provided in a pop-up window not shown in FIG. 18, but developed from the quick configuration form as specified by the lead designer in conjunction with FIGS. 14 and 15. Thereafter, the graphics design application 35, in conjunction with the configuration form application 37 will use these valves or input, as provided by the secondary user via the quick configuration form, to set the appropriate property valves of the appropriate parameters/aliases of the appropriate graphical elements automatically, without requiring further details from the secondary designer. As will be understood, this operation enables the secondary designer to more quickly configure graphical elements using a standardized form, and enables the secondary designer to make configuration choices within the configuration field 506 that are provided in the process control system namespace, i.e., using labels or names that are relevant to the process control features of the elements, as opposed to the graphical programming namespace. Still further, this operation does not require the secondary designer to know the general graphical program 35 in great detail because the detailed configuration is performed via simple interactions with the quick configuration form as opposed to interactions with the detailed configuration fields provided by the graphical program itself. Still further, the secondary designer does not need to know what exact graphical actions or properties relate to the specified configuration actions. For example, in this case, the secondary user does not need to know what sub-element of the WaterValve2 GEM is the arrow in the middle that represents the failure mode, nor need to know what valve the arrow property needs to take to represent an open fail mode or a closed fail mode.

Of course, the configuration form application 35 uses the rules set up or specified by each actionable item of a configuration form to establish the manner in which the user can enter configuration information into a cell of the form to cause a particular type of configuration and can use other configuration information in the other cells of an actionable item to present information to the user, such as a name to use for the actionable item, a default valve for the actionable item, and a message or tool tip to be provided to the secondary user when the secondary user is performing configuration via the configuration form.

As an example of how the rules can be used to enable a secondary user to specify configuration information via a form, FIGS. 19A-19H illustrate various examples of sets of rules (in the rules column) that may be provided via, for example, pop-up windows, that are then used to enable a secondary user to set or specify data for an actionable item based on the data entry type for that actionable item. For example, the name column of FIGS. 19A-19H indicates a general name of the editor function or pop-up window function, the editor column illustrates an example of the manner in which the secondary user will be able to interact with the configuration form to specify a valve and the rules column shows the rule set associated with the editor function (e.g., the manner in which the secondary user will be able to interact with the editor function). It will be understood that, in some cases, the expressions or information provided in the rules is evaluated or used during runtime and the editor is populated with the results of the rules and thus the rules can be used to establish runtime behavior. In other cases, the rules may be used to specify how the secondary user using the configuration form to configure a graphical element usage may interact with the form to specify a value for the property or parameter based on the associated entry type. Of course, other entry types may be used and other editor tools and rules may be used for these or other entry types.

While the above explanation is provided for a configuring a template GEM to create a GEM usage, the same concept can be applied to other graphical elements such as gadgets which may be used in user interfaces including in dashboards. Generally speaking, a gadget is very much like a GEM, but it is used in a slightly different context. More particularly, gadget usages are typically added to dashboards while GEM usages are added to user displays (although for the sake of this application dashboards are also considered to be user displays). Dashboards themselves are constructed within another application and are meant to provide operators and managers (in contrast to graphics designers) with a manner of monitoring key performance indicators via gadget usages. While the lead designer can still create gadgets, control engineers also typically create gadgets. In any event, in a manner similar to that described above with respect to a GEM, when an operator or a manager configures a gadget usage, the quick configuration form may be added to the properties dialog of the gadget or may be used via quick pop-up windows to provide the user with the ability to configure the gadget usage from a template gadget.

As an example of a manner of providing a quick configuration form to a gadget graphical element, a lead designer may wish to use the quick configuration editor 36 to create a gadget that performs some action, such as one that queries data from an event chronicle database, in a manner that makes the gadget easier to configure. In this case, the lead designer may use two quick configure forms to generate two separate quick configure views; one for specifying the data source for the table within the gadget and the other to adjust query settings for the same table.

Thus, the lead designer may create a template gadget and an additional quick configuration form for the template gadget in a manner similar to that described above for a template GEM. As an example to be illustrated with respect to FIGS. 20-28, the lead designer creates a gadget called EventData as illustrated in a configuration screen 600 of FIG. 20. Here the hierarchy section 604 includes a list of the sub-elements of the gadget and the layout view 602 illustrates the graphical properties of the gadget. In this case, the template gadget includes a graphical container (e.g., a table) 610 and a settings box 612 which will be used by an final user of the created gadget usage to set or operate the table to acquire new data and/or process the data to which the table 610 refers. During the gadget configuration process, the designer adds the table 610 and the setting button or box 612 to the template gadget using the normal operation of the graphical configuration application 35, and adds an alias named DataSource in the hierarchy 604. The user then adds a second quick configuration form named Filters which is illustrated in the hierarchy 604 under the Quick Configure Forms within the Configurables sections of the hierarchy 604. It should be noted that a first quick configure form, illustrated as QuickConfigure in the hierarchy 604 may be added automatically as part of the graphics configuration program 35 when it has or uses the configuration form editor 36 and configuration form application 37. Subsequently, when the alias DataSource was added to the template gadget, the QuickConfigure configuration form entry is added automatically to the hierarchy 604 as a default quick configuration form for this element (i.e., the EventData graphical element). Thus, as will be seen, any graphical element can include more than one quick configuration form.

Figure 21:
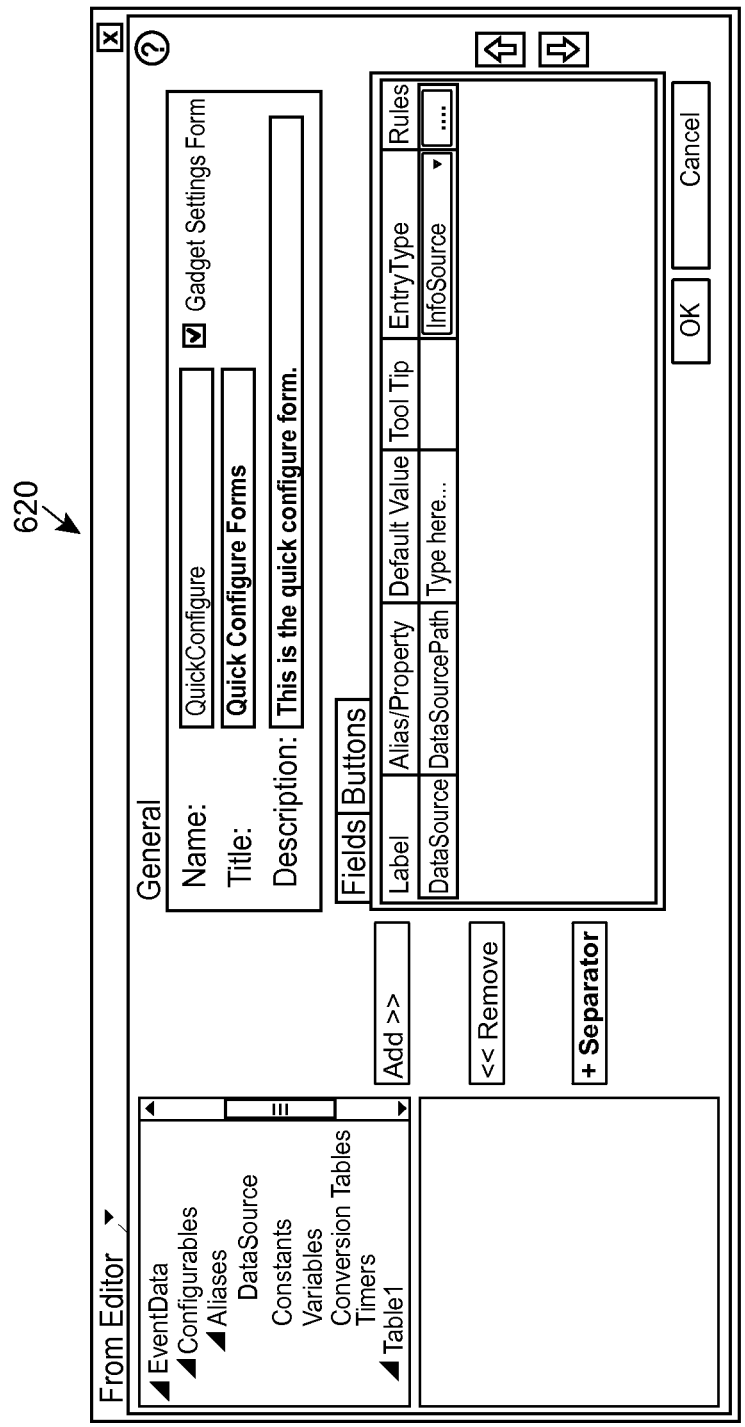
FIG. 21 illustrates a user interface provided by a configuration form editor of the graphical element configuration application to create a quick configuration form for the gadget being created in FIG. 20.

Now, the lead designer may inspect the QuickConfigure configuration form with the configuration form editor 36 (as illustrated in the screen of FIG. 21) and change the rules, the property, the default value and the tool tip for the actionable item for this configuration form. Here, the actionable item refers to the datasource and the alias/property field specifies a property of the alias that is a communication path to the datasource. FIG. 21 illustrates the quick form configuration screen 620 illustrating the quick configuration form for the EventData graphical element. Here, a Gadget Settings Form checkbox 622 is provided, which may only be shown for gadgets, which gives the lead designer the ability to choose which quick configuration form will be used to generate a Quick Configure View hosted within the gadget properties dialog to be shown later.

Figure 22:
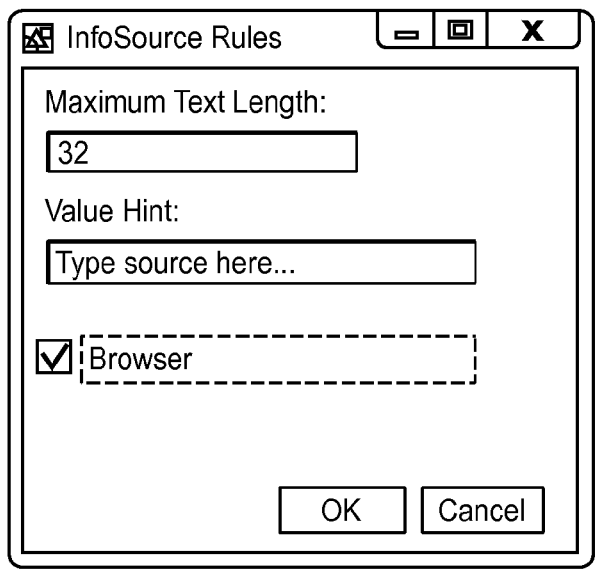
FIGS. 22-24 illustrate various user displays and pop-up windows that may be created by the configuration form editor of the graphical element configuration application to enable the creation of a quick configuration form for a template gadget being created.

In any event, as illustrated in FIG. 21, the designer may specify the DataSource label name, alias/property (in this case a datasource path which provides a communications path or address to the datasource), an entry type (in this case of the type infosource which specifies an informational source such as a browser) and one or more rules to be used for this entry type, which may be provided via a pop-up window as illustrated in FIG. 22.

Figure 23:
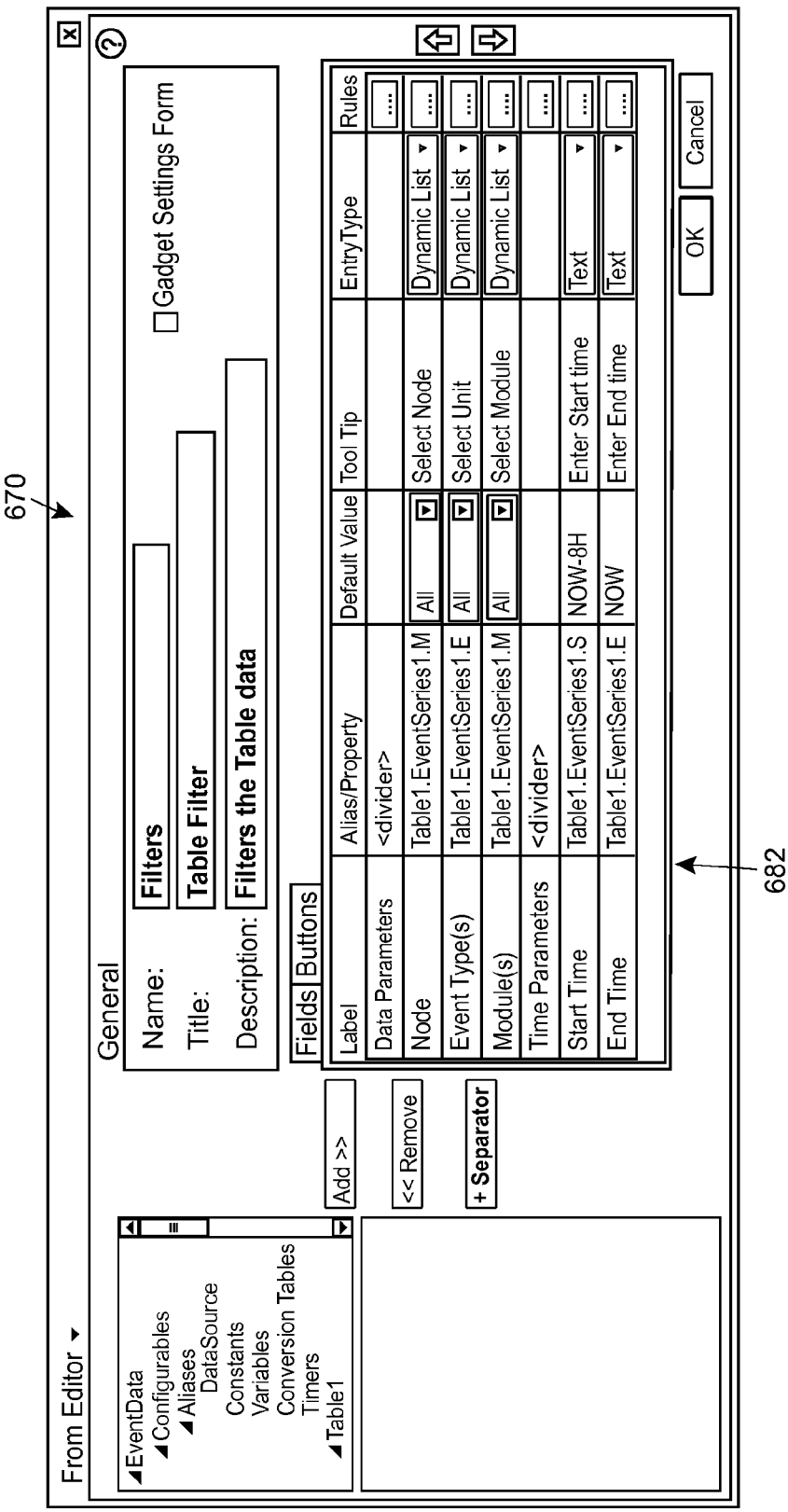

Next, the designer may add configuration information to the Filters quick configuration form by opening the configuration form editor for the Filters form. Generally speaking, FIG. 23 illustrates a configuration form 670 including numerous action items that are added thereto as part of the Filters quick configuration form. Here, the designer may add various actionable items related to different types of parameters, such as data parameters and time parameters and may wish to separate the actionable items for these general categories or types of parameters with separators. To do so, the designer uses the separator button 672 to simply specify the type of parameter associated with the next set of actionable items of the form.

Thus, in this example, the lead designer may add various entries as actionable items within the actionable item field 682 of FIG. 23. As illustrated in FIG. 23, the designer adds a separator named Data Parameters that is used to group entries within the quick configuration form related to data and three actionable items, one for node data parameters to be shown in the table of the gadget, one for event data parameters to be shown in the table of the gadget and one for module data parameters to be shown in the table of the gadget. For each of these actionable items, the designer may fill out or specify the alias/property, the default value, a tool tip that will be presented to the further user at a later time when configuring the table if needed, an entry type and a rule or set of rules to be used for the entry type. In this case, the actionable item for the Table1's Node field will be used to filter nodes when looking for events, the entry for Table1's EventType field will be used to specify the type of events to return in the table, and the entry for Table1's Module field will be used to specify in which module(s) to look for events.

Next, as illustrated in FIG. 23, the designer adds a separator named Time Parameters that is used to group entries within the quick configuration form related to time parameters for the search, and two actionable items, one for the start time and one for the end time. Of course, the designer also fills out or specifies the alias/property cell, the default value cell, the tool tip and the entry type cells and may select the rules button to establish or modify rules for the entry type.

Figure 24:
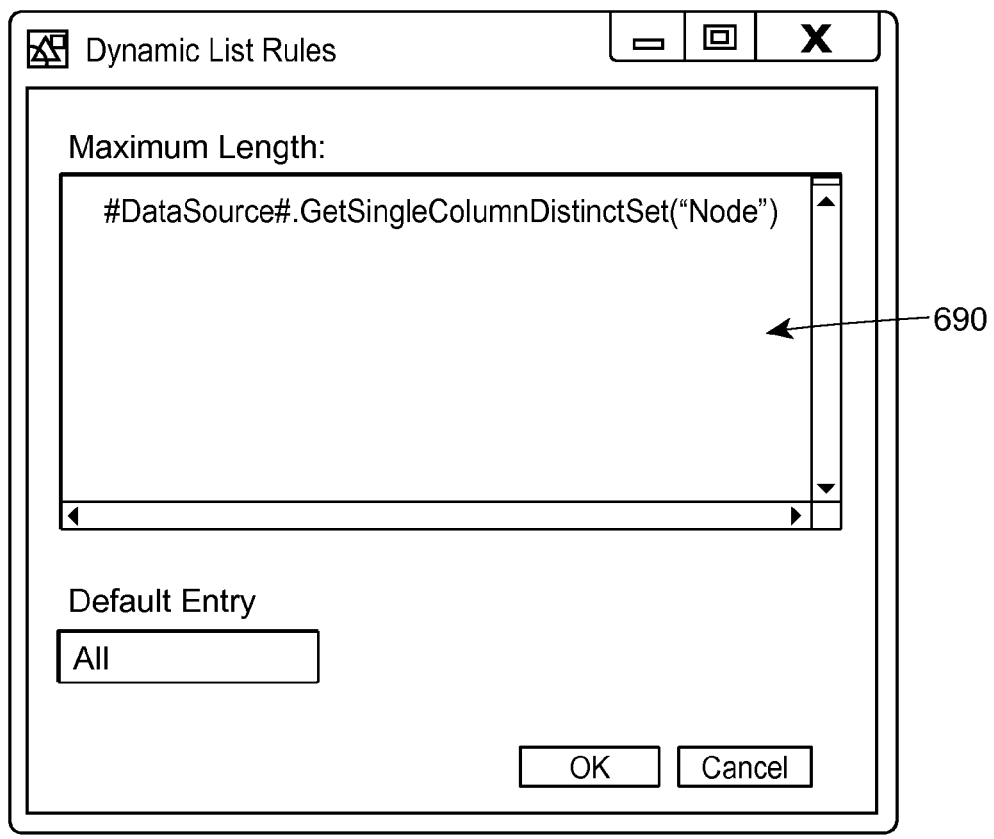

For example, the designer or form creator may click on the rules button for the Node actionable item and add an expression via a pop-up window 690 that can be used to query the data source in the Event Chronicle, as illustrated in FIG. 24. This rule may be in the form of code or source code implemented by a processor to perform a search in the Event chronicle database. Of course, rules could be specified in any other desired manner.

Figure 20:
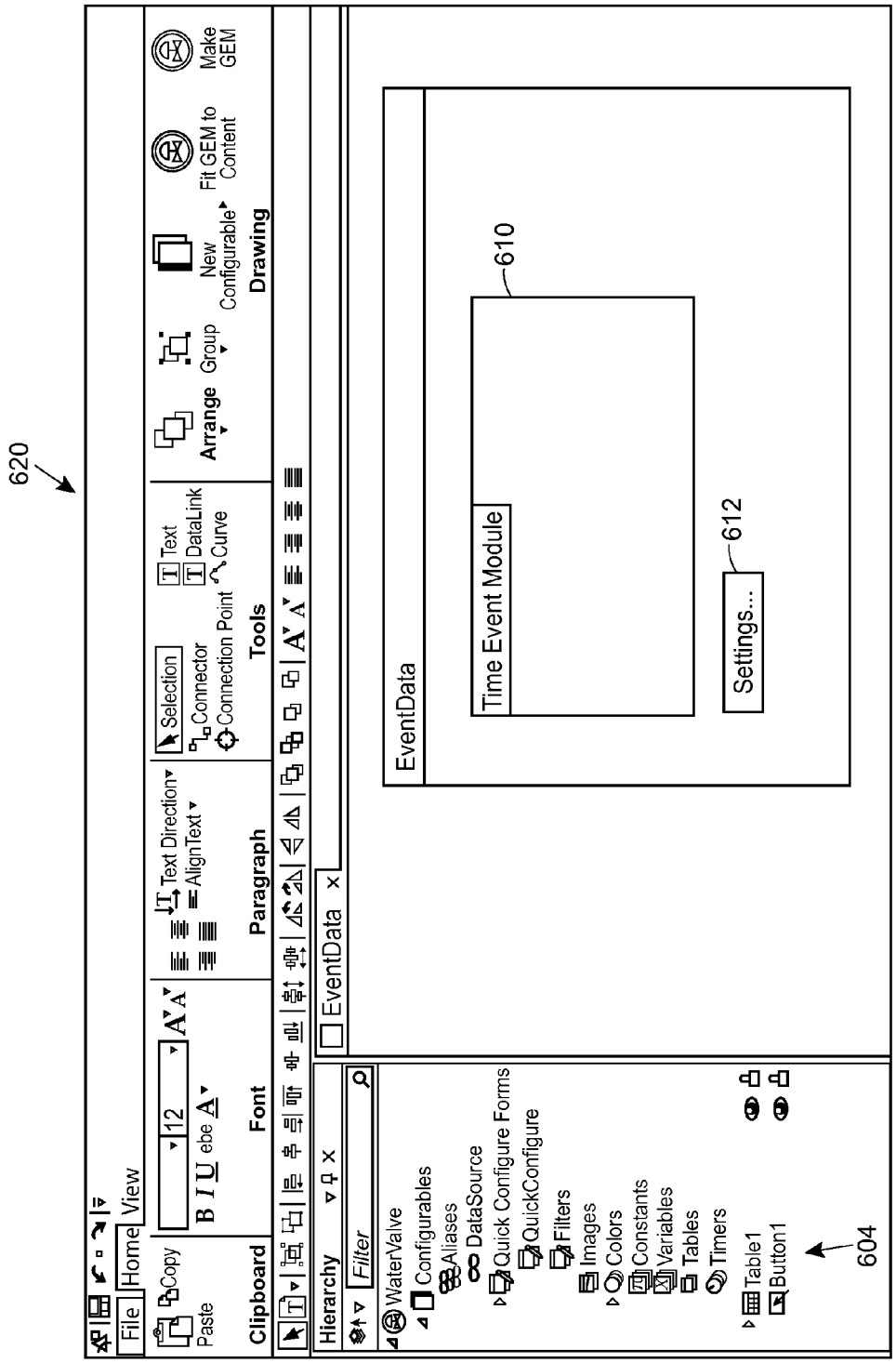
FIG. 20 illustrates a user interface created by a graphical element configuration application to create a template graphical element in the form of a gadget that includes a quick configuration form.
Figure 25:
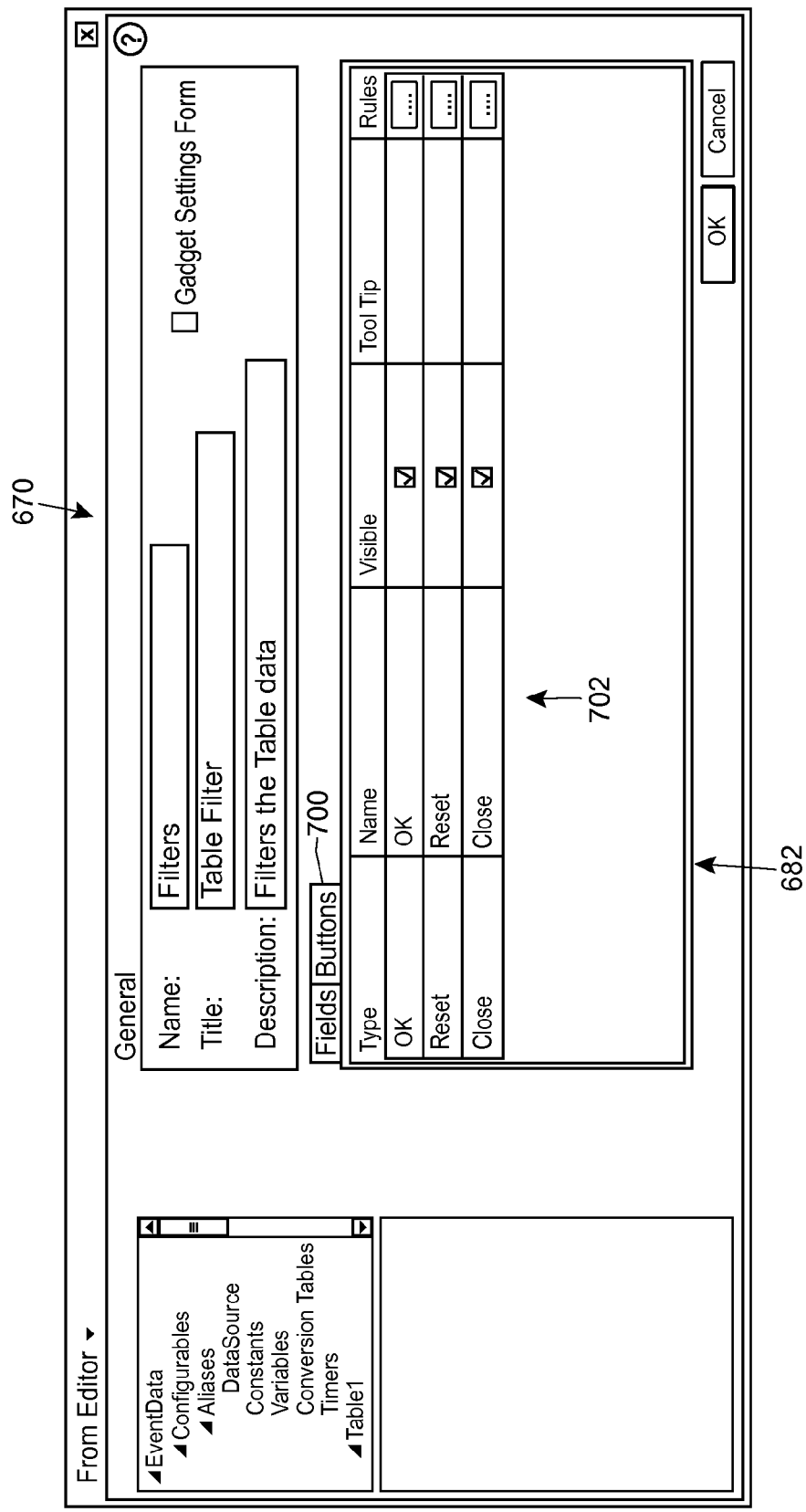
FIGS. 25-28 illustrate various user displays and pop-up windows that may be created by the configuration form application of the graphical element configuration application to enable the quick modification of a template gadget to create a customized gadget usage using a quick configuration form.

Now, the designer may add an event handling code on a buttons tab 700 provided by the quick configuration form editor 36. In particular, as illustrated in FIG. 25, the designer may click the buttons tab 700 illustrated in the configuration field 682 to gain access to a second datagrid containing entries that correspond to button event handlers. The lead designer may add a query as a first actionable item to be run when the OK button is pressed on a quick configure pop window. This window will be invoked when the Settings button 612 on the gadget being developed in FIG. 20 is pressed and will host the quick configure view for the filters quick configuration form. As illustrated in FIG. 25, the user may provide other actionable items related to buttons to be displayed on a gadget. In this case, the designer adds three button related actionable items in the form of an OK button, a Reset button and a Close button. Here again, various cells related to each of the button actionable items may be presented and filled out by the designer to specify the actions of the buttons in the gadget.

Figure 26:
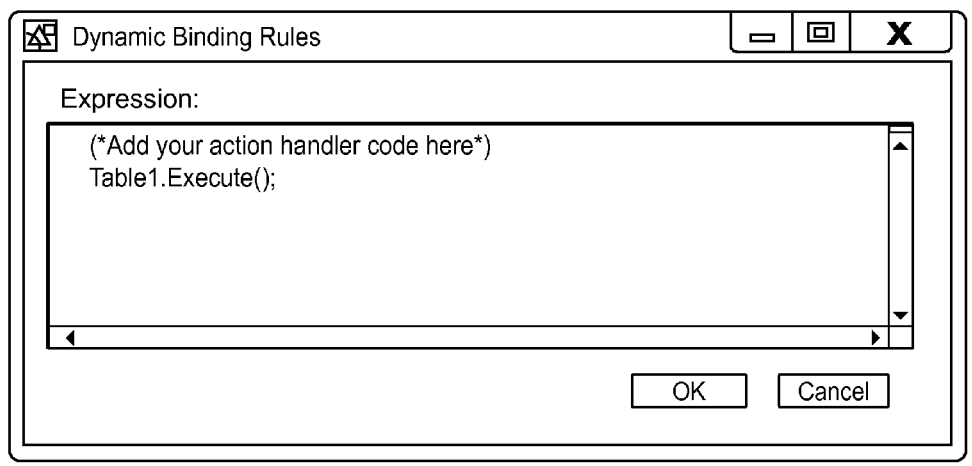

For example, the lead designer performs an addition of an OK button by clicking the rules icon for the OK actionable item entry and then adding an expression, as illustrated in FIG. 26. In this case, the pressing of the OK button on the gadget will cause the expression provided via the rules configuration cell to execute using the parameters specified for the table. Of course, the buttons to be made visible may be specified in the actionable item configuration cells of FIG. 25 and various different rules or executable expressions may be provided upon the use of a particular button.

Figure 27:
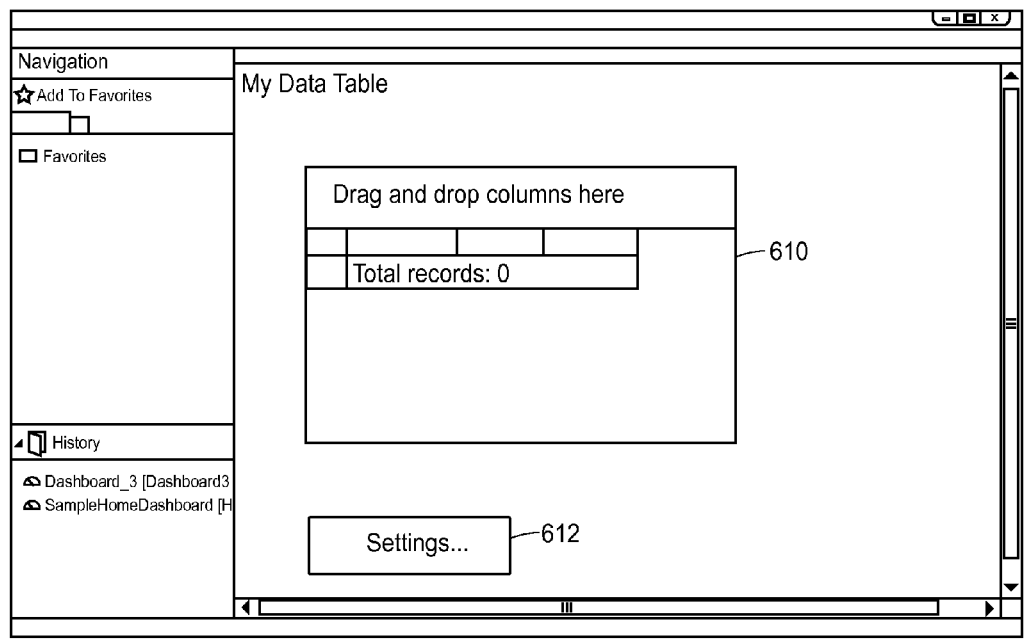

Next, the lead designer saves the template EventData gadget with the two quick configuration forms in a library, such as the library 108 of FIG. 2, for later use. Later, an operator or other secondary user may like to monitor events being gathered by the process control system on a particular node and may want to use a gadget in a dashboard to perform this operation. First, the operator would add the template EventData gadget to the dashboard, as illustrated in FIG. 27.

Figure 28:
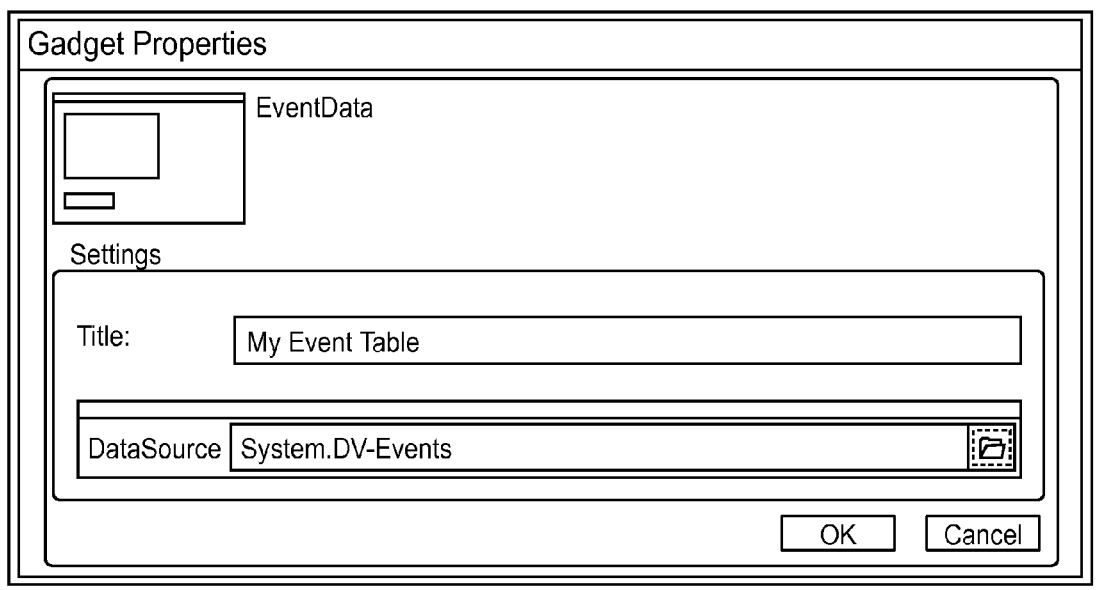
Figure 29:
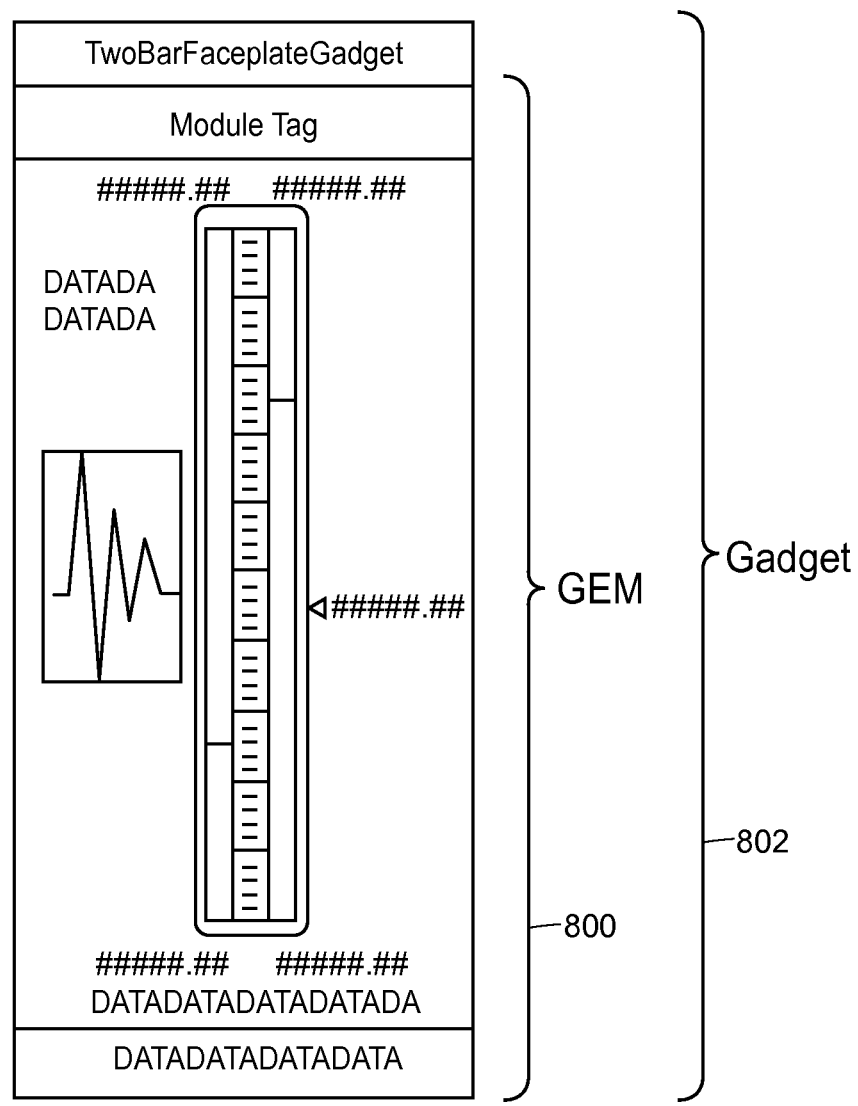
FIGS. 29-32 illustrate various user displays and pop-up windows associated with using a quick configuration form of one graphical element to refer to data within the quick configuration form of another graphical element.

Next the operator can quickly edit the properties of the gadget to create a gadget usage from the EventData template gadget. Here, the operator could open the properties dialog for the gadget as illustrated in FIG. 28 and set the data source via the pop-up window in the screen. The information in the setting group box within the dialog is supplied by the quick configure view for QuickConfigure configuration form, the creation of which was not described in detail above. After clicking OK, the table 610 in the gadget would be populated according to the default settings as specified by the filters quick configuration form. To make the table 610 query different data, the operator would click the settings button 612 on the EventData gadget (see FIG. 27) which will cause the Quick Configure Popup window to be invoked, which hosts the Quick Configure view for the filters quick configuration form. The operator could change data and time parameters as desired and click the OK button, which will cause the OK button's event handler to execute the code added by the lead designer to refresh the table data. In this manner, a gadget may invoke or use two quick configuration forms to provide additional functionality to a graphical element. While a gadget using two quick configuration forms has been described herein, any particular GEM or gadget may have more any number of desired quick configuration forms as desired or needed.

As a still further example, a designer may wish to create a faceplate gadget that can represent operating parameters for different control module types (e.g., analog input, PID, and analog output) in dashboards. In this case, the different module types use different communication paths to locate the operating parameters and not all module types have the same operating parameters. However, the designer may want the user to not have to know anything about how to locate the parameters, but to be able to configure the gadget knowing only the name of the module associated with the faceplate.

To do so, the designer may set up a configuration form of one graphical element to refer to the configuration form of another graphical element. For example, the designer may create a gadget that holds a GEM that does all the work of referencing a communication path via a quick configuration form for the GEM. This configuration is graphically illustrated in FIG. 29 in which a template faceplate GEM 800 is provided as part of a gadget 802. In particular, in this case, the gadget 802 may be configured to have a quick configuration form that asks the user for the information source name (i.e. the name of the system), the module tag (i.e. module name), and the type of module (e.g., AI, AO, PID Loop). To maximize re-usability, the GEM 800 can itself be used in displays, and the GEM 800 has a separate quick configuration form.

Here, the combination of the GEM 800 inside a gadget 802 may accomplished by using aliases for the information source name and the module tag, and using a variable to hold the module type. In this manner, aliases are automatically added to the configuration form, aliases can be removed from the configuration form and, in addition, a GEM alias can be deferred to a Gadget alias.

Figures 30, 31:
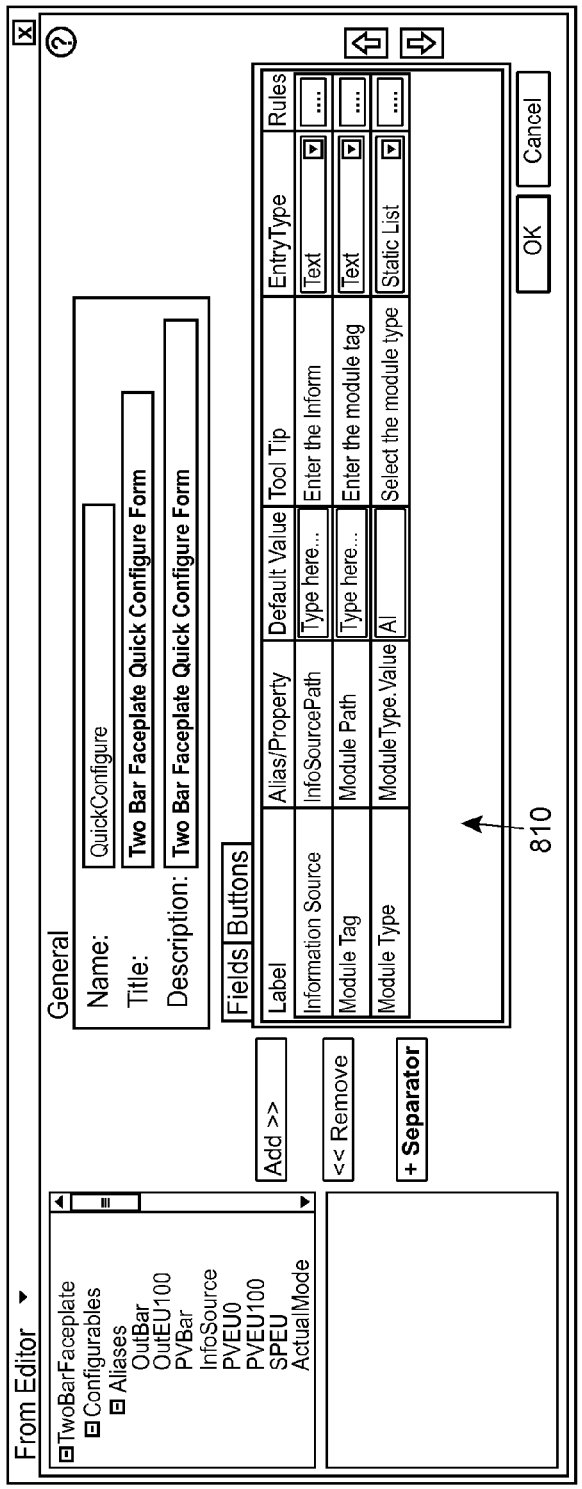

FIG. 30 illustrates the creation of an example quick configuration form 810 for the underlying GEM 800 having actionable items for two aliases and a variable or parameter. Still further FIG. 31 illustrates a depiction of the configuration form 812 provided to a secondary user when the secondary user fills out the configuration form in the process of creating a gadget usage. While only two aliases are shown, there are other aliases (see the alias/property field in upper left corner of form of FIG. 30) for internal use that are not shown, as they are not configurable via this configuration form. Moreover, an actionable item for the ModuleType variable has been added to the form, and is represented by a static list with the choices associated with the static list including AI, AO, PID Loop.

When the GEM 800 was added to the gadget (which results in a GEM usage), the GEM's quick configuration form was filled in like that shown in FIG. 31. Note that, in this case, the use of the enclosing hash tags "#" signifies an alias within the field. In this manner, the information source and module tag entries in the GEM configuration form have been deferred to the InformationSource and ModuleTag aliases, respectively, of the gadget 802.

Figure 32:
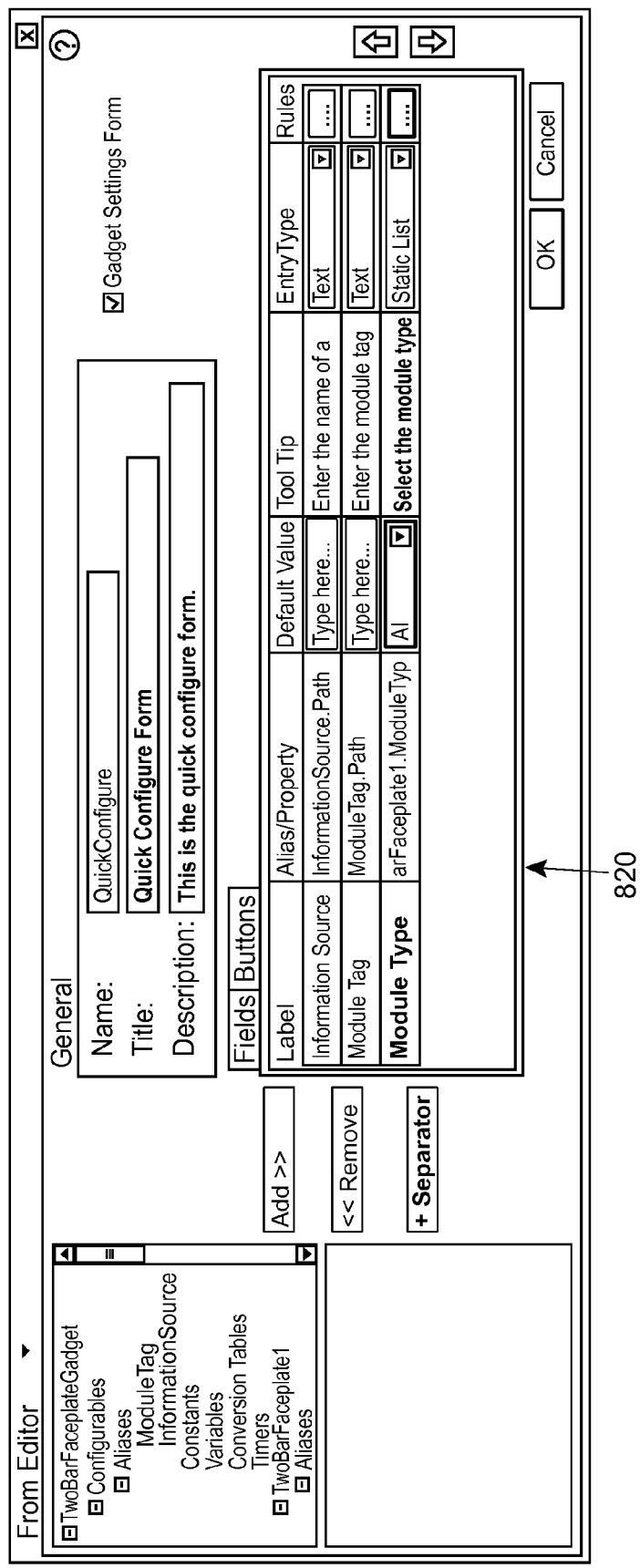

Still further, the quick configuration form 820 for the gadget is illustrated in FIG. 32 and shows the aliases for the gadget (which are the aliases to which the GEM usage has deferred). Here, additionally, the configuration form 820 looks very similar to the GEM quick configuration form 810, except that the Module Type entry is different, pointing down to the ModuleType variable inside the GEM 800. In this manner, the template faceplate GEM 800 can be used in a gadget 802 to obtain the correct information for the module to which the gadget 802 pertains, by referencing the module tag and information source of a gadget quick configure form.

In this manner, quick configuration forms may point to or use the data in other quick configuration forms for other graphical elements either in the same overall element or even different elements to speed configuration of user display elements.

In view of the forgoing, the techniques, systems, methods, apparatuses and devices discussed herein allow changes to be made more easily to display objects and display configurations which are to be created for and integrated into a process plant or process control system. Furthermore, the techniques, systems, methods, apparatuses and devices discussed herein allow for approving or making modifications or changes to operator and maintenance displays (and graphical elements thereof), for example, within a configuration environment or within a run-time environment of the process plant or control system. As such, the changes being made are integrated into the process plant or system more quickly, accurately and efficiently, thereby increasing the quality of operations of the process plant or system.

Moreover, the techniques, systems, methods, apparatuses and devices discussed herein with respect to graphical elements and displays allow for a process plant or process control system to be more safely and efficiently monitored, controlled, and/or operated in real-time. In particular, operators are able to configure, in both a real-time or run-time operating environment of the plant and in a configuration environment, graphical elements and/or displays specifically tailored or customized to the specific monitoring, control and/or operation of one or more portions of the process control system or plant. Operators are able to save these customized graphical elements and/or displays for general (e.g., plant-wide or system-wide, real-time or configuration) access, use, re-use, and incorporation in a manner that is easily findable by the operator or others. Accordingly, as configuration of graphic element(s) and/or graphic display(s) is streamlined and fully customizable in multiple environments, operator disruptions and errors are decreased, thus enabling the operators to operate the process plant or system with efficiency and safety.

Still further, as the graphic element(s) and/or display(s) are customized for specific purposes of specific portions or entities of the process plant or system, real-time data that is generated by the specific portions or entities of the process plant or system (e.g., while controlling one or more processes) and that requires necessary manual and/or automatic intervention is easily and quickly able to be discerned using the easily customizable graphic element(s) and/or display(s). In some cases, the data, configurations, and/or instructions delivered to the process plant or system result in a change to the process plant or system (e.g., an updated or new configuration to a process element) or to operations thereof. In some cases, the delivered data, configurations, and/or instructions cause the process plant or control system to perform an action (e.g., remove a particular process element from operation, re-route data generated by a source to another source, etc.). Accordingly, as the techniques, methods and systems described herein allow graphic elements and/or displays to generate more customized and detailed information (and in particular, with respect to real-time data generated by the process plant or system), any necessary modifications to the control and/or to the operations of the one or more portions of the process plant or process control system are more quickly determined and integrated into the run-time environment of the process plant or control system. Consequently, with the techniques, methods and systems described herein, the efficiency and the safety of the process plant or system is further increased.

When implemented in software, any of the graphical elements and quick configure forms, and the systems for creating and using these graphical elements and quick configure forms described herein may be stored in any computer readable memory such as on a magnetic disk, a laser disk, or other storage medium, in a RAM or ROM of a computer or processor, etc. Likewise, this software or these modules may be delivered to a user, a process plant or an operator workstation using any known or desired delivery method including, for example, on a computer readable disk or other transportable computer storage mechanism or over a communication channel such as a telephone line, the Internet, the World Wide Web, any other local area network or wide area network, etc. (which delivery is viewed as being the same as or interchangeable with providing such software via a transportable storage medium). Furthermore, this software may be provided directly without modulation or encryption or may be modulated and/or encrypted using any suitable modulation carrier wave and/or encryption technique before being transmitted over a communication channel.

Although the example systems disclosed herein are disclosed as including, among other components, software and/or firmware executed on hardware, it should be noted that such systems are merely illustrative and should not be considered as limiting. For example, it is contemplated that any or all of these hardware, software, and firmware components could be embodied exclusively in hardware, exclusively in software, or in any combination of hardware and software. Accordingly, while the example systems described herein are described as being implemented in software executed on a processor of one or more computer devices, persons of ordinary skill in the art will readily appreciate that the examples provided are not the only way to implement such systems.

Thus, while the present invention has been described with reference to specific examples, which are intended to be illustrative only and not to be limiting of the invention, it will be apparent to those of ordinary skill in the art that changes, additions or deletions may be made to the disclosed embodiments without departing from the spirit and scope of the invention.

The invention claimed is:

1. A user display configuration system, comprising:
a graphical element configuration application, stored on a tangible computer readable medium, that executes using one or more computer processors to enable a user to create one or more template graphical elements, each template graphical element including displayable indicia and configurable links to process control system data to be displayed on a display device using the displayable indicia;
a configuration form editor, stored on a tangible computer-readable medium that executes using one or more computer processors to enable a user to create a configuration form associated with one of the template graphical elements, the configuration form being used to configure the operation of one or more graphical element usages from the one of the template graphical elements, wherein the configuration form editor presents a user display interface to enable a user to specify one or more actionable items for the configuration form, wherein the one or more actionable items are each adapted to be used to configure the one or more graphical element usages created from the one of the template graphical elements, each actionable item including an indication of a graphical element parameter of the template graphical element and a property of the graphical element parameter of the template graphical element to be configured, and one or more editable configuration cells for specifying configuration information for the property of the graphical element parameter; and
a configuration form application, stored on a tangible computer-readable medium that executes using one or more computer processors to use the configuration form for the one of the template graphical elements to present visual information to a second user via a user display device, wherein the configuration form application operates to enable the second user to specify the configuration information for one of the one or more editable configuration cells of the one or more actionable items and uses the specified configuration information to create a graphical element usage from the one of the template graphical elements for execution as part of a user display.

2. The user display configuration system of claim 1, wherein the configuration form editor enables the user to create an actionable item including an indication of a data entry type to be used for collecting configuration information for the actionable item.

3. The user display configuration system of claim 2, wherein the configuration form editor enables the user to specify one or more rules to be associated with the actionable item.

4. The user display configuration system of claim 3, wherein the one or more rules associated with the actionable item are configured to be implemented by a processor upon use of the configuration form by the configuration form application in creating a graphical element usage.

5. The user display configuration system of claim 3, wherein the one or more rules associated with the actionable item are configured to be implemented by a processor upon execution of the graphical element usage created by the configuration form application.

6. The user display configuration system of claim 3, wherein the configuration form editor enables the user to specify one or more rules to be associated with the actionable item by changing rule information associated with a template rule set.

7. The user display configuration system of claim 6, wherein the configuration form editor stores a different template rule set for each of a plurality of different data entry types.

8. The user display configuration system of claim 1, wherein the configuration form editor enables the user to specify, in one of the one or more configuration fields of an actionable item, an indication of a label to be provided to the second user when the second user is providing the configuration information via the actionable item.

9. The user display configuration system of claim 1, wherein the configuration form editor enables the user to specify, in one of the one or more configuration fields of an actionable item, an indication of a message to be provided to the second user when the second user is providing configuration information via the actionable item.

10. The user display configuration system of claim 1, wherein the configuration form editor enables the user to create an actionable item including a default value for the property of the graphic element parameter to used by the second user when the second user is providing the configuration information for the actionable item.

11. The user display configuration system of claim 1, wherein the configuration form editor enables the user to create an actionable item related to buttons to be displayed to a user when the graphical element usage created from the template graphical element is used in a user display.

12. The user display configuration system of claim 11, wherein the configuration form editor enables the user to create an actionable item including rules to be implemented in response to a button of the graphical element usage being manipulated in a user display.

13. The user display configuration system of claim 1, wherein the configuration form editor presents, on a user interface device, a first field including an indication of graphical element parameters for which an actionable item can be created, a second field including an indication of one or more properties of a selected graphical element parameter in the first field for which an actionable item can be created, and a third field including an indication of actionable items within the configuration form.

14. The user display configuration system of claim 13, wherein the configuration form editor executes to enable a user to select a graphical element parameter indicated in the first field and to select a property of the selected graphical element parameter indicated in the second field to produce an actionable item associated with the selected property of the selected graphical element parameter.

15. The user display configuration system of claim 1, wherein the indication of the graphical element parameter for one of the actionable items relates to a graphical depiction to be presented on a user display screen and the property of the graphical element parameter relates to the visual property of the graphical depiction.

16. The user display configuration system of claim 1, wherein the graphical element parameter for the one of the actionable items is an alias for a graphical element as defined in the namespace used by the graphical element configuration application.

17. The user display configuration system of claim 1, wherein the indication of the graphical element parameter for one of the actionable items relates to a graphical container to be presented on a user display screen and the property of the graphical element parameter relates to a data path for data to displayed using the graphical container.

18. The user display configuration system of claim 1, wherein one of the one or more editable configuration cells for specifying configuration information for the property of the graphical element parameter is adapted to store a reference to a configuration cell in an actionable item of a second configuration form.

19. A display element configuration system, comprising:
a graphical element configuration application, stored on a tangible computer readable medium, that executes using one or more computer processors to create one or more template graphical elements, each template graphical element including displayable indicia and one or more configurable links to process control system data to be displayed on a display device using the displayable indicia;
a configuration form editor, stored on a tangible computer-readable medium that executes using one or more computer processors to enable a user to create a configuration form associated with one of the template graphical elements, the configuration form adapted to be used to configure the operation of one or more graphical element usages from the one of the template graphical elements, wherein the configuration form editor presents a user display interface to enable a user to specify one or more actionable items for the configuration form, each actionable item including an indication of a graphical element parameter of the template graphical element and a property of the graphical element parameter of the template graphical element to be configured, and one or more editable configuration cells for specifying configuration information for the property of the graphical element parameter; and a configuration form storage routine, stored on a tangible computer-readable medium that executes using one or more computer processors to store the configuration form in a computer memory as being associated with a particular template graphical element for later use in configuring a graphical element usage from the particular template graphical element.

20. The user display configuration system of claim 19, wherein the configuration form editor enables the user to create an actionable item including an indication of a data entry type to be used for collecting configuration information for the actionable item in the one or more editable configuration cells.

21. The user display configuration system of claim 19, wherein the configuration form editor enables the user to specify one or more rules to be associated with the actionable item in the one or more editable configuration cells.

22. The user display configuration system of claim 21, wherein the one or more rules associated with the actionable item are to be implemented by a processor upon use of the configuration form in creating a graphical element usage from the template graphical element.

23. The user display configuration system of claim 21, wherein the one or more rules associated with the actionable item are to be implemented by a processor upon execution of the graphical element usage created by the configuration form application.

24. The user display configuration system of claim 21, wherein the configuration form editor enables the user to specify one or more rules to be associated with the actionable item by changing rule information associated with a template rule set.

25. The user display configuration system of claim 24, wherein the configuration form editor stores a different template rule set for each of a plurality of different data entry types.

26. The user display configuration system of claim 19, wherein the configuration form editor enables the user to store, in one of the one or more configuration cells, an indication of a label to be provided to a second user when the second user is providing configuration information for the actionable item using the configuration form.

27. The user display configuration system of claim 19, wherein the configuration form editor enables the user to store, within one of the one or more configuration cells, a default value for the property of the graphic element parameter to used by the second user when the second user is providing the configuration information for the actionable item.

28. The user display configuration system of claim 19, wherein the configuration form editor further enables the user to create an actionable item related to buttons to be displayed to a user when the graphical element usage created from the template graphical element is used in a user display.

29. The user display configuration system of claim 28, wherein the configuration form editor enables the user to create an actionable item including rules to be implemented in response to a button of the graphical element usage being manipulated in a user display.

30. The user display configuration system of claim 19, wherein the configuration form editor presents, on a user interface device, a first field including an indication of graphical element parameters for which an actionable item can be created, a second field including an indication of one or more properties of a selected graphical element parameter in the first field for which an actionable item can be created, and a third field including an indication of actionable items within the configuration form.

31. The user display configuration system of claim 19, wherein the graphical element parameter for the one of the actionable items is an alias for a graphical element as defined in the namespace used by the graphical element configuration application.

32. The user display configuration system of claim 19, wherein the indication of the graphical element parameter for one of the actionable items relates to a graphical container to be presented on a user display screen and the property of the graphical element parameter relates to a data path for data to be provided using the graphical container.

33. A user display configuration system, comprising:
a template graphical element library embodied in a tangible computer readable medium that stores one or more template graphical elements for use in creating graphical element usages for execution as part of a user display, each template graphical element including displayable indicia and specifications of process control system data to be displayed on a display device using the displayable indicia;
a graphical element configuration form library embodied in a tangible computer readable medium that stores one or more configuration forms for at least one of the one or more template graphical elements stored in the template graphical element library, each configuration form including one or more actionable items, wherein each of the one or more actionable items is adapted to be used to configure a graphical element usage created from the one of the one or more template graphical elements, each actionable item including an indication of a graphical element parameter and a property of the graphical element parameter of the template graphical element to be configured, and one or more configuration cells that store information related to specifying configuration information for the property of the graphical element parameter to be used to configure the graphical element usage; and
a configuration form application, stored on a tangible computer-readable medium that executes using one or more computer processors to use the configuration form for the one of the one or more template graphical elements to present visual information to a user via a user display device, wherein the configuration form application operates to enable the user to specify the configuration information using the one or more configuration cells of the one or more actionable items of the configuration form and uses the specified configuration information to create a graphical element usage from the template graphical element for execution as part of a user display.

34. The user display configuration system of claim 33, wherein the configuration form includes an actionable item having an indication of a data entry type to be used for collecting configuration information for the actionable item via the one or more configuration cells.

35. The user display configuration system of claim 34, wherein the configuration form includes an actionable item that stores one or more rules to be executed in conjunction with the collection of configuration information related to the graphical element usage.

36. The user display configuration system of claim 35, wherein the one or more rules are to be implemented by a processor upon use of the configuration form by the configuration form application in creating a graphical element usage.

37. The user display configuration system of claim 35, wherein the one or more rules are to be implemented by a processor upon execution of the graphical element usage created by the configuration form application.

38. The user display configuration system of claim 33, wherein the configuration form application enables the user to specify one or more rules to be associated with the graphical element usage by changing rule information associated with a template rule set stored as part of the configuration form.

39. The user display configuration system of claim 33, wherein the configuration form includes a label provided to the user when the user is providing the configuration information via the configuration form for the graphical element usage.

40. The user display configuration system of claim 33, wherein the configuration form includes a message to be provided to the user by the configuration form application when the user is providing configuration information for the graphical element usage.

41. The user display configuration system of claim 33, wherein the configuration form includes a default value for the property of the graphic element parameter to be used as default configuration information for the graphical element usage.

42. The user display configuration system of claim 33, wherein the configuration form includes alterable configuration information for a button to be displayed to a user when the graphical element usage created from the template graphical element is used in a user display.

43. The user display configuration system of claim 42, wherein the configuration form application enables the user to specify rules to be implemented in response to the button of the graphical element usage being manipulated in a user display.

44. The user display configuration system of claim 33, wherein the indication of the graphical element parameter for one of the actionable items relates to a graphical depiction to be presented on a user display screen and the property of the graphical element parameter relates to the visual property of the graphical depiction.

45. The user display configuration system of claim 44, wherein the graphical element parameter for the one of the actionable items is an alias for a graphical element.

46. The user display configuration system of claim 33, wherein the graphical element parameter for one of the actionable items relates to a graphical container to be presented on a user display screen and the property of the graphical element parameter relates to a data path for data to be provided via a user display using the graphical container.

47. A method of configuring a user display element for use in presenting information to a user via a user interface, comprising:
  enabling a user, via a computer processor, to create one or more template graphical elements, each template graphical element including displayable indicia and configurable links to process control system data to be displayed on a display device using the displayable indicia;
  enabling a user, via a computer processor, to create a configuration form associated with one of the template graphical elements, including presenting on a user display device, a user display interface that enables a user to specify one or more actionable items for the configuration form, wherein the one or more actionable items are adapted to be used to configure the one or more graphical element usages created from the one of the template graphical elements, and further including, for each actionable item, enabling the user to provide an indication of a graphical element parameter and a property of the graphical element parameter of the template graphical element to be configured using the configuration form, and to specify configuration information associated with one or more editable configuration cells for specifying configuration information for the property of the graphical element parameter via the configuration form;
  enabling the user, via a computer processor, to store the configuration form as associated with the one of the graphical template elements; and
  enabling a user, via a computer processor device, to create one or more graphical element usages from the template graphical element using the stored configuration form for the one of the template graphical elements to thereby create a user display element.

48. The method of configuring a user display element of claim 47, wherein enabling a user to create the configuration form includes enabling, via a computer processor, a user to specify an indication of a data entry type to be used for collecting configuration information via one of the configuration cells for the actionable item.

49. The method of configuring a user display element of claim 47, wherein enabling a user to create the configuration form includes enabling, via a computer processor, a user to specify one or more rules for one of the configuration cells to be associated with the actionable item.

50. The method of configuring a user display element of claim 47, wherein enabling a user to create the configuration form includes enabling, via a computer processor, a user to specify an indication of a label to be provided to a further user when the further user is providing the configuration information for the actionable item via the configuration cells.

51. The method of configuring a user display element of claim 47, wherein enabling a user to create the configuration form includes enabling, via a computer processor, a user to specify an indication of a message to be provided to a further user when the further user is providing configuration information for the actionable item via the configuration cells.

52. The method of configuring a user display element of claim 47, wherein enabling a user to create the configuration form includes enabling, via a computer processor, a user to specify an actionable item related to buttons to be displayed to a further user when the graphical element usage created from the template graphical element is used in a user display.

53. The method of configuring a user display element of claim 52, wherein enabling a user to create the configuration form includes enabling, via a computer processor, a user to specify rules to be implemented in response to the button of the graphical element usage being manipulated in a user display.

54. The method of configuring a user display element of claim 52, wherein enabling a user to create the configuration form includes presenting, on a user interface device, a first field including an indication of graphical element parameters for which an actionable item can be created, a second field including an indication of one or more properties of a selected graphical element parameter in the first field for which an actionable item can be created, and a third field including an indication of actionable items within the configuration form.

55. The method of configuring a user display element of claim 54, wherein enabling a user to create the configuration form includes enabling a user to select a graphical element parameter indicated in the first field and to select a property of the selected graphical element parameter indicated in the second field to produce an actionable item associated with the selected property of the selected graphical element parameter, the produced actionable item being displayed in the third field.

56. The method of configuring a user display element of claim 47, wherein enabling a user, via a computer processor device, to create one or more graphical element usages from the template graphical element includes enabling a user to store, within a configuration cell of the configuration form, a reference to a configuration cell in an actionable item of a second configuration form.

\* \* \* \* \*